(12) United States Patent
Shimada et al.

(10) Patent No.: US 10,686,443 B2
(45) Date of Patent: Jun. 16, 2020

(54) TRANSMITTING DEVICE, TRANSMITTING METHOD, AND COMMUNICATION SYSTEM

(71) Applicant: Sony Semiconductor Solutions Corporation, Kanagawa (JP)

(72) Inventors: Takahiro Shimada, Tokyo (JP); Hiroaki Hayashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/313,420

(22) PCT Filed: Jun. 8, 2017

(86) PCT No.: PCT/JP2017/021337
§ 371 (c)(1),
(2) Date: Dec. 26, 2018

(87) PCT Pub. No.: WO2018/020852
PCT Pub. Date: Feb. 1, 2018

(65) Prior Publication Data
US 2019/0165786 A1    May 30, 2019

(30) Foreign Application Priority Data
Jul. 26, 2016   (JP) ................................. 2016-145899

(51) Int. Cl.
*H03K 19/0185*   (2006.01)
*H04L 25/493*    (2006.01)
(Continued)

(52) U.S. Cl.
CPC ....... *H03K 19/0185* (2013.01); *H03K 17/687* (2013.01); *H03K 19/0175* (2013.01);
(Continued)

(58) Field of Classification Search
CPC ............. H03K 19/0185; H03K 17/687; H03K 19/017545; H03K 19/0175;
(Continued)

(56) References Cited

U.S. PATENT DOCUMENTS 8,064,535 B2    11/2011  Wiley
2013/0155741 A1*  6/2013  Takano ................. H02M 3/156
                                                    363/98
(Continued)

FOREIGN PATENT DOCUMENTS

EP    3413524 A1    12/2018
JP    06-261092 A    9/1994
(Continued)

OTHER PUBLICATIONS

Extended European Search Report dated Jun. 7, 2019 for corresponding European Application No. 17833862.0.

*Primary Examiner* — Jung Kim
(74) *Attorney, Agent, or Firm* — Michael Best & Friedrich LLP

(57) ABSTRACT

A transmitting device of the present disclosure includes: a voltage generator that generates a predetermined voltage; a first driver including a first sub-driver and a second sub-driver, the first dub-driver that includes a first switch provided on a path from a first power source to a first output terminal, a second switch provided on a path from a second power source to the first output terminal, and a third switch provided on a path from the voltage generator to the first output terminal, and is allowed to set a voltage state of the first output terminal to any of a predetermined number of voltage states which are three or more voltage states, and the second sub-driver that is allowed to adjust a voltage in each (Continued)

of the voltage states of the first output terminal; and a controller that controls an operation of the first driver to perform emphasis.

20 Claims, 39 Drawing Sheets

(51) Int. Cl.
*H04B 3/06* (2006.01)
*H04L 25/02* (2006.01)
*H04L 25/49* (2006.01)
*H04L 25/03* (2006.01)
*H03K 19/0175* (2006.01)
*H03K 17/687* (2006.01)

(52) U.S. Cl.
CPC ....... *H03K 19/017545* (2013.01); *H04B 3/06* (2013.01); *H04L 25/026* (2013.01); *H04L 25/028* (2013.01); *H04L 25/03019* (2013.01); *H04L 25/03343* (2013.01); *H04L 25/49* (2013.01); *H04L 25/493* (2013.01); *H03K 2017/6878* (2013.01); *H04L 25/0292* (2013.01)

(58) Field of Classification Search
CPC ...... H03K 2017/6878; H04L 25/03019; H04L 25/03343; H04L 25/026; H04L 25/028; H04L 25/493; H04L 25/49; H04L 25/0292; H04B 3/06; H04B 3/04
See application file for complete search history.

(56) References Cited

U.S. PATENT DOCUMENTS

| | | | |
|---|---|---|---|
| 2013/0241501 A1* | 9/2013 | Chang | ................. H02J 7/0055 320/166 |
| 2014/0198837 A1 | 7/2014 | Fox et al. | |
| 2016/0204964 A1 | 7/2016 | Takahashi et al. | |
| 2019/0123724 A1* | 4/2019 | Hayashi | .............. H04L 25/0278 |

FOREIGN PATENT DOCUMENTS

| | | |
|---|---|---|
| JP | 2011-142382 A | 7/2011 |
| JP | 2012-235468 A | 5/2012 |
| JP | 2013-187678 A | 9/2013 |
| WO | 2015/146511 A1 | 10/2015 |

* cited by examiner

[FIG. 1]
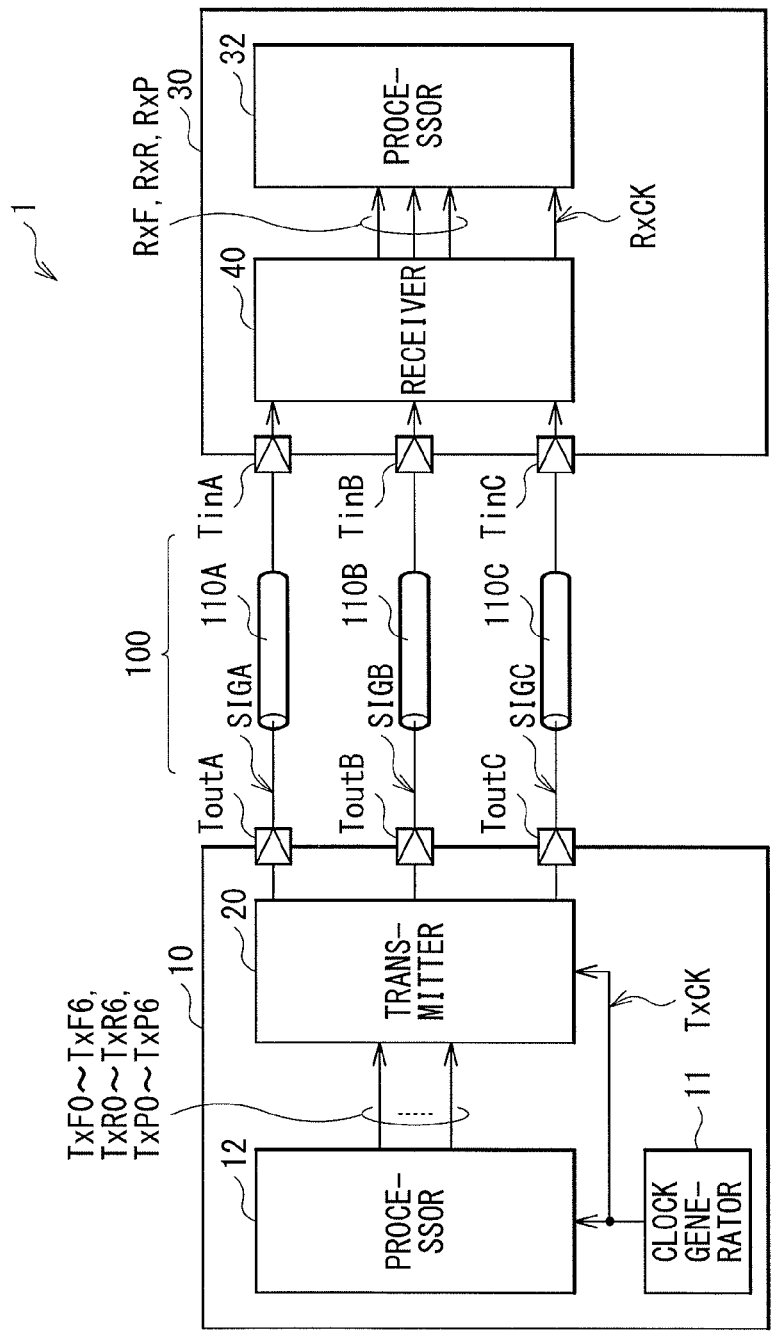

[ FIG. 2 ]
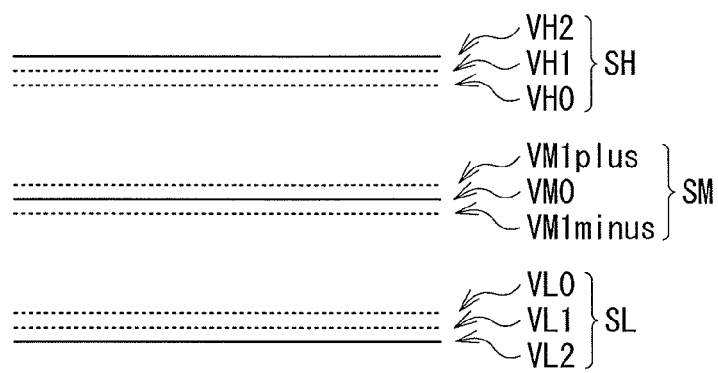
[ FIG. 3 ]
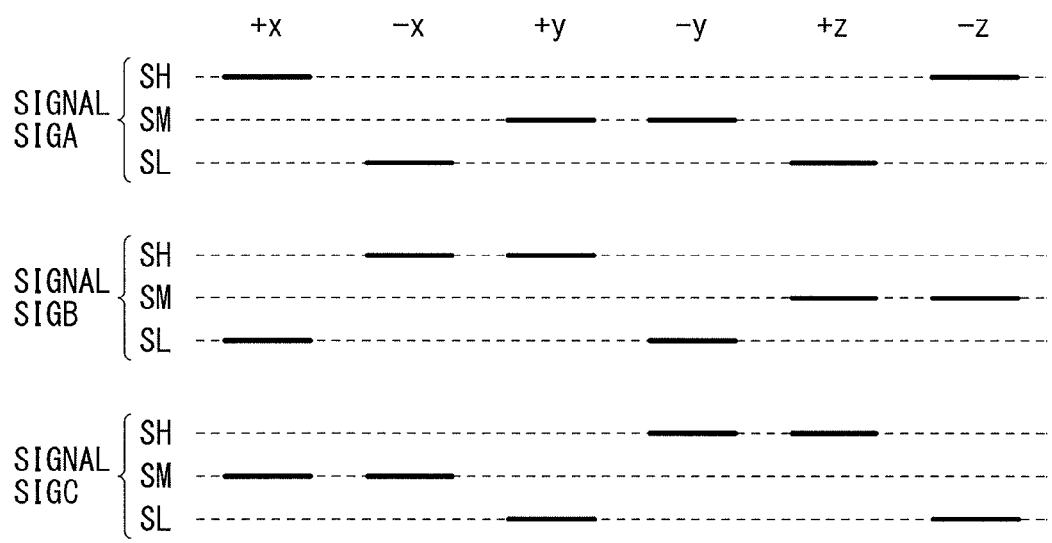

[ FIG. 4 ]
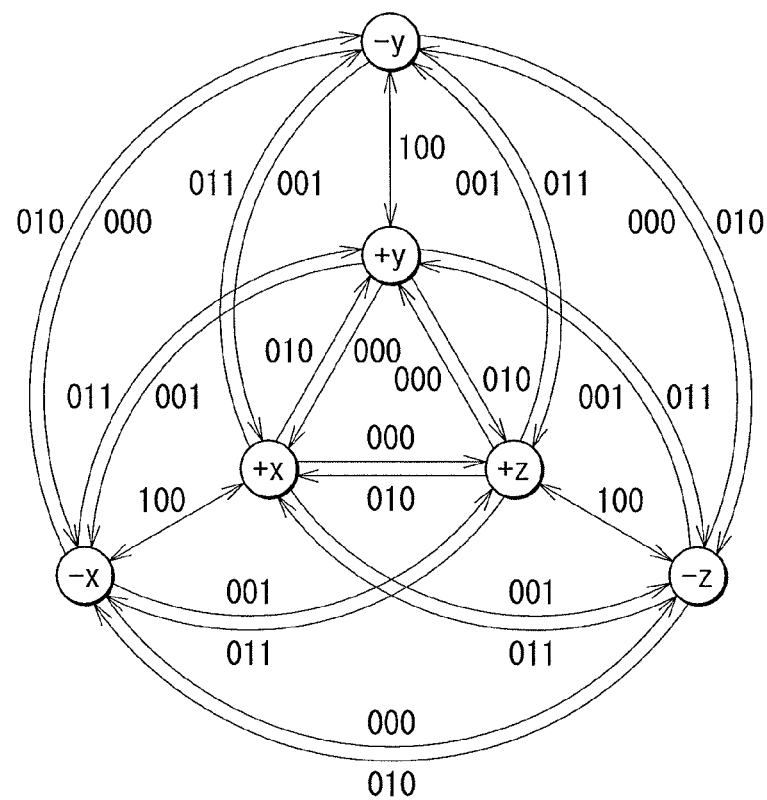

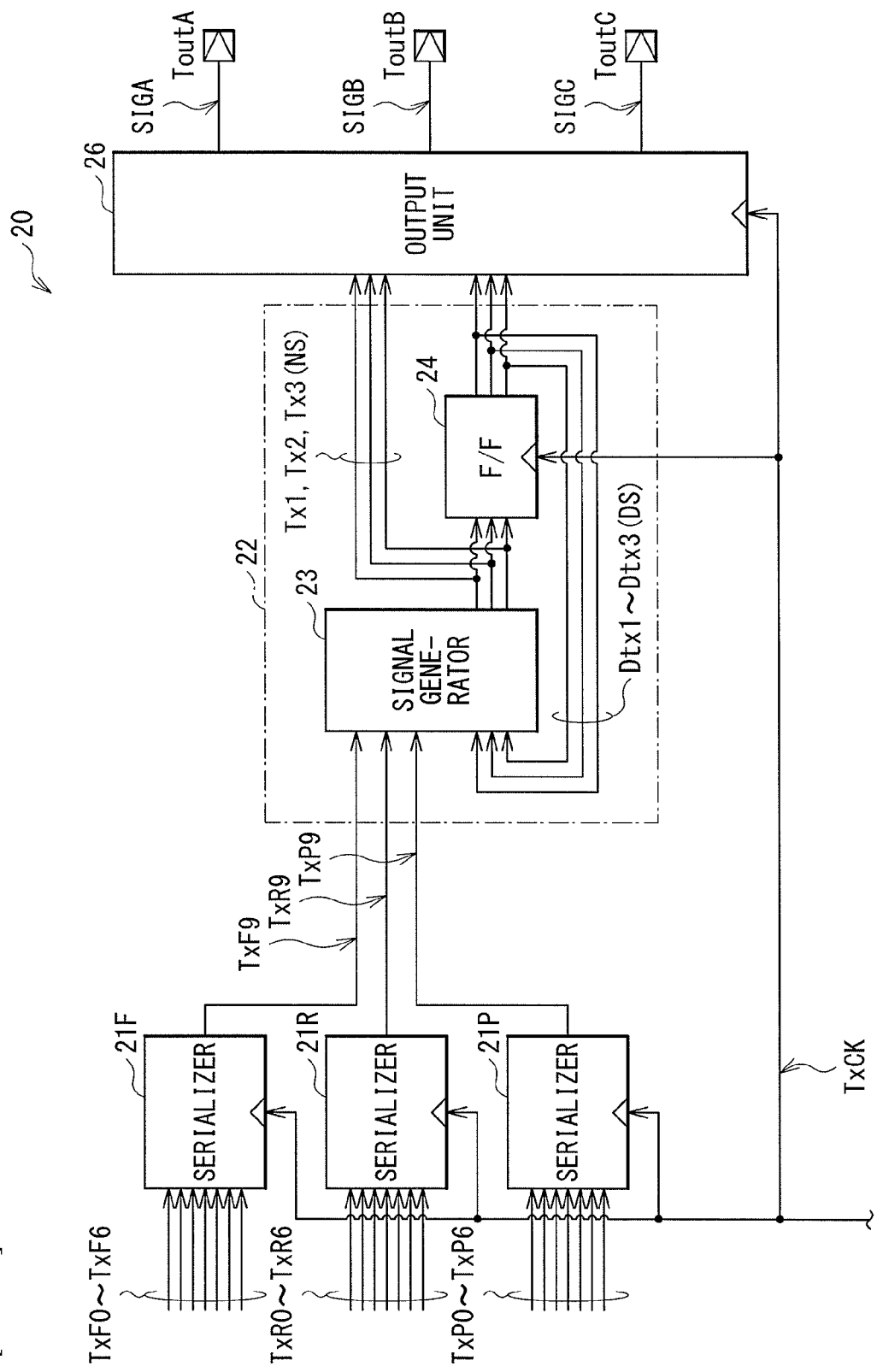
[FIG. 5]

[ FIG. 6 ]

| TxF9, TxR9, TxP9 | DS=+x | DS=-x | DS=+y | DS=-y | DS=+z | DS=-z |
|---|---|---|---|---|---|---|
| 000 | +z | -z | +x | -x | +y | -y |
| 001 | -z | +z | -x | +x | -y | +y |
| 010 | +y | -y | +z | -z | +x | -x |
| 011 | -y | +y | -z | +z | -x | +x |
| 1XX | -x | +x | -y | +y | -z | +z |

[FIG. 7]
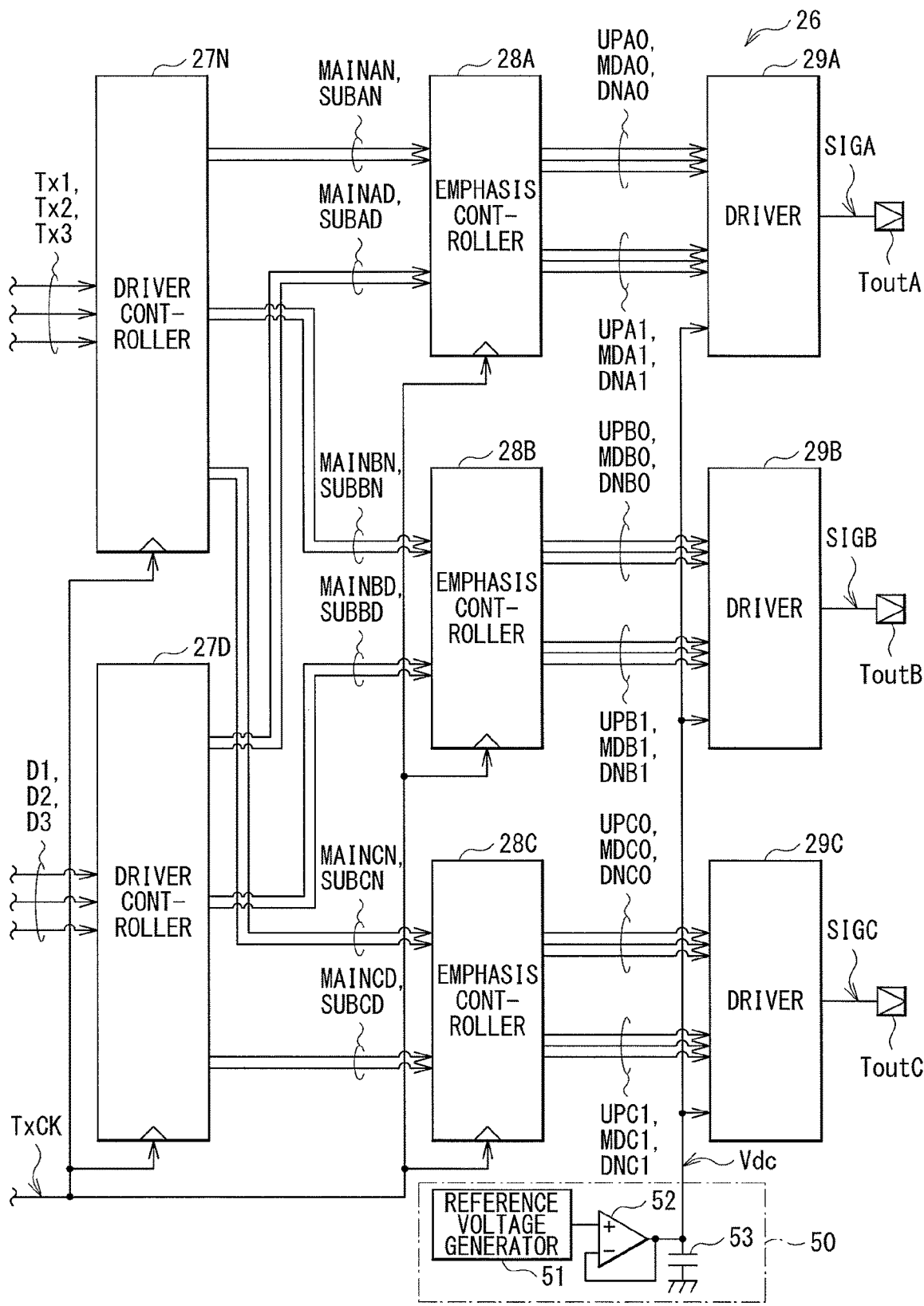

[ FIG. 8 ]
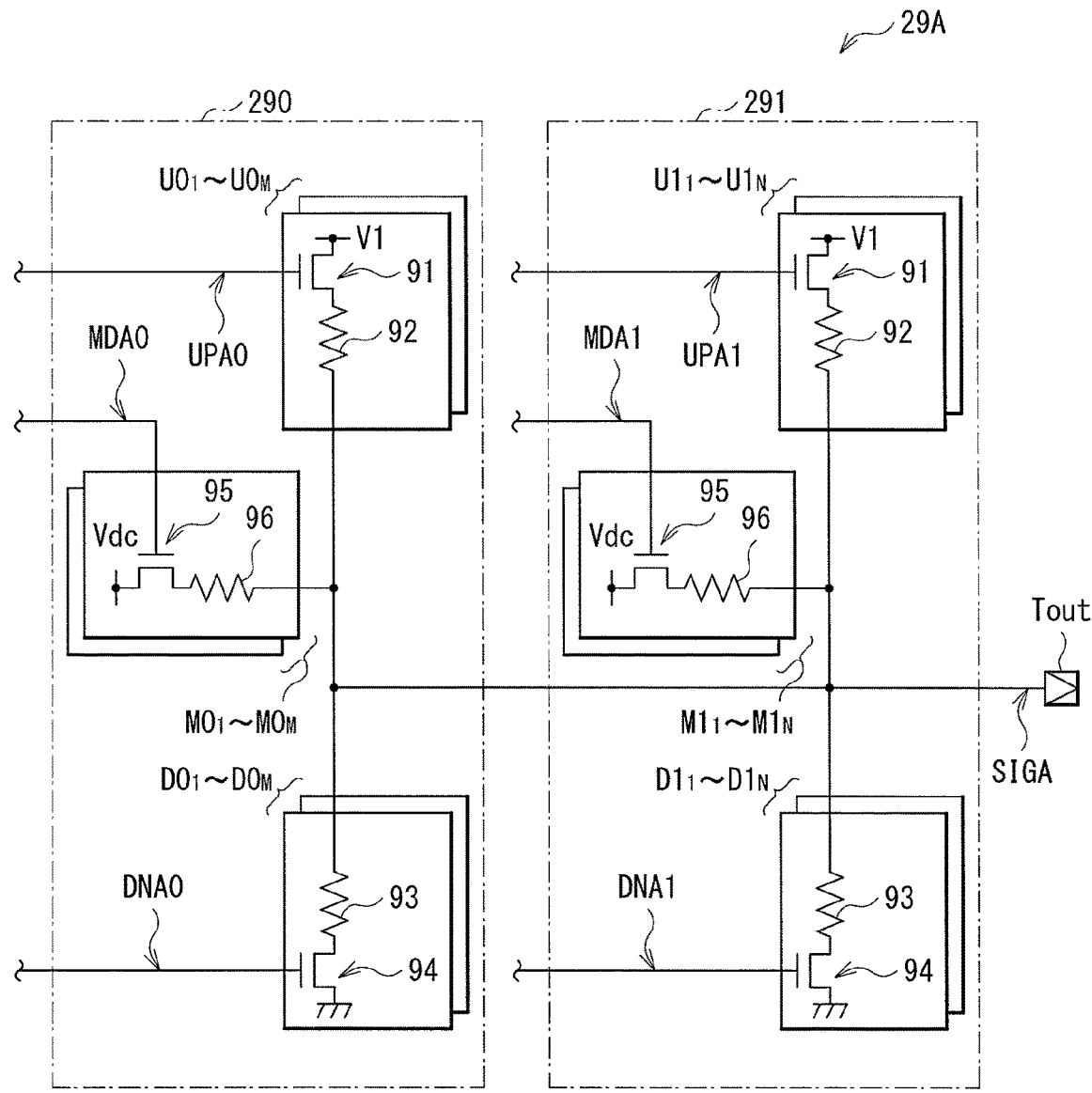

[FIG. 9]

| INPUT | | | | OUTPUT | | | | | | |
|---|---|---|---|---|---|---|---|---|---|---|
| SIGNAL MAINAD | SIGNAL SUBAD | SIGNAL MAINAN | SIGNAL SUBAN | SIGNAL UPA0 | SIGNAL UPA1 | SIGNAL MDA0 | SIGNAL MDA1 | SIGNAL DNA0 | SIGNAL DNA1 | SIGA |
| 0 | 0 | 0 | 0 | 0 | 0 | 1 | 1 | 0 | 0 | VM0 |
| 1 | 1 | 0 | 0 | 0 | 0 | 1 | 1 | 0 | 0 | VM0 |
| 0 | 1 | 0 | 0 | 0 | 1 | 1 | 0 | 0 | 0 | VM1plus |
| 1 | 0 | 0 | 1 | 0 | 0 | 1 | 0 | 0 | 1 | VM1minus |
| 1 | 0 | 0 | 1 | 0 | 0 | 0 | 0 | 1 | 1 | VL2 |
| 0 | 0 | 0 | 1 | 0 | 0 | 0 | 1 | 1 | 0 | VL1 |
| 1 | 1 | 0 | 0 | 0 | 0 | 0 | 1 | 1 | 0 | VL1 |
| 0 | 1 | 1 | 0 | 1 | 1 | 0 | 0 | 1 | 0 | VL0 |
| 0 | 0 | 1 | 0 | 1 | 1 | 0 | 0 | 0 | 0 | VH2 |
| 0 | 1 | 1 | 1 | 1 | 0 | 0 | 1 | 0 | 0 | VH1 |
| 1 | 0 | 1 | 1 | 1 | 0 | 0 | 1 | 0 | 0 | VH1 |
| 0 | 0 | 1 | 1 | 0 | 0 | 1 | 0 | 0 | 1 | VH0 |
| 1 | 1 | 1 | 1 | 0 | 0 | 1 | 1 | 0 | 0 | VM0 |
| 0 | 1 | 1 | 1 | 0 | 1 | 1 | 1 | 0 | 0 | VM0 |
| 1 | 0 | 1 | 1 | 0 | 0 | 1 | 0 | 0 | 0 | VM1plus |
| 1 | 0 | 1 | 1 | 0 | 0 | 1 | 0 | 0 | 1 | VM1minus |

[ FIG. 10A ]
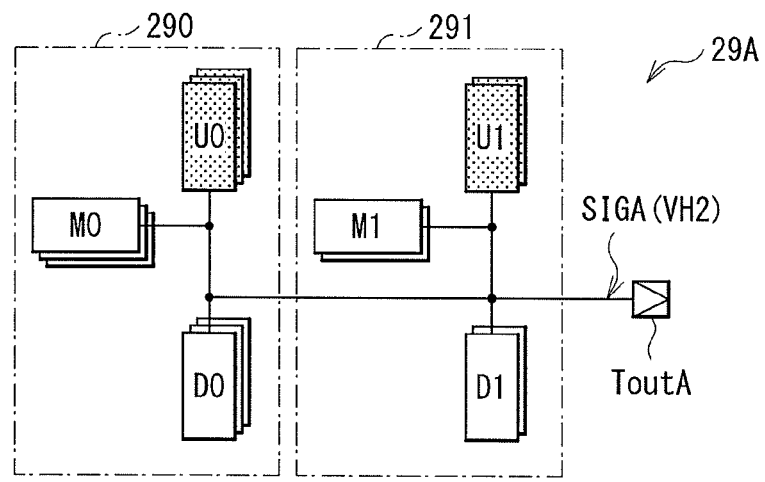
[ FIG. 10B ]
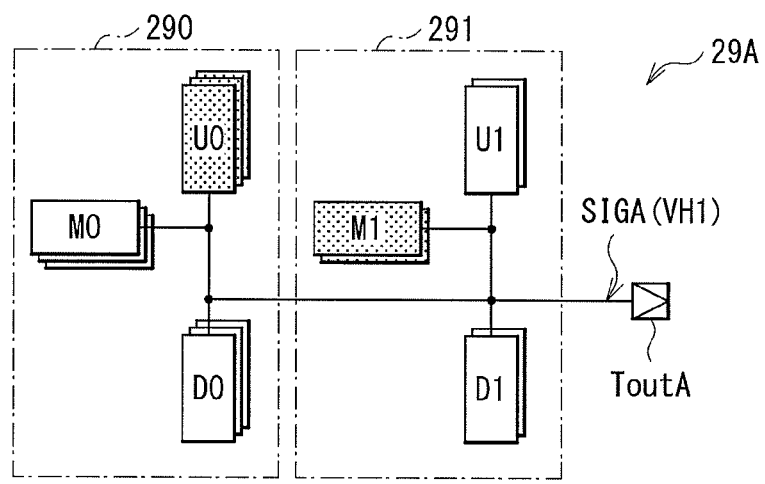
[ FIG. 10C ]
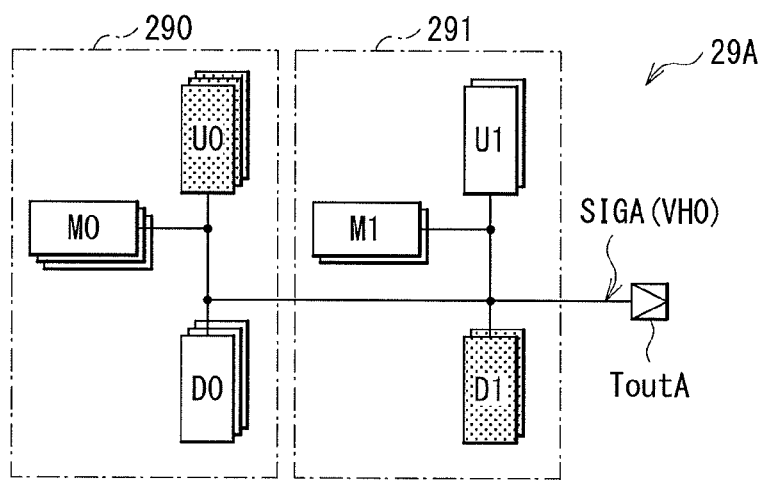

[ FIG. 11A ]
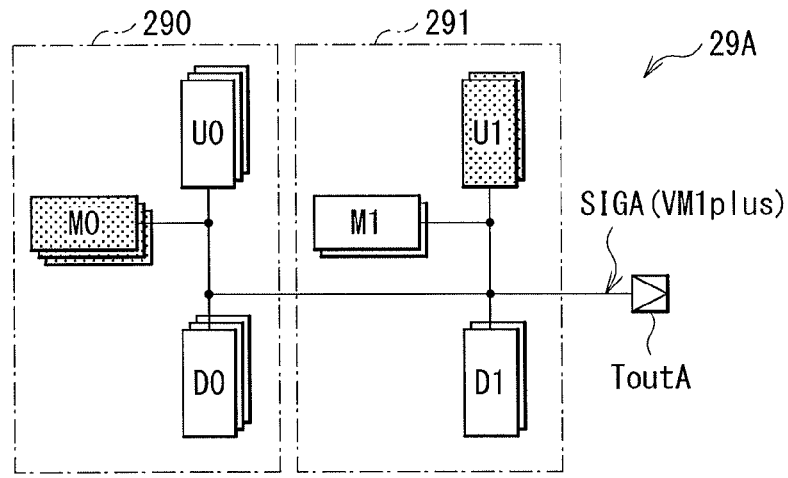
[ FIG. 11B ]
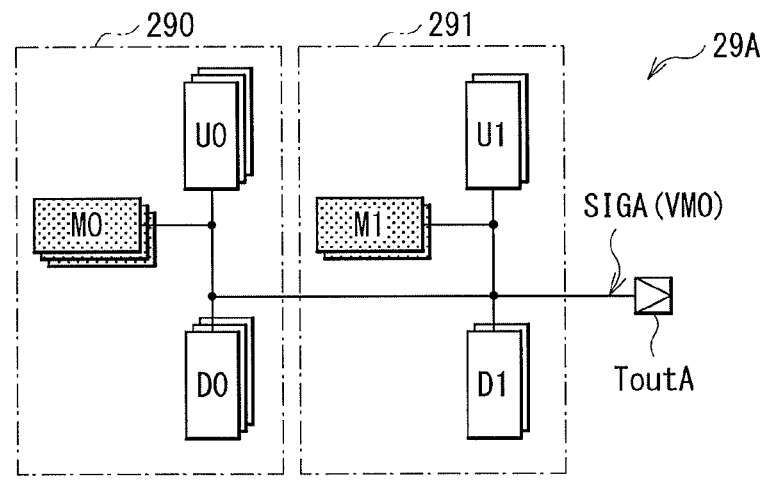
[ FIG. 11C ]
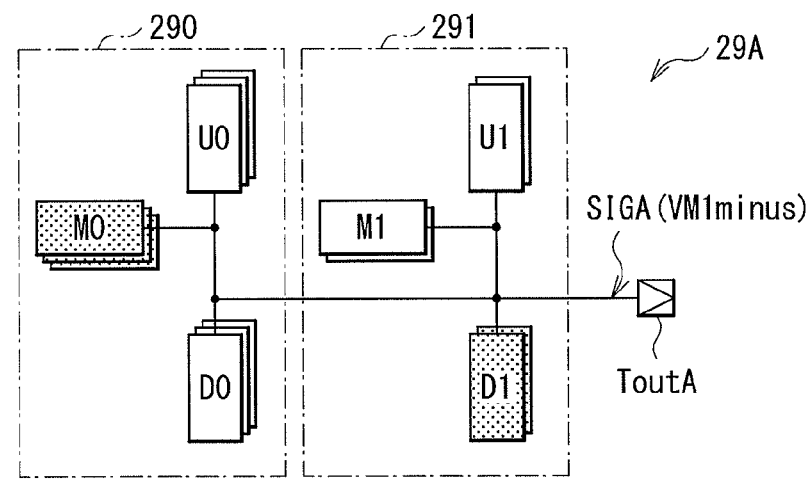

[ FIG. 12A ]
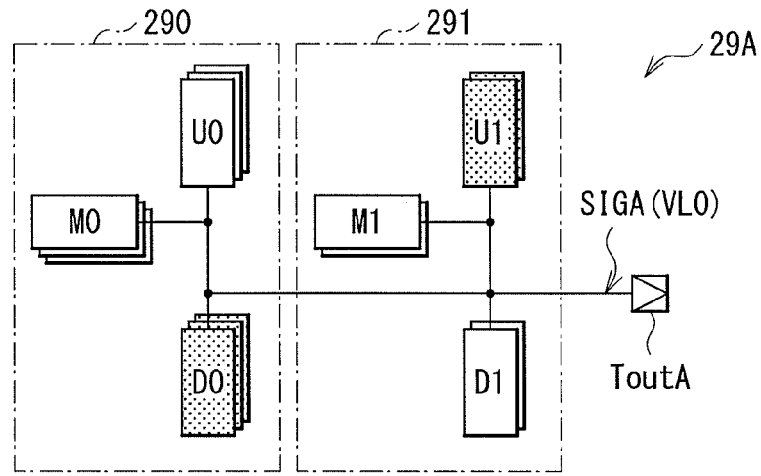
[ FIG. 12B ]
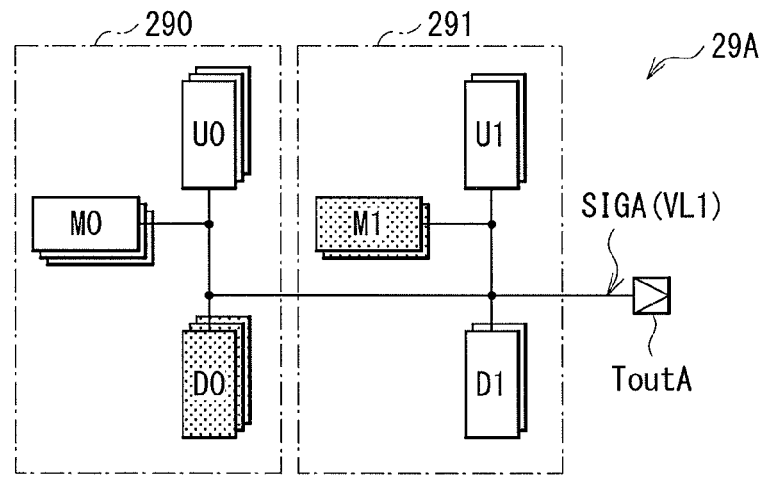
[ FIG. 12C ]
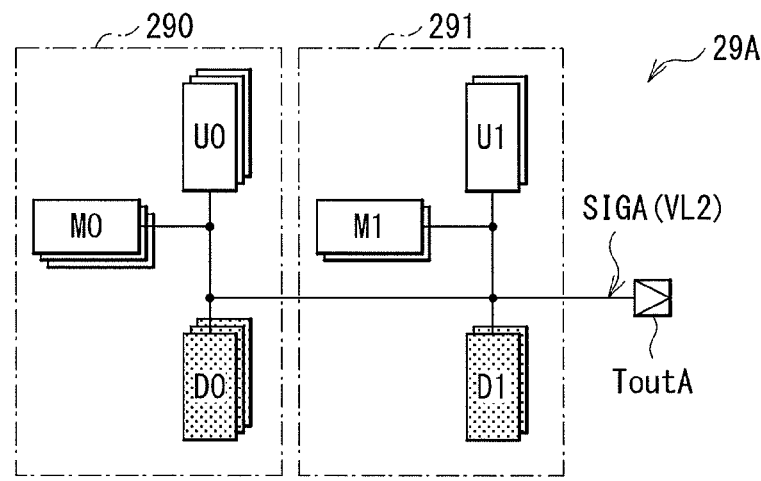

[FIG. 13]
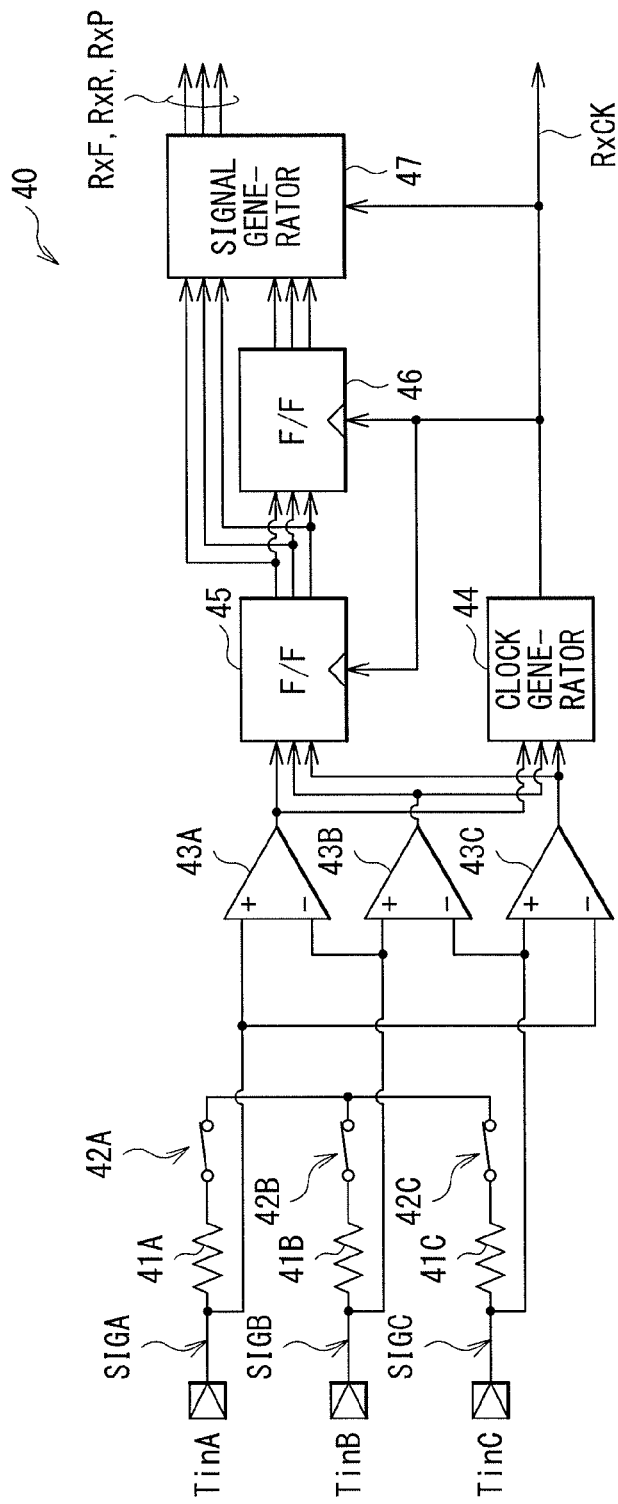

[ FIG. 14 ]
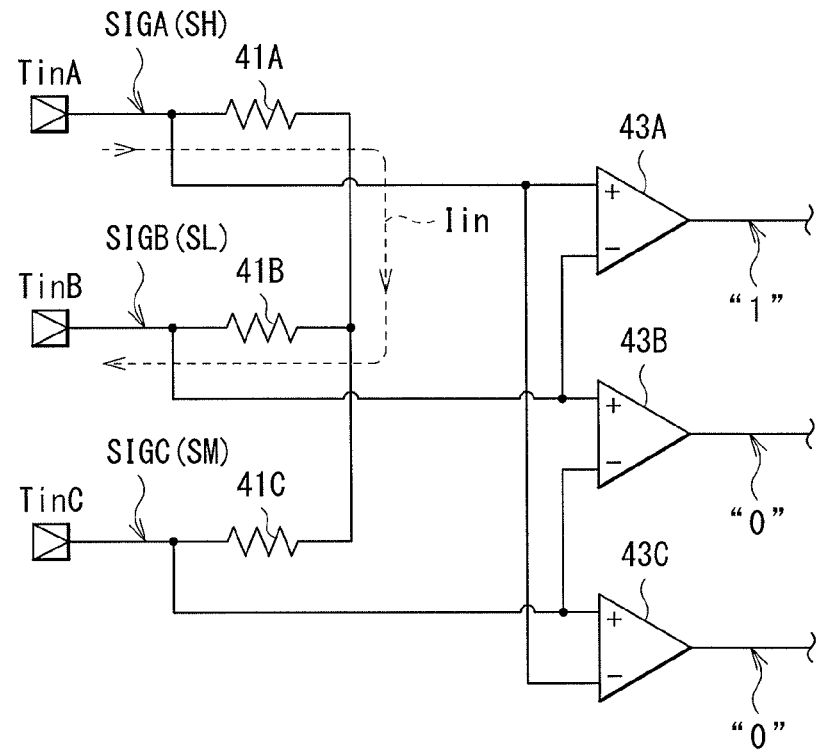
[ FIG. 15 ]
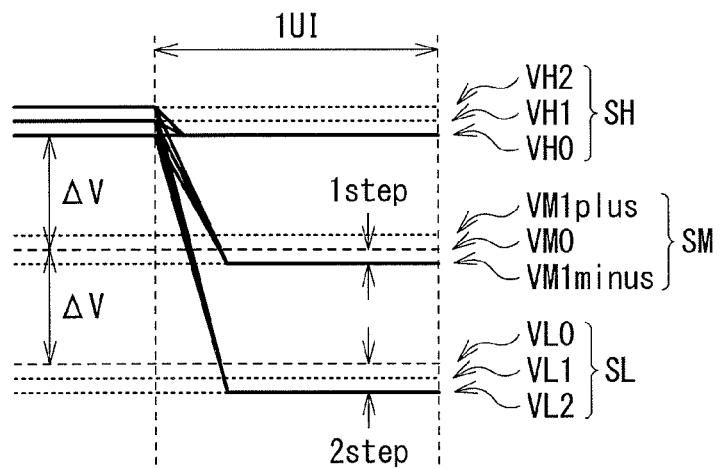

[FIG. 16]
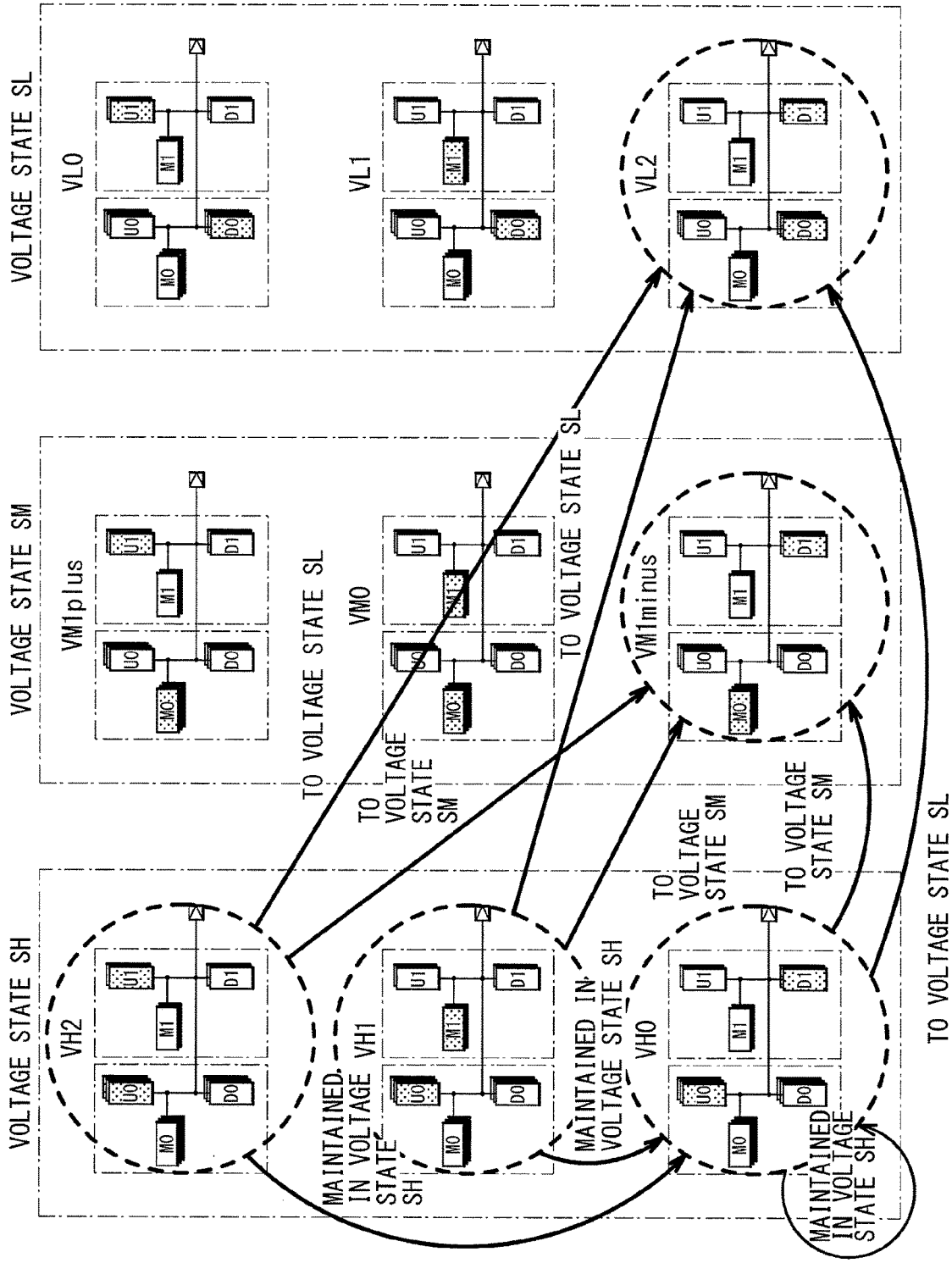

[ FIG. 17 ]
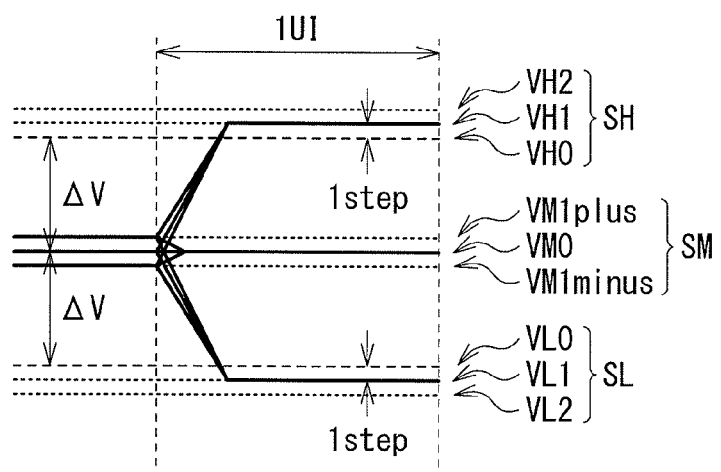

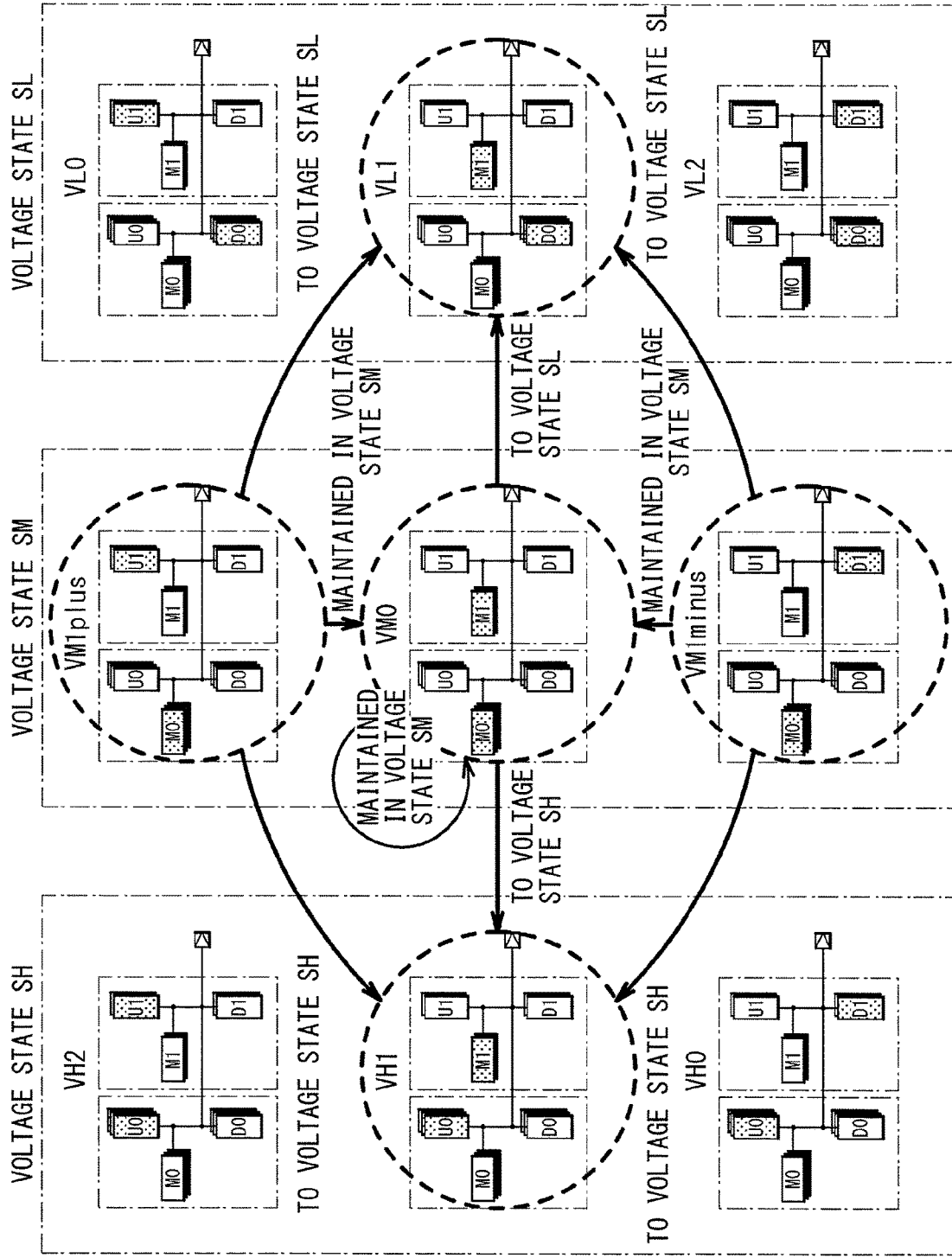
[FIG. 18]

[ FIG. 19 ]
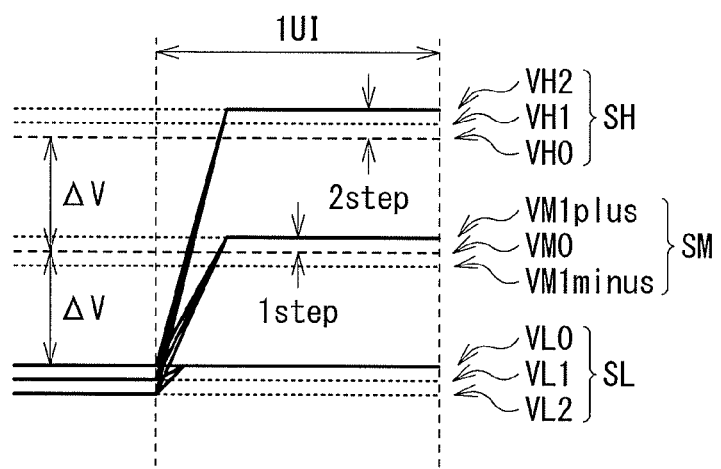

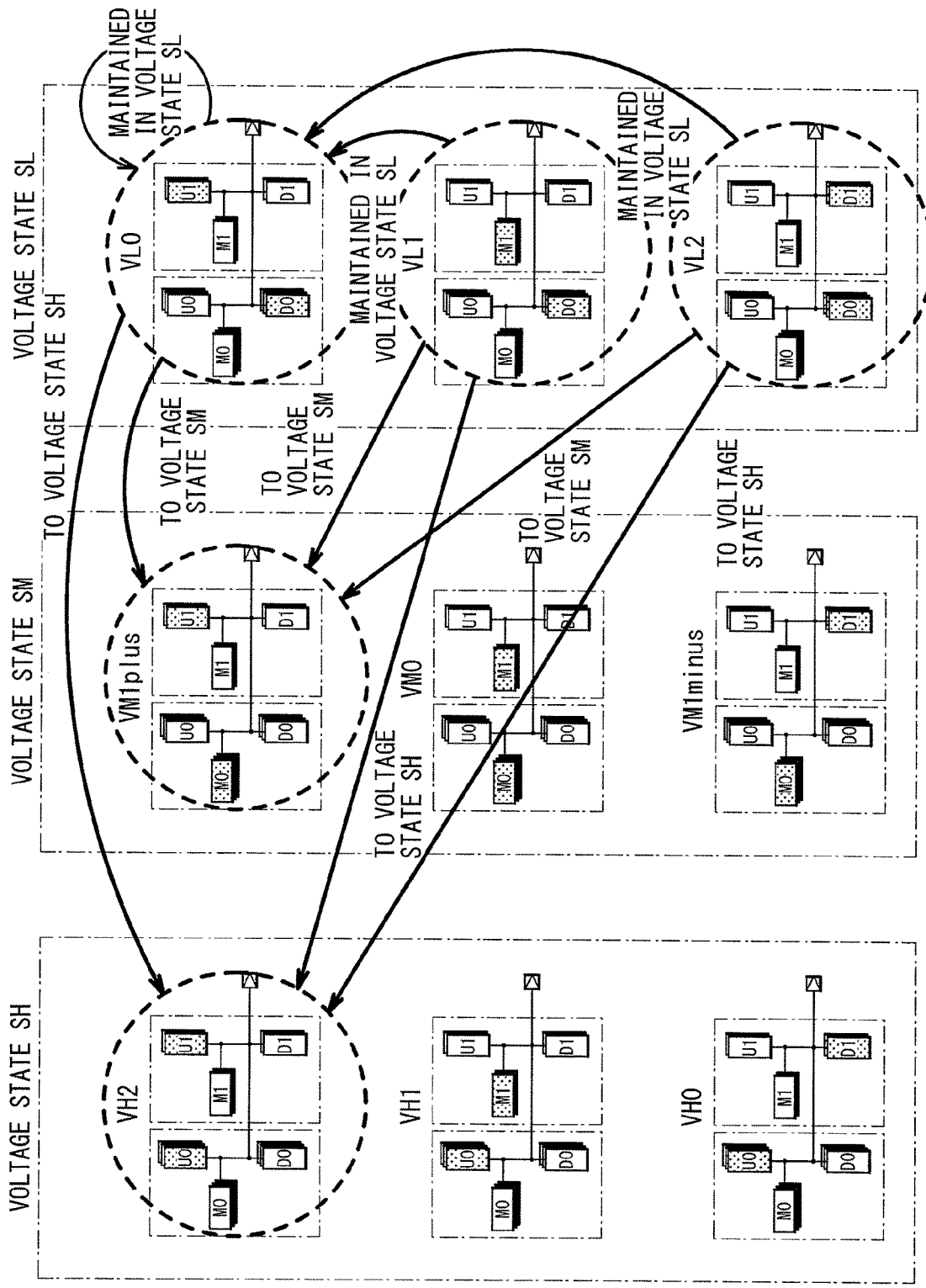
[FIG. 20]

[ FIG. 21A ]
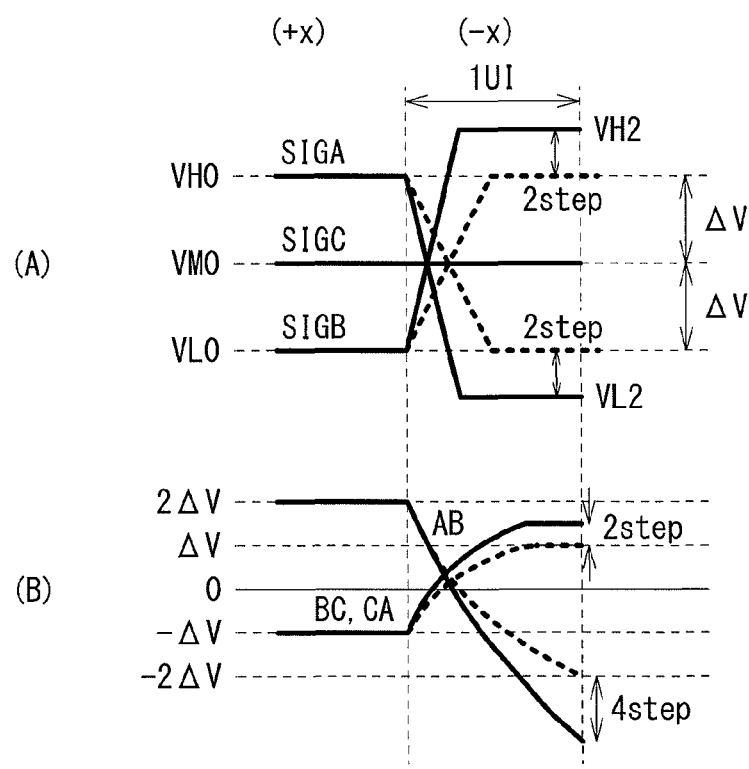

[ FIG. 21B ]
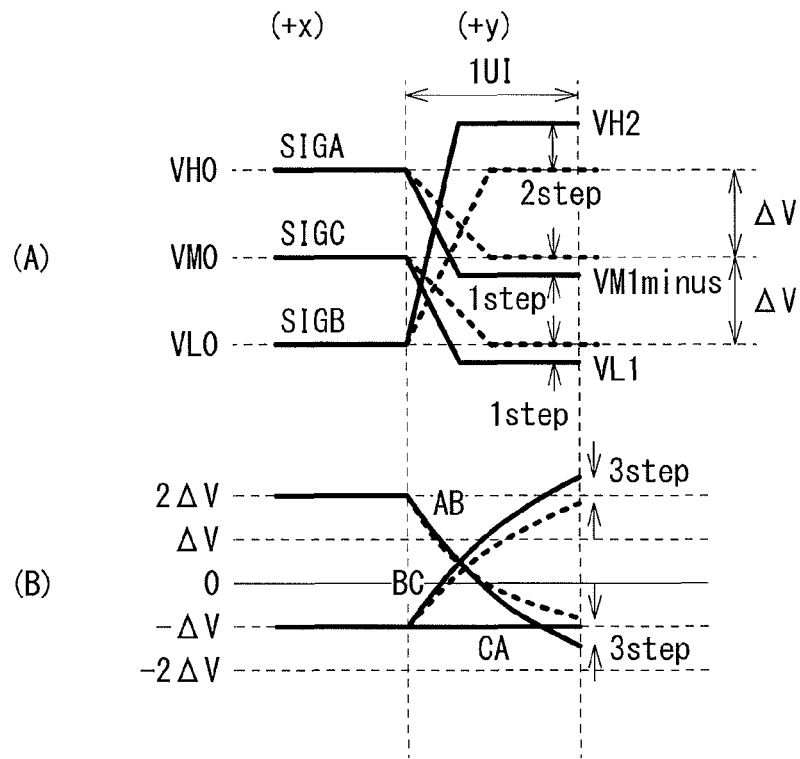
[ FIG. 21C ]
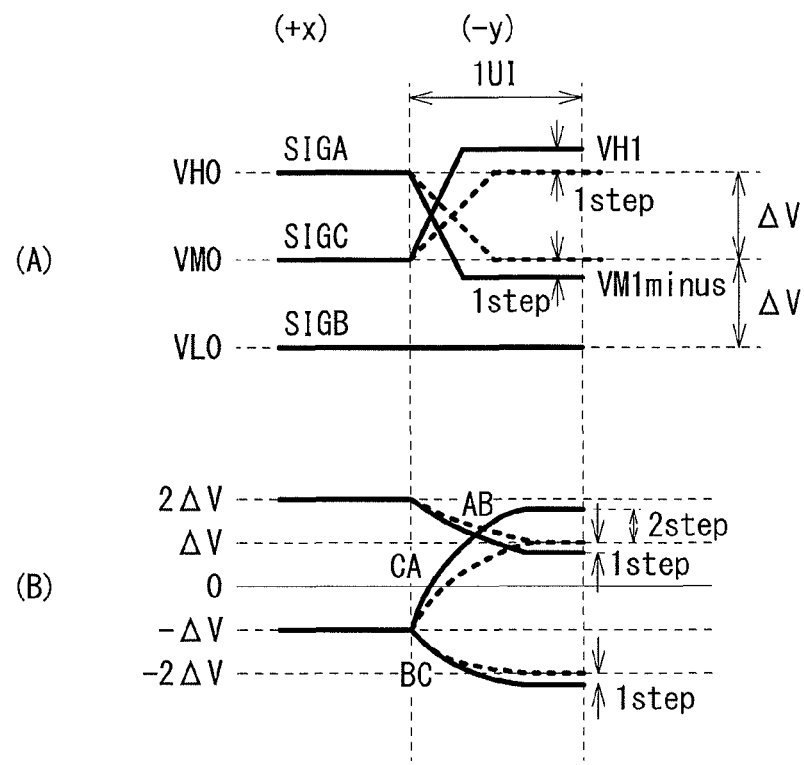

[ FIG. 21D ]
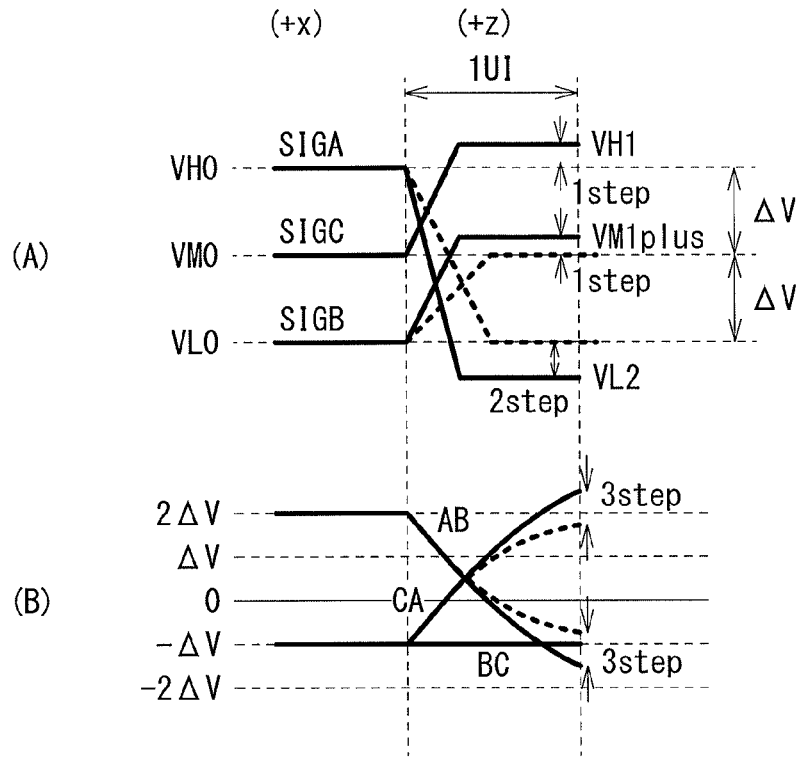
[ FIG. 21E ]
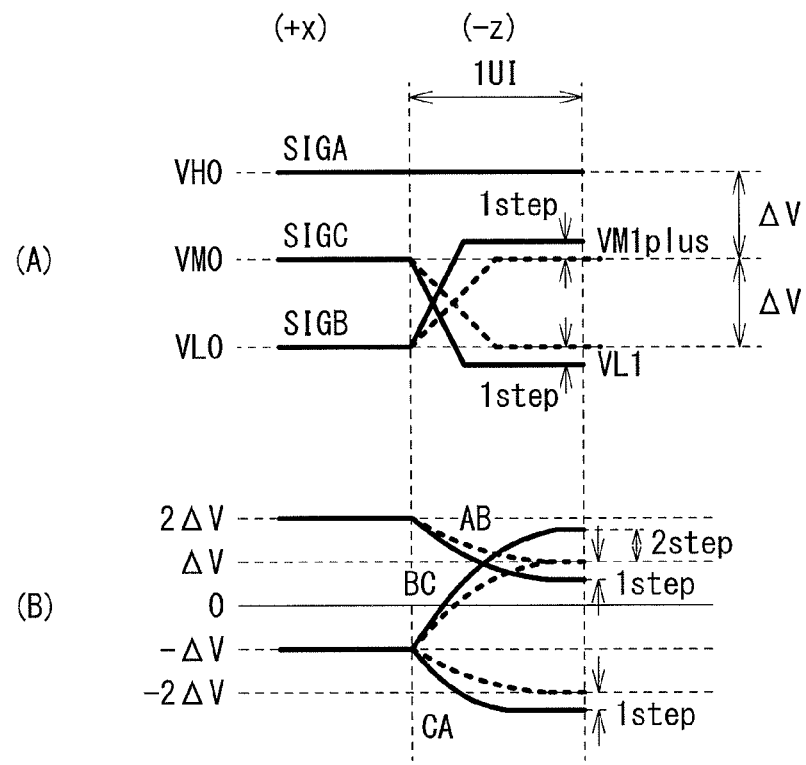

[ FIG. 22 ]
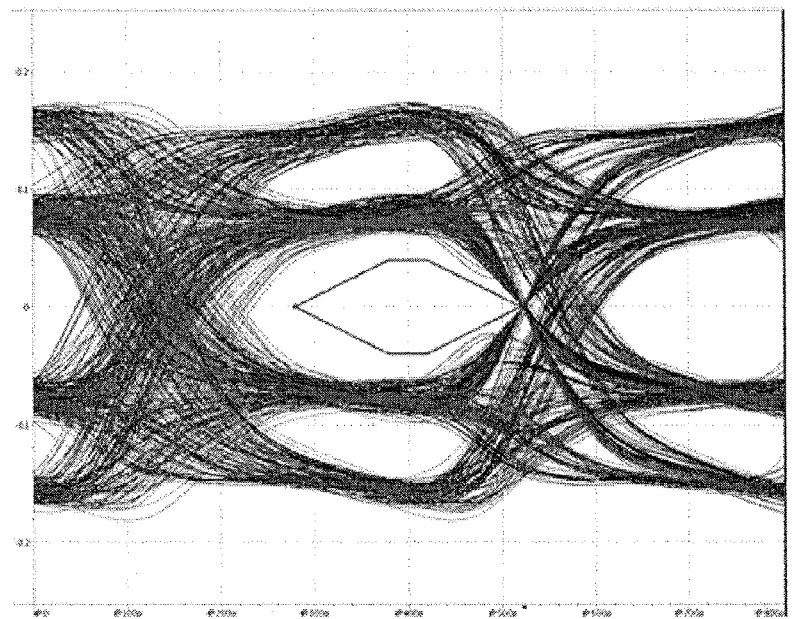
[ FIG. 23 ]
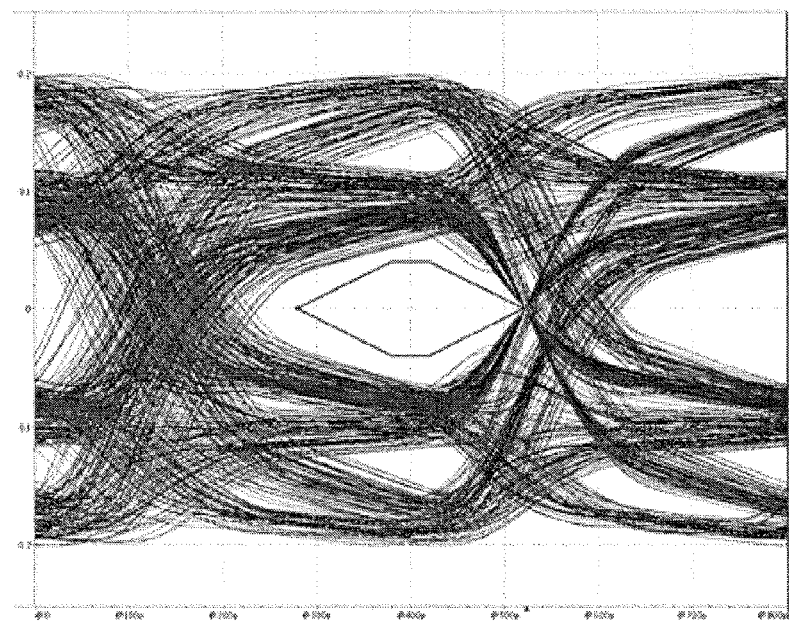

[ FIG. 24 ]
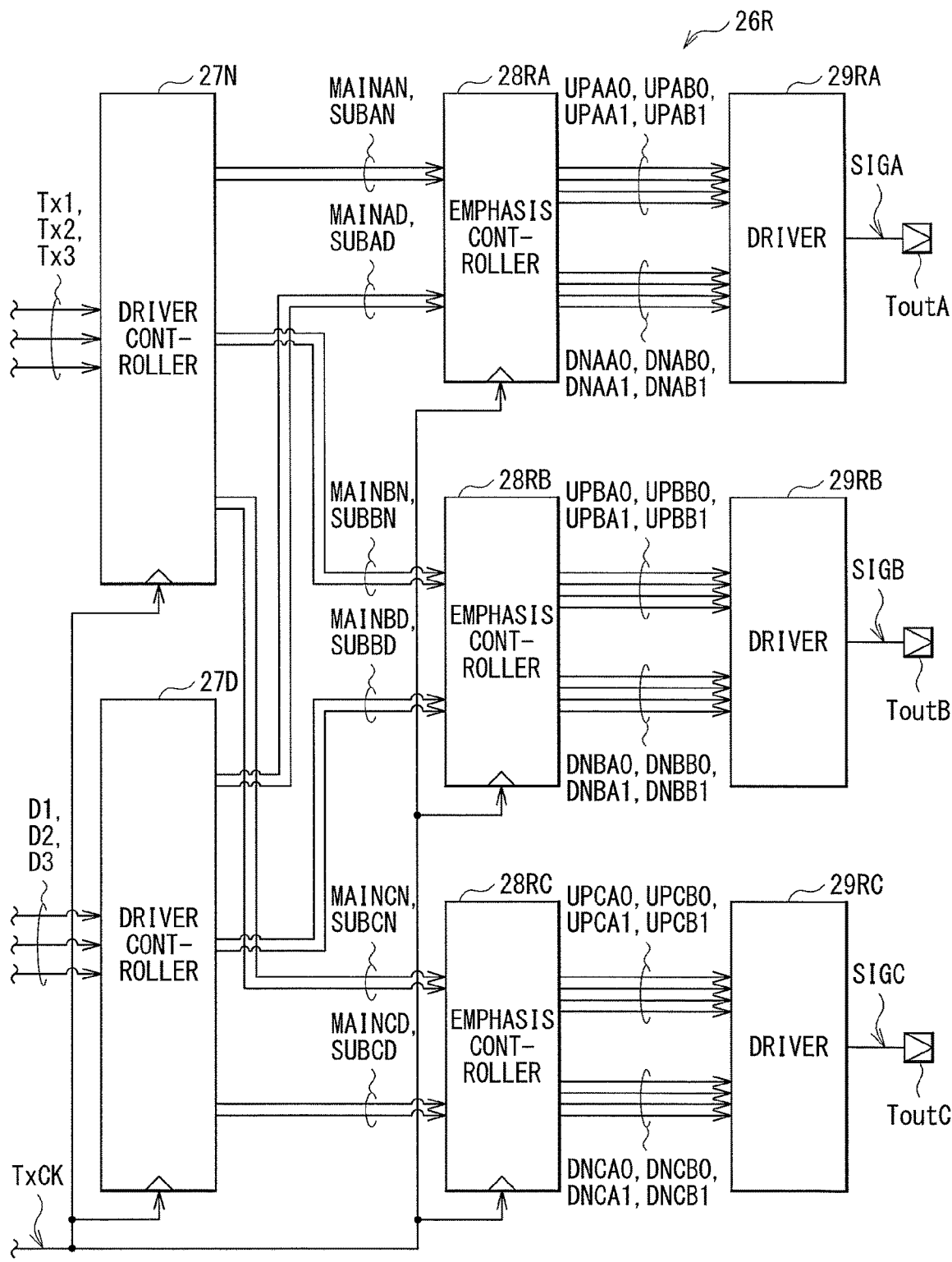

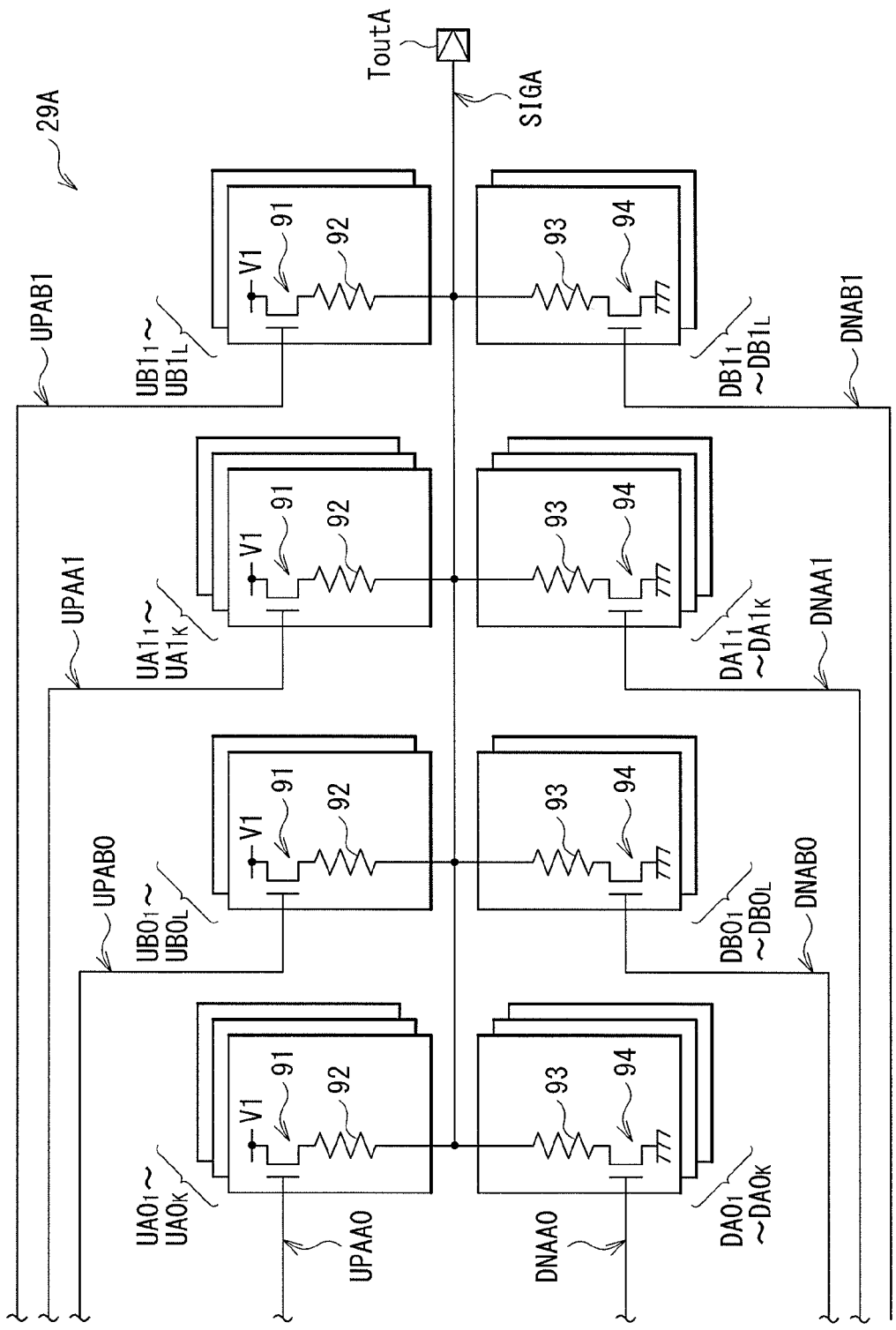
[FIG. 25]

[ FIG. 26A ]
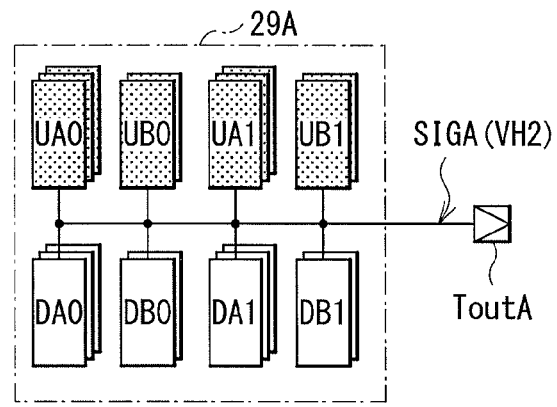
[ FIG. 26B ]
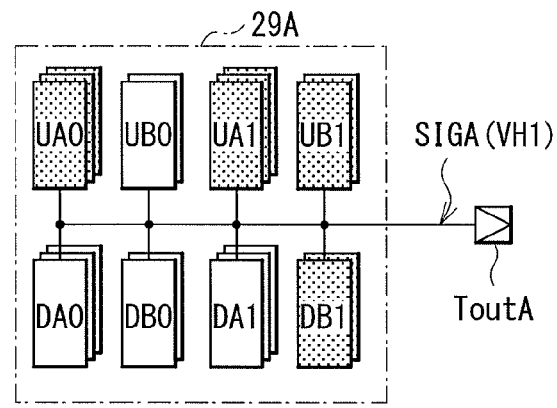
[ FIG. 26C ]
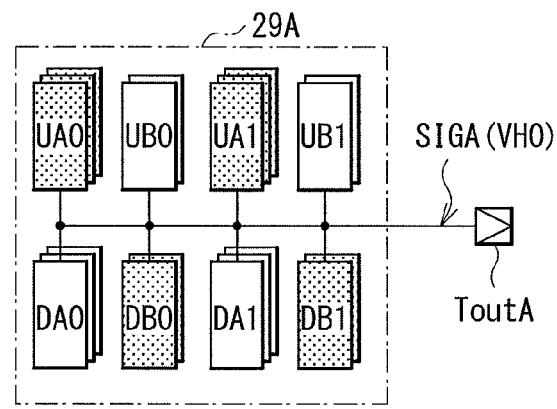

[ FIG. 27A ]
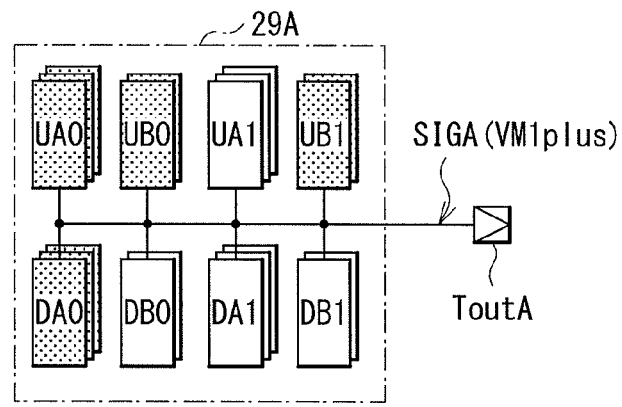
[ FIG. 27B ]
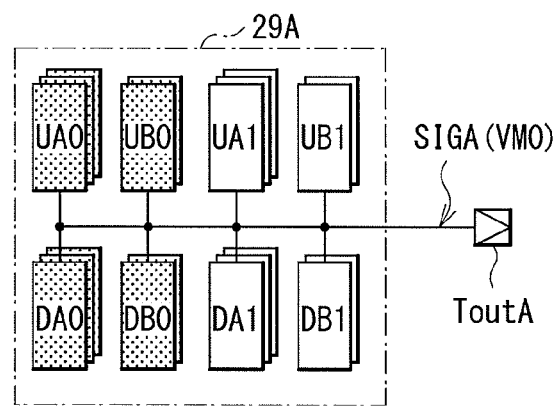
[ FIG. 27C ]
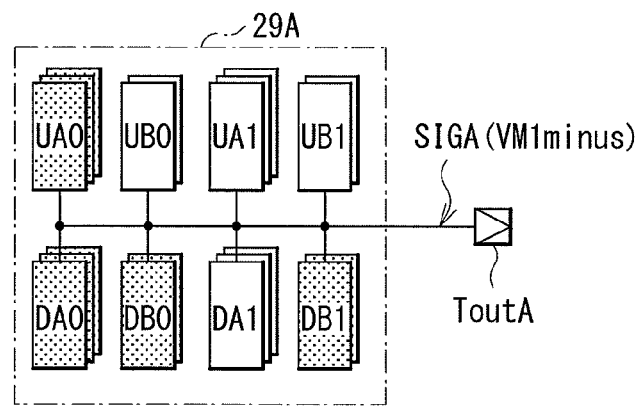

[ FIG. 28A ]
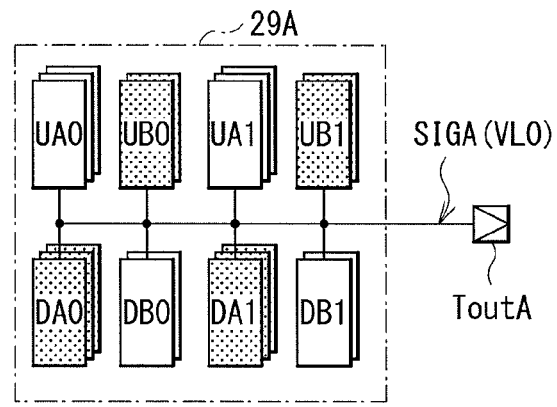
[ FIG. 28B ]
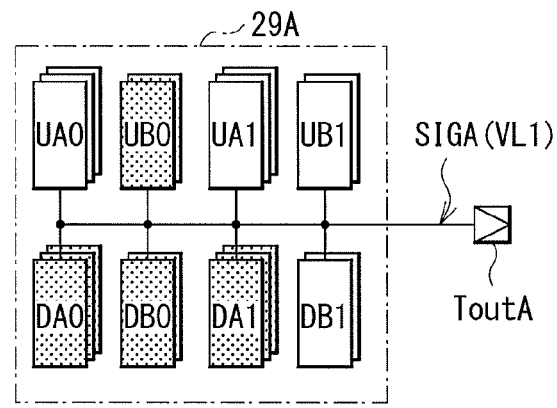
[ FIG. 28C ]
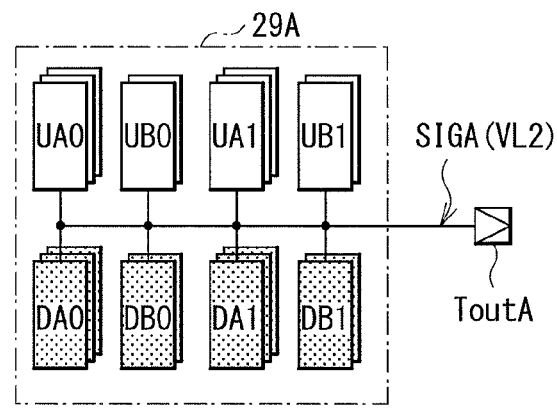

[ FIG. 29 ]
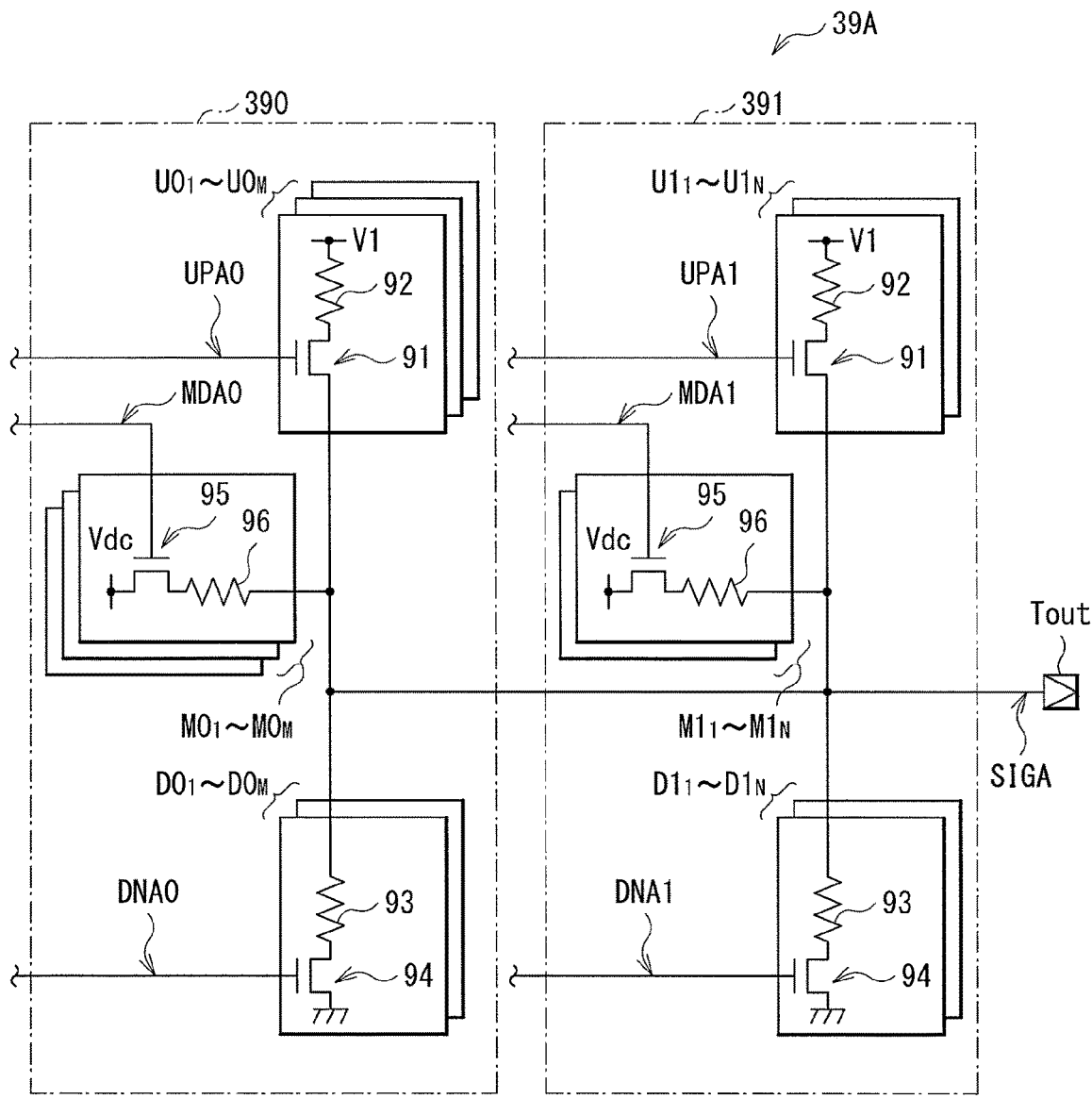

[ FIG. 30 ]
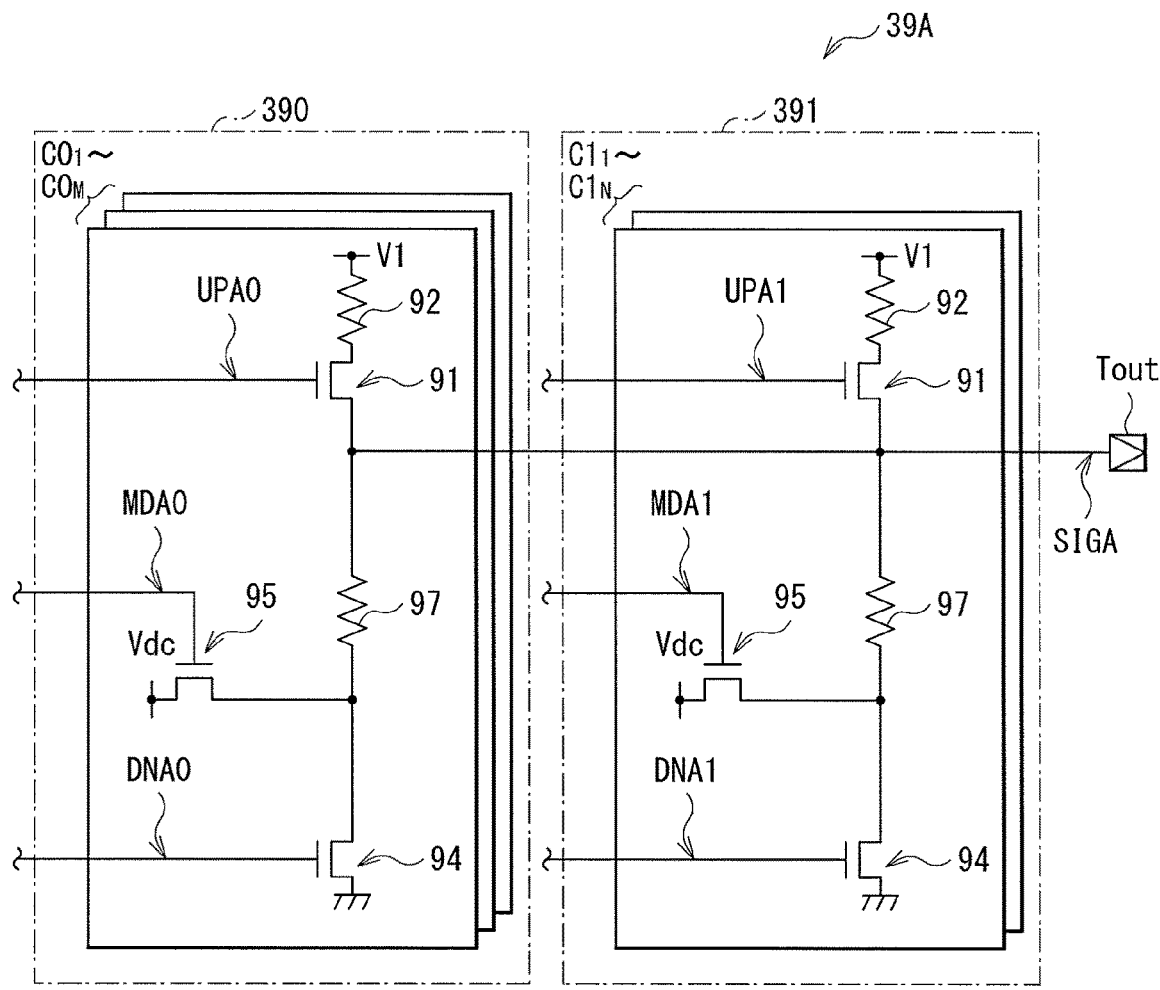

[ FIG. 31 ]
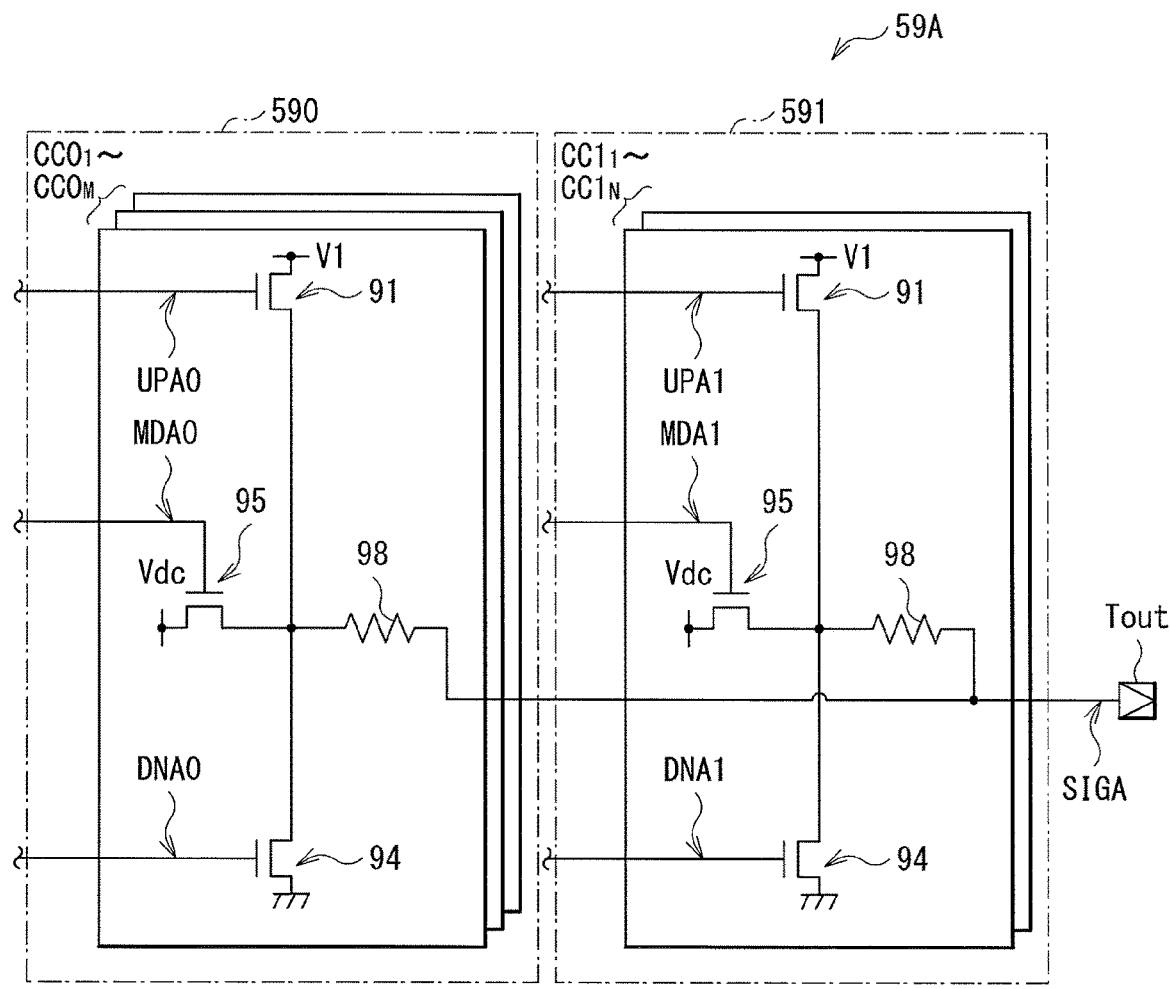

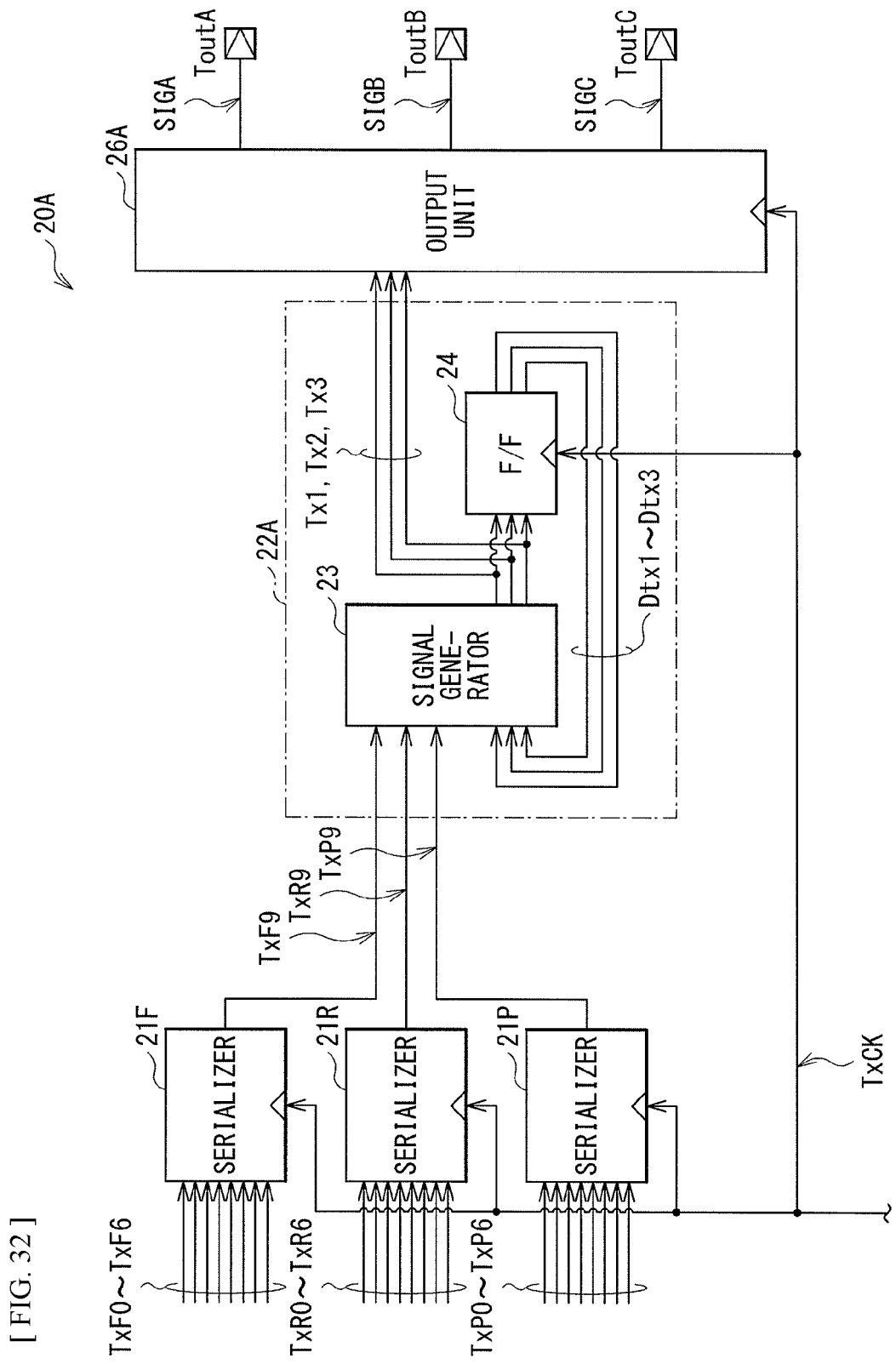
[FIG. 32]

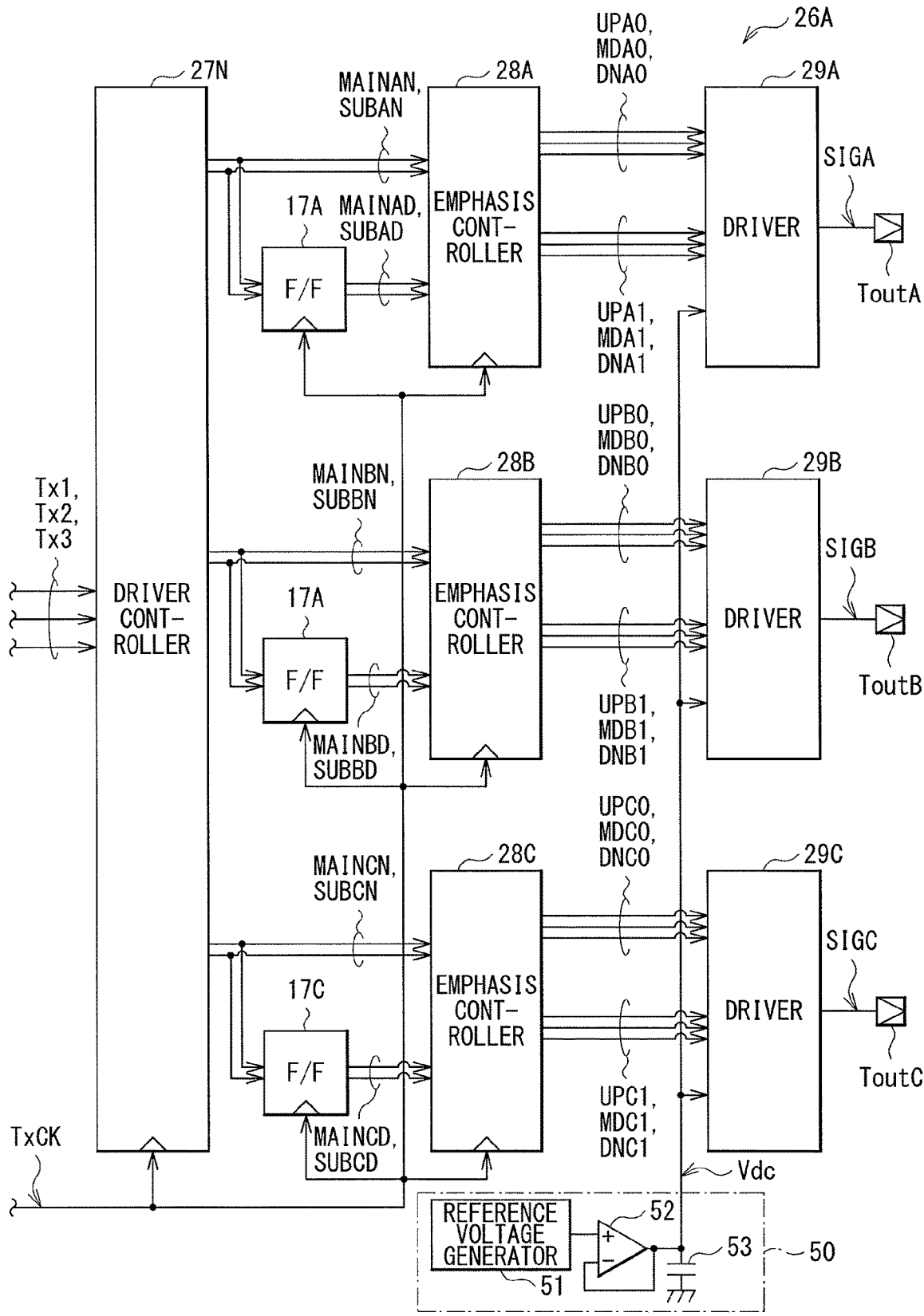
[ FIG. 33 ]

[ FIG. 34 ]
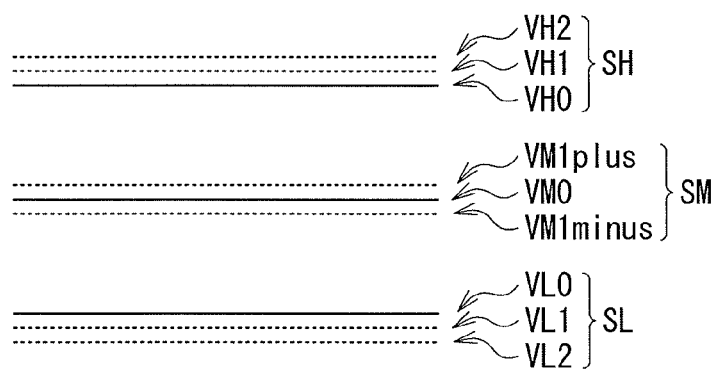
[ FIG. 35 ]
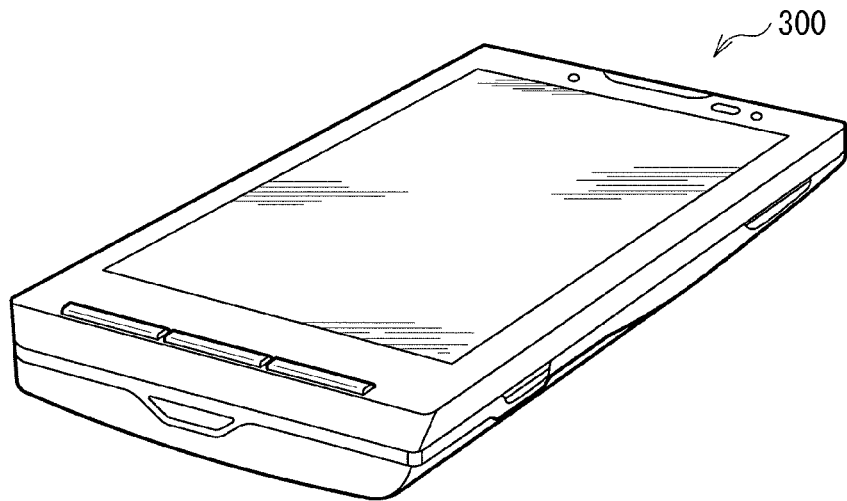

[FIG. 36]
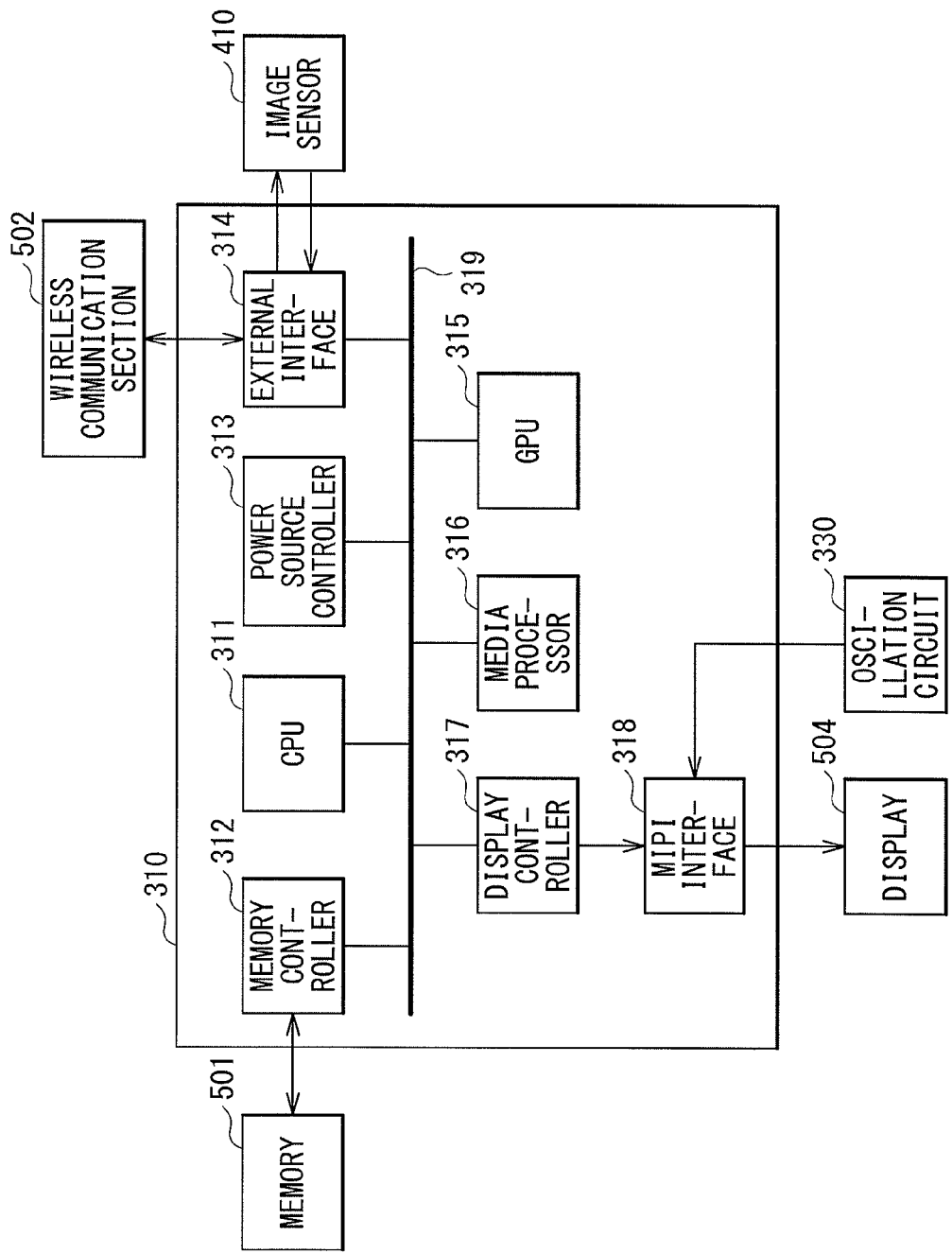

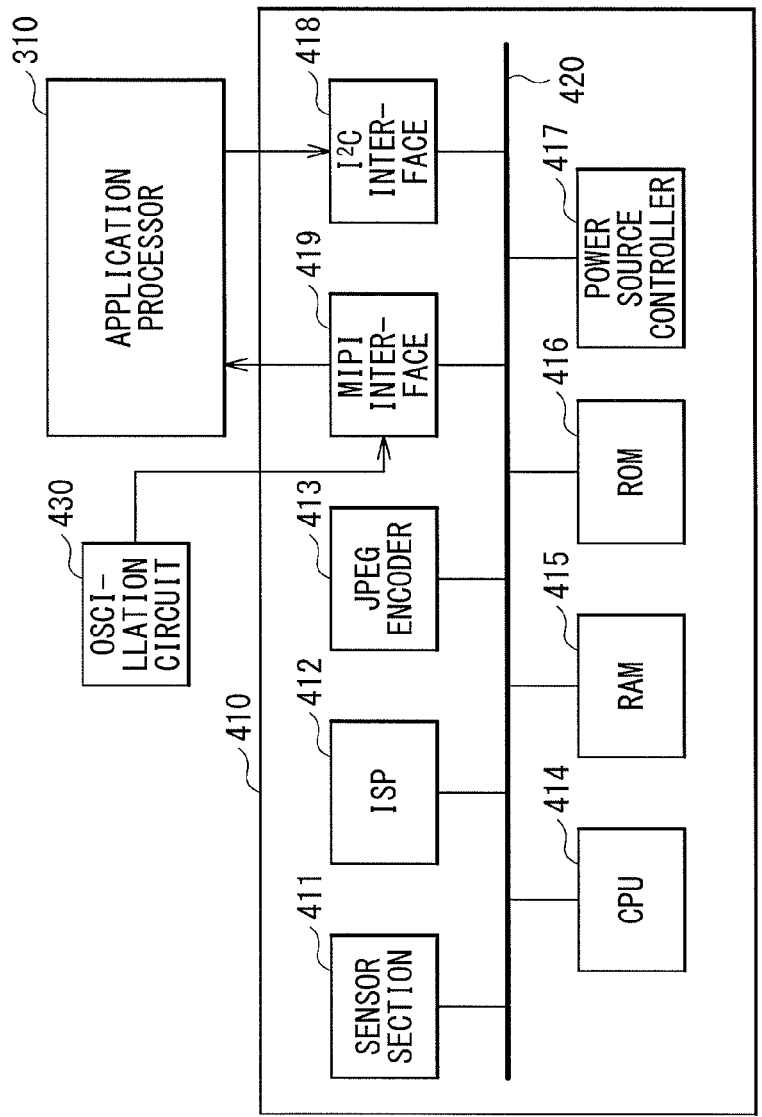
[FIG. 37]

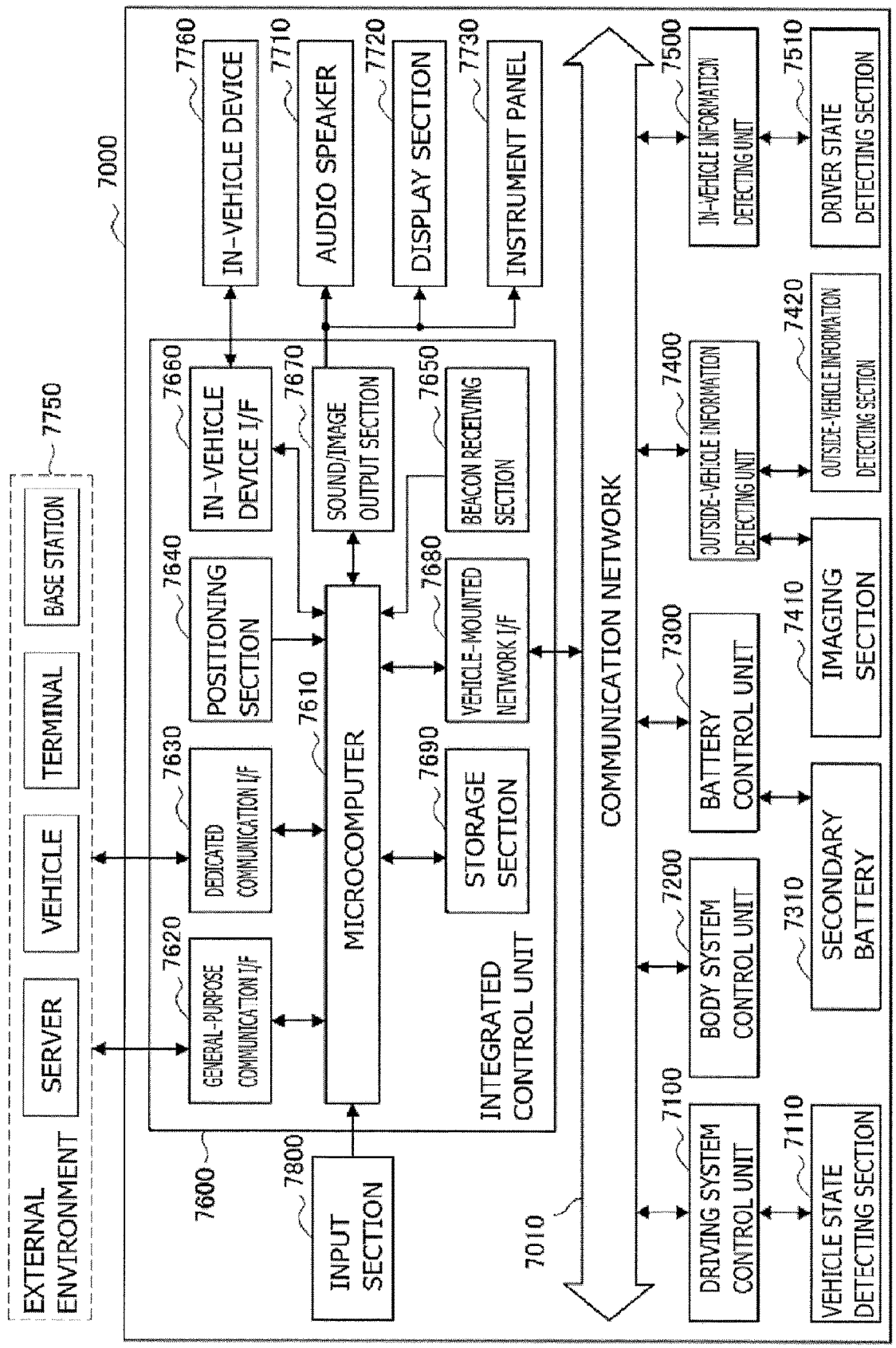
[FIG. 38]

[ FIG. 39 ]
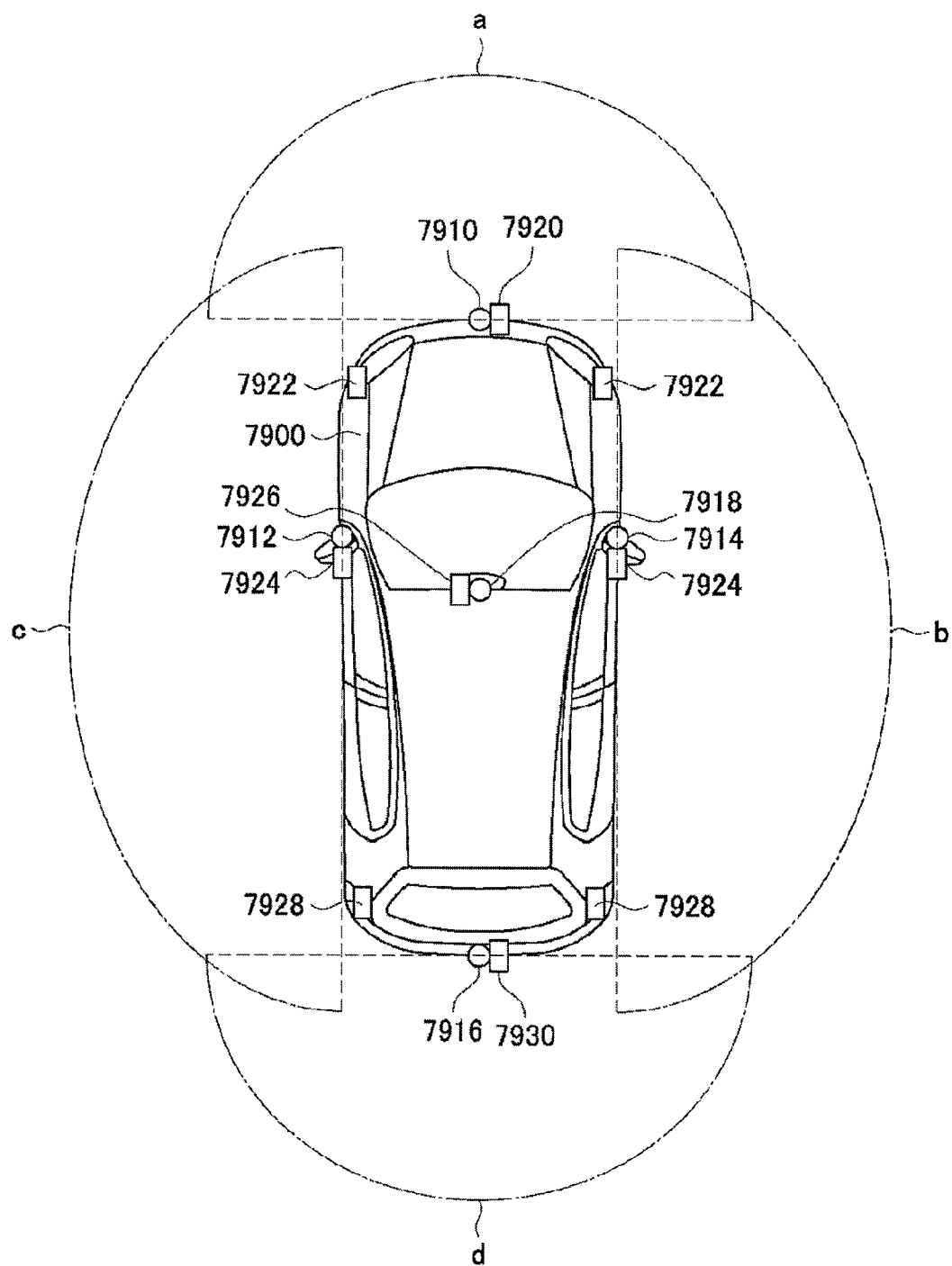

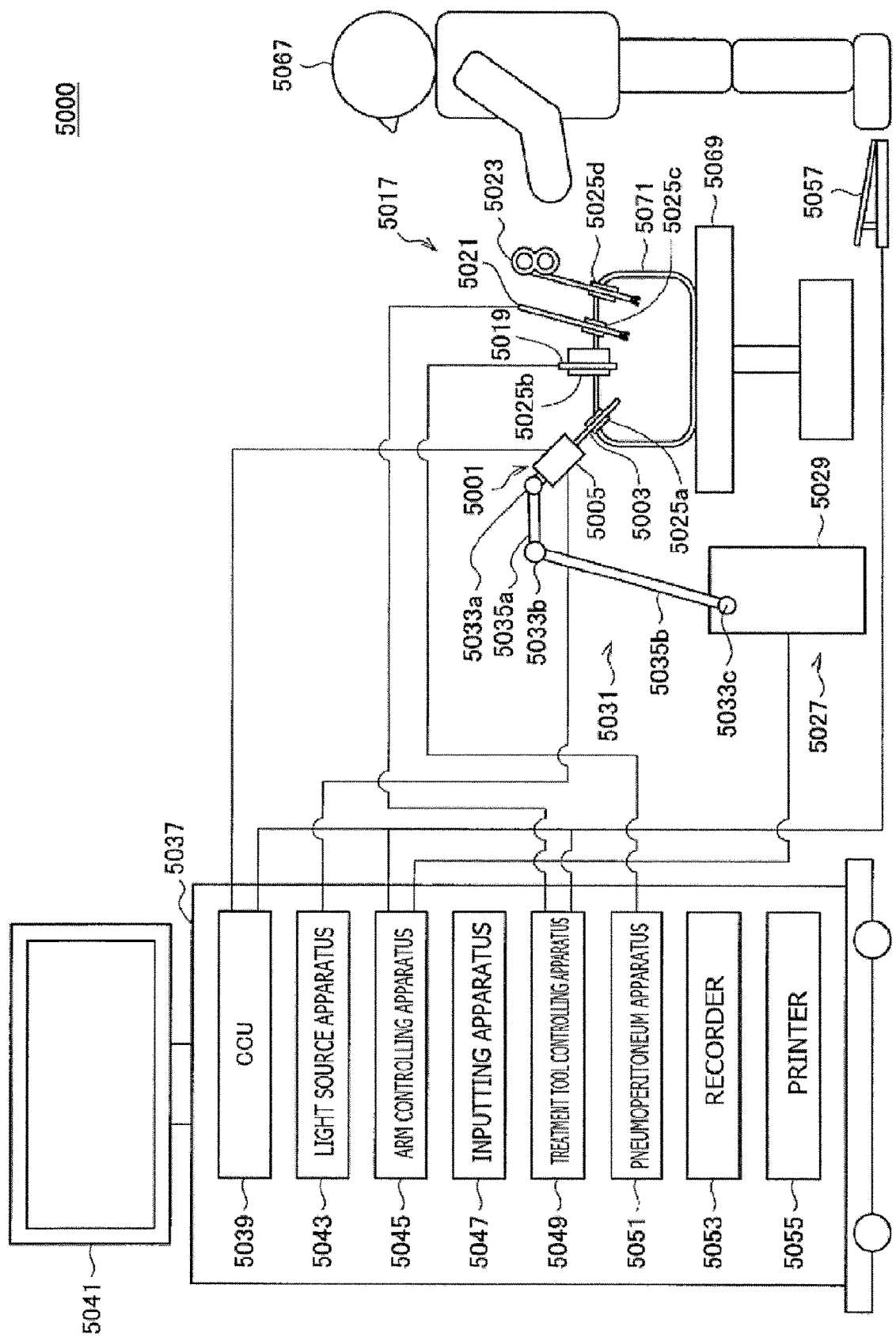

[ FIG. 41 ]
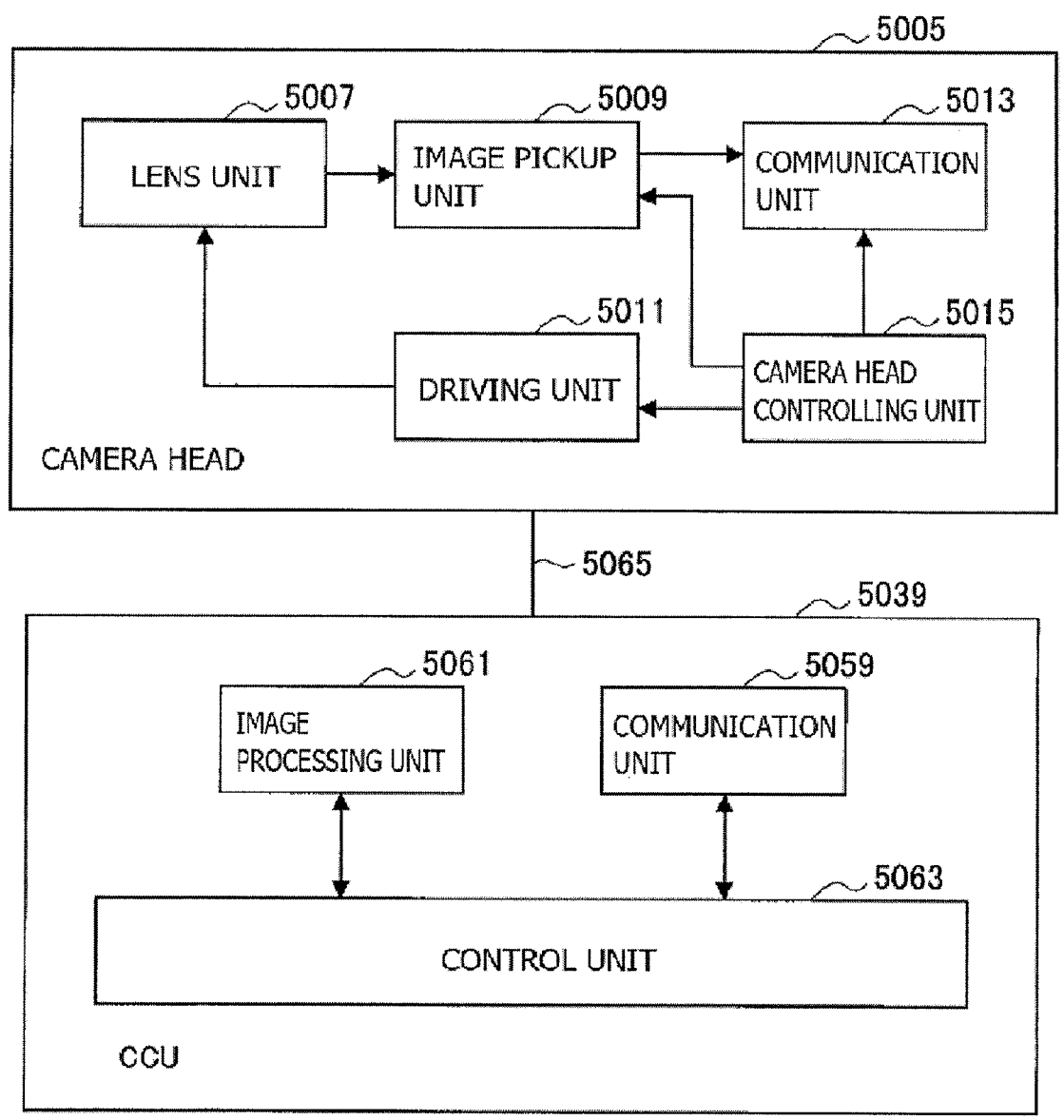

TRANSMITTING DEVICE, TRANSMITTING METHOD, AND COMMUNICATION SYSTEM

TECHNICAL FIELD

The present disclosure relates to a transmitting device that transmits a signal, a transmitting method employed in such a transmitting device, and a communication system including such a transmitting device.

BACKGROUND ART

With high functionalization and multi-functionalization of electronic apparatuses in recent years, electronic apparatuses are equipped with various devices such as a semiconductor chip, a sensor, and a display device. These devices exchange a lot of data between them, and an amount of data has increased with the high functionalization and multi-functionalization of electronic apparatuses. Accordingly, a high-speed interface that is able to transmit and receive data, for example, at several Gbps is often used to perform data exchange.

To improve communication performance of a high-speed interface, various technologies are disclosed. For example, PTLs 1 and 2 disclose a communication system that uses three transmission lines to transmit three differential signals. Furthermore, for example, PTL 3 discloses a communication system that performs pre-emphasis.

CITATION LIST

Patent Literature

PTL 1: Japanese Unexamined Patent Application Publication No. H06-261092
PTL 2: U.S. Pat. No. 8,064,535
PTL 3: Japanese Unexamined Patent Application Publication No. 2011-142382

SUMMARY OF THE INVENTION

Incidentally, reduction of power consumption is generally desired of electronic apparatuses, and reduction of power consumption is expected of communication systems as well.

It is desirable to provide a transmitting device, a transmitting method, and a communication system that make it possible to reduce power consumption.

A first transmitting device according to an embodiment of the present disclosure includes a voltage generator, a first driver, and a controller. The voltage generator generates a predetermined voltage. The first driver includes a first sub-driver and a second sub-driver. The first sub-driver includes a first switch provided on a path from a first power source to a first output terminal, a second switch provided on a path from a second power source to the first output terminal, and a third switch provided on a path from the voltage generator to the first output terminal, and is allowed to set a voltage state of the first output terminal to any of a predetermined number of voltage states which are three or more voltage states. The second sub-driver is allowed to adjust a voltage in each of the voltage states of the first output terminal. The controller controls an operation of the first driver to perform emphasis.

A second transmitting device according to an embodiment of the present disclosure includes a driver unit, a controller, and a voltage generator. The driver unit transmits a data signal with use of a predetermined number of voltage states which are three or more voltage states, and is allowed to set a voltage in each of the voltage states. The controller sets an emphasis voltage in accordance with a transition between the predetermined number of voltage states, thereby causing the driver unit to perform emphasis. The driver unit includes a first switch provided on a path from a first power source to an output terminal, a second switch provided on a path from a second power source to the output terminal, and a third switch provided on a path from the voltage generator to the output terminal.

A transmitting method according to an embodiment of the present disclosure includes: controlling an operation of a first sub-driver including a first switch provided on a path from a first power source to a first output terminal, a second switch provided on a path from a second power source to the first output terminal, and a third switch provided on a path from a voltage generator to the first output terminal, thereby setting a voltage state of the first output terminal to any of a predetermined number of voltage states which are three or more voltage states; and controlling an operation of a second sub-driver, thereby adjusting a voltage in each of the voltage states of the first output terminal to perform emphasis.

A communication system according to an embodiment of the present disclosure includes a transmitting device and a receiving device. The transmitting device includes a voltage generator, a first driver, and a controller. The voltage generator generates a predetermined voltage. The first driver includes a first sub-driver and a second sub-driver. The first sub-driver includes a first switch provided on a path from a first power source to a first output terminal, a second switch provided on a path from a second power source to the first output terminal, and a third switch provided on a path from the voltage generator to the first output terminal, and is allowed to set a voltage state of the first output terminal to any of a predetermined number of voltage states which are three or more voltage states. The second sub-driver is allowed to adjust a voltage in each of the voltage states of the first output terminal. The controller controls an operation of the first driver to perform emphasis.

In the first transmitting device, the transmitting method, and the communication system according to the embodiments of the present disclosure, the voltage state of the first output terminal is set to any of the predetermined number of voltage states, which are three or more voltage states, by the first sub-driver. Furthermore, the voltage in each of the voltage states of the first output terminal is adjusted by the second sub-driver. The first sub-driver and the second sub-driver are controlled to perform emphasis. The first sub-driver is provided with the first switch on the path from the first power source to the first output terminal, the second switch on the path from the second power source to the first output terminal, and the third switch on the path from the voltage generator to the first output terminal.

In the second transmitting device according to the embodiment of the present disclosure, the data signal is transmitted with use of the predetermined number of voltage states which are three or more voltage states. Then, emphasis is performed through setting the emphasis voltage in accordance with a transition between the predetermined number of voltage states. The driver unit is provided with the first switch on the path from the first power source to the first output terminal, the second switch on the path from the second power source to the first output terminal, and the third switch on the path from the voltage generator to the first output terminal.

According to the first and second transmitting devices, the transmitting method, and the communication system of the embodiments of the present disclosure, the first switch is provided on the path from the first power source to the first output terminal; the second switch is provided on the path from the second power source to the first output terminal; and the third switch is provided on the path from the voltage generator to the first output terminal. This makes it possible to reduce power consumption. It is to be noted that the effects described here are not necessarily limited, and any effect described in the present disclosure may be provided.

BRIEF DESCRIPTION OF DRAWINGS

FIG. 1 is a block diagram illustrating a configuration example of a communication system according to an embodiment of the present disclosure.

FIG. 2 is a diagram that describes a voltage state of a signal that the communication system illustrated in FIG. 1 transmits and receives.

FIG. 3 is another diagram that describes the voltage state of the signal that the communication system illustrated in FIG. 1 transmits and receives.

FIG. 4 is a diagram that describes transition of symbols that the communication system illustrated in FIG. 1 transmits and receives.

FIG. 5 is a block diagram illustrating a configuration example of a transmitter illustrated in FIG. 1.

FIG. 6 is a table illustrating an operation example of a transmitting symbol generator illustrated in FIG. 5.

FIG. 7 is a block diagram illustrating a configuration example of an output unit illustrated in FIG. 5.

FIG. 8 is a block diagram illustrating a configuration example of a driver illustrated in FIG. 7.

FIG. 9 is a table illustrating an operation example of an emphasis controller illustrated in FIG. 7.

FIG. 10A is a diagram that describes an operation example of the driver illustrated in FIG. 8.

FIG. 10B is a diagram that describes another operation example of the driver illustrated in FIG. 8.

FIG. 10C is a diagram that describes another operation example of the driver illustrated in FIG. 8.

FIG. 11A is a diagram that describes another operation example of the driver illustrated in FIG. 8.

FIG. 11B is a diagram that describes another operation example of the driver illustrated in FIG. 8.

FIG. 11C is a diagram that describes another operation example of the driver illustrated in FIG. 8.

FIG. 12A is a diagram that describes another operation example of the driver illustrated in FIG. 8.

FIG. 12B is a diagram that describes another operation example of the driver illustrated in FIG. 8.

FIG. 12C is a diagram that describes another operation example of the driver illustrated in FIG. 8.

FIG. 13 is a block diagram illustrating a configuration example of a receiver illustrated in FIG. 1.

FIG. 14 is a diagram that describes an example of a receiving operation of the receiver illustrated in FIG. 13.

FIG. 15 is a waveform diagram illustrating an operation example of the transmitter illustrated in FIG. 7.

FIG. 16 is a schematic diagram illustrating an operation example of the driver illustrated in FIG. 8.

FIG. 17 is a waveform diagram illustrating another operation example of the transmitter illustrated in FIG. 7.

FIG. 18 is a schematic diagram illustrating another operation example of the driver illustrated in FIG. 8.

FIG. 19 is a waveform diagram illustrating another operation example of the transmitter illustrated in FIG. 7.

FIG. 20 is a schematic diagram illustrating an operation example of the driver illustrated in FIG. 8.

FIG. 21A is a timing waveform diagram illustrating an operation example of the communication system illustrated in FIG. 1.

FIG. 21B is a timing waveform diagram illustrating another operation example of the communication system illustrated in FIG. 1.

FIG. 21C is a timing waveform diagram illustrating another operation example of the communication system illustrated in FIG. 1.

FIG. 21D is a timing waveform diagram illustrating another operation example of the communication system illustrated in FIG. 1.

FIG. 21E is a timing waveform diagram illustrating another operation example of the communication system illustrated in FIG. 1.

FIG. 22 is an eye diagram illustrating an example of signals in a case where a de-emphasis operation is performed.

FIG. 23 is an eye diagram illustrating an example of the signals in a case where the de-emphasis operation is not performed.

FIG. 24 is a block diagram illustrating a configuration example of an output unit according to a comparative example.

FIG. 25 is a block diagram illustrating a configuration example of a driver illustrated in FIG. 24.

FIG. 26A is a diagram that describes an operation example of the driver illustrated in FIG. 25.

FIG. 26B is a diagram that describes another operation example of the driver illustrated in FIG. 25.

FIG. 26C is a diagram that describes another operation example of the driver illustrated in FIG. 25.

FIG. 27A is a diagram that describes another operation example of the driver illustrated in FIG. 25.

FIG. 27B is a diagram that describes another operation example of the driver illustrated in FIG. 25.

FIG. 27C is a diagram that describes another operation example of the driver illustrated in FIG. 25.

FIG. 28A is a diagram that describes another operation example of the driver illustrated in FIG. 25.

FIG. 28B is a diagram that describes another operation example of the driver illustrated in FIG. 25.

FIG. 28C is a diagram that describes another operation example of the driver illustrated in FIG. 25.

FIG. 29 is a block diagram illustrating a configuration example of a driver according to a modification example.

FIG. 30 is a block diagram illustrating a configuration example of a driver according to another modification example.

FIG. 31 is a block diagram illustrating a configuration example of a driver according to another modification example.

FIG. 32 is a block diagram illustrating a configuration example of a transmitter according to a modification example.

FIG. 33 is a block diagram illustrating a configuration example of an output unit illustrated in FIG. 32.

FIG. 34 is a diagram that describes a voltage state of a signal that a communication system according to another modification example transmits and receives.

FIG. 35 is a perspective view of an appearance configuration of a smartphone to which the communication system according to the embodiment is applied.

FIG. 36 is a block diagram illustrating a configuration example of an application processor to which the communication system according to the embodiment is applied.

FIG. 37 is a block diagram illustrating a configuration example of an image sensor to which the communication system according to the embodiment is applied.

FIG. 38 is a block diagram depicting an example of schematic configuration of a vehicle control system.

FIG. 39 is a diagram of assistance in explaining an example of installation positions of an outside-vehicle information detecting section and an imaging section.

FIG. 40 is a view depicting an example of a schematic configuration of an endoscopic surgery system.

FIG. 41 is a block diagram depicting an example of a functional configuration of a camera head and a camera control unit (CCU) depicted in FIG. 40.

MODES FOR CARRYING OUT THE INVENTION

In the following, some embodiments of the present disclosure will be described in detail with reference to drawings. It is to be noted that description is made in the following order.

1. Embodiment

2. Application Example

1. Embodiment

Configuration Example

FIG. 1 illustrates a configuration example of a communication system (a communication system 1) according to an embodiment. The communication system 1 performs de-emphasis to improve communication performance.

The communication system 1 includes a transmitting device 10, a transmission line 100, and a receiving device 30. The transmitting device 10 has three output terminals ToutA, ToutB, and ToutC. The transmission line 100 includes lines 110A, 110B, and 110C. The receiving device 30 has three input terminals TinA, TinB, and TinC. The output terminal ToutA of the transmitting device 10 and the input terminal TinA of the receiving device 30 are coupled to each other through the line 110A; the output terminal ToutB of the transmitting device 10 and the input terminal TinB of the receiving device 30 are coupled to each other through the line 110B; the output terminal ToutC of the transmitting device 10 and the input terminal TinC of the receiving device 30 are coupled to each other through the line 110C. Characteristic impedances of the lines 110A to 110C are about 50[Ω] in this example.

The transmitting device 10 outputs signals SIGA, SIGB, and SIGC from the output terminals ToutA, ToutB, and ToutC, respectively. Then, the receiving device 30 receives the signals SIGA, SIGB, and SIGC through the input terminals TinA, TinB, and TinC, respectively. The signals SIGA, SIGB, and SIGC each possibly take three voltage states SH, SM, and SL.

FIG. 2 illustrates the three voltage states SH, SM, and SL. The voltage state SH is a state corresponding to three high-level voltages VH (VH0, VH1, and VH2). Of the high-level voltages VH0, VH1, and VH2, the high-level voltage VH0 is the lowest voltage, and the high-level voltage VH2 is the highest voltage. The voltage state SM is a state corresponding to three medium-level voltages VM (VM0, VM1plus, and VM1minus). Of the medium-level voltages VM0, VM1plus, and VM1minus, the medium-level voltage VM1minus is the lowest voltage, and the medium-level voltage VM1plus is the highest voltage. The voltage state SL is a state corresponding to three low-level voltages VL (VL0, VL1, and VL2). Of the low-level voltages VL0, VL1, and VL2, the low-level voltage VL0 is the highest voltage, and the low-level voltage VL2 is the lowest voltage. The high-level voltage VH2 is a high-level voltage in a case where de-emphasis is not applied; the medium-level voltage VM0 is a medium-level voltage in a case where de-emphasis is not applied; the low-level voltage VL2 is a low-level voltage in a case where de-emphasis is not applied.

FIG. 3 illustrates voltage states of signals SIGA, SIGB, and SIGC. The transmitting device 10 transmits six symbols "+x", "−x", "+y", "−y", "+z", and "−z" with use of three signals SIGA, SIGB, and SIGC. For example, in a case where the symbol "+x" is transmitted, the transmitting device 10 sets the signal SIGA to the voltage state SH, the signal SIGB to the voltage state SL, and the signal SIGC to the voltage state SM. In a case where the symbol "−x" is transmitted, the transmitting device 10 sets the signal SIGA to the voltage state SL, the signal SIGB to the voltage state SH, and the signal SIGC to the voltage state SM. In a case where the symbol "+y" is transmitted, the transmitting device 10 sets the signal SIGA to the voltage state SM, the signal SIGB to the voltage state SH, and the signal SIGC to the voltage state SL. In a case where the symbol "−y" is transmitted, the transmitting device 10 sets the signal SIGA to the voltage state SM, the signal SIGB to the voltage state SL, and the signal SIGC to the voltage state SH. In a case where the symbol "+z" is transmitted, the transmitting device 10 sets the signal SIGA to the voltage state SL, the signal SIGB to the voltage state SM, and the signal SIGC to the voltage state SH. In a case where the symbol "−z" is transmitted, the transmitting device 10 sets the signal SIGA to the voltage state SH, the signal SIGB to the voltage state SM, and the signal SIGC to the voltage state SL.

The transmission line 100 transmits a sequence of symbols with use of such signals SIGA, SIGB, and SIGC. That is, the three lines 110A, 110B, and 110C serve as one lane that transmits a sequence of symbols.

(Transmitting Device 10)

As illustrated in FIG. 1, the transmitting device 10 includes a clock generator 11, a processor 12, and a transmitter 20.

The clock generator 11 generates a clock signal TxCK. A frequency of the clock signal TxCK is, for example, 2.5 [GHz]. It is to be noted that the frequency is not limited thereto, and for example, in a case where a circuit in the transmitting device 10 is configured with use of a so-called half-rate architecture, it is possible to set the frequency of the clock signal TxCK to 1.25 [GHz]. The clock generator 11 includes, for example, a PLL (phase-locked loop), and generates a clock signal TxCK, for example, on the basis of a reference clock (not illustrated) supplied from outside of the transmitting device 10. Then, the clock generator 11 supplies this clock signal TxCK to the processor 12 and the transmitter 20.

The processor 12 performs a predetermined process, thereby generating transition signals TxF0 to TxF6, TxR0 to TxR6, and TxP0 to TxP6. A set of the transition signals TxF0, TxR0, and TxP0 here indicates a symbol transition in a sequence of symbols that the transmitting device 10 transmits. Likewise, a set of the transition signals TxF1, TxR1, and TxP1, a set of the transition signals TxF2, TxR2, and TxP2, a set of the transition signals TxF3, TxR3, and TxP3, a set of the transition signals TxF4, TxR4, and TxP4, a set of the transition signals TxF5, TxR5, and TxP5, and a set of the transition signals TxF6, TxR6, and TxP6 each indicate a symbol transition. That is, the processor 12 generates seven sets of transition signals. Hereinafter, transition signals TxF, TxR, and TxP are used to represent any set of the seven sets of transition signals appropriately.

FIG. 4 illustrates a relationship between transition signals TxF, TxR, and TxP and a symbol transition. Numeral values of three digits assigned to each transition denote respective values of signals TxF, TxR, and TxP in this order.

The transition signal TxF (Flip) causes a symbol transition between "+x" and "−x", a symbol transition between "+y" and "−y", and a symbol transition between "+z" and "−z". Specifically, in a case where the transition signal TxF is "1", a symbol makes a transition so as to change its polarity (for example, from "+x" to "−x"); in a case where the transition signal TxF is "0", a symbol does not make such a transition.

The transition signals TxR(Rotation) and TxP(Polarity) cause a symbol transition between symbols other than between "+x" and "−x", between "+y" and "−y", and between "+z" and "−z" in a case where the transition signal TxF is "0". Specifically, in a case where the transition signals TxR and TxP are "1" and "0", respectively, a symbol makes a transition in a clockwise direction in FIG. 4 while maintaining its polarity (for example, from "+x" to "+y"); in a case where the transition signals TxR and TxP are "1" and "1", respectively, a symbol changes its polarity and makes a transition in the clockwise direction in FIG. 4 (for example, from "+x" to "−y"). Furthermore, in a case where the transition signals TxR and TxP are "0" and "0", respectively, a symbol makes a transition in a counterclockwise direction in FIG. 4 while maintaining its polarity (for example, from "+x" to "+z"); in a case where the transition signals TxR and TxP are "0" and "1", respectively, a symbol changes its polarity and makes a transition in the counterclockwise direction in FIG. 4 (for example, from "+x" to "−z").

The processor 12 generates seven sets of such transition signals TxF, TxR, and TxP. Then, the processor 12 supplies these seven sets of transition signals TxF, TxR, and TxP (transition signals TxF0 to TxF6, TxR0 to TxR6, and TxP0 to TxP6) to the transmitter 20.

The transmitter 20 generates signals SIGA, SIGB, and SIGC on the basis of the transition signals TxF0 to TxF6, TxR0 to TxR6, and TxP0 to TxP6.

FIG. 5 illustrates a configuration example of the transmitter 20. The transmitter 20 includes serializers 21F, 21R, and 21P, a transmitting symbol generator 22, and an output unit 26.

The serializer 21F serializes transition signals TxF0 to TxF6 in this order on the basis of the transition signals TxF0 to TxF6 and a clock signal TxCK, thereby generating a transition signal TxF9. The serializer 21R serializes transition signals TxR0 to TxR6 in this order on the basis of the transition signals TxR0 to TxR6 and the clock signal TxCK, thereby generating a transition signal TxR9. The serializer 21P serializes transition signals TxP0 to TxP6 in this order on the basis of the transition signals TxP0 to TxP6 and the clock signal TxCK, thereby generating a transition signal TxP9.

The transmitting symbol generator 22 generates symbol signals Tx1, Tx2, and Tx3 and symbol signals Dtx1, Dtx2, and Dtx3 on the basis of the transition signals TxF9, TxR9, and TxP9 and the clock signal TxCK. The transmitting symbol generator 22 includes a signal generator 23 and a flip-flop 24.

The signal generator 23 generates symbol signals Tx1, Tx2, and Tx3 related to a current symbol NS on the basis of the transition signals TxF9, TxR9, and TxP9 and the symbol signals Dtx1, Dtx2, and Dtx3. Specifically, on the basis of a symbol (a previous symbol DS) indicated by the symbol signals Dtx1, Dtx2, and Dtx3 and the transition signals TxF9, TxR9, and TxP9, the signal generator 23 finds the current symbol NS as illustrated in FIG. 4, and outputs the current symbol NS as the symbol signals Tx1, Tx2, and Tx3.

The flip-flop 24 samples the symbol signals Tx1, Tx2, and Tx3 on the basis of the clock signal TxCK, and outputs a result of the sampling as the symbol signals Dtx1, Dtx2, and Dtx3.

FIG. 6 illustrates an operation example of the transmitting symbol generator 22. This FIG. 6 illustrates a symbol NS generated on the basis of the symbol DS indicated by the symbol signals Dtx1, Dtx2, and Dtx3 and the transition signals TxF9, TxR9, and TxP9. A case where the symbol DS is "+x" is described as an example. In a case where the transition signals TxF9, TxR9, and TxP9 are "000", the symbol NS is "+z"; in a case where the transition signals TxF9, TxR9, and TxP9 are "001", the symbol NS is "−z"; in a case where the transition signals TxF9, TxR9, and TxP9 are "010", the symbol NS is "+y"; in a case where the transition signals TxF9, TxR9, and TxP9 are "011", the symbol NS is "−y"; in a case where the transition signals TxF9, TxR9, and TxP9 is "1XX", the symbol NS is "−x". Here, "X" indicates that it makes no difference whether X is "1" or "0". The same applies to a case where the symbol DS is any of "−x", "+y", "−y", "+z", and "−z".

The output unit 26 generates the signals SIGA, SIGB, and SIGC on the basis of the symbol signals Tx1, Tx2, and Tx3, the symbol signals Dtx1, Dtx2, and Dtx3, and the clock signal TxCK.

FIG. 7 illustrates a configuration example of the output unit 26. The output unit 26 includes a voltage generator 50, driver controllers 27N and 27D, emphasis controllers 28A, 28B, and 28C, and drivers 29A, 29B, and 29C.

The voltage generator 50 generates a voltage Vdc corresponding to the medium-level voltage VM0. The voltage generator 50 includes a reference voltage generator 51, an operational amplifier 52, and a capacitor 53. The reference voltage generator 51 includes, for example, a bandgap reference circuit, and generates a reference voltage Vref corresponding to the medium-level voltage VM0. A positive input terminal of the operational amplifier 52 is supplied with the reference voltage Vref, and a negative input terminal is coupled to an output terminal. This configuration makes the operational amplifier 52 operate as a voltage follower and output the voltage Vdc corresponding to the medium-level voltage VM0. One end of the capacitor 53 is coupled to the output terminal of the operational amplifier 52, and the other end is grounded.

The driver controller 27N generates signals MAINAN and SUBAN, signals MAINBN and SUBBN, and signals MAINCN and SUBCN on the basis of the symbol signals Tx1, Tx2, and Tx3 related to the current symbol NS and the clock signal TxCK. Specifically, on the basis of the current symbol NS indicated by symbol signals Tx1, Tx2, and Tx3, the driver controller 27N finds respective voltage states of signals SIGA, SIGB, and SIGC as illustrated in FIG. 3. Then, for example, in a case where the signal SIGA is put into the voltage state SH, the driver controller 27N sets the signals MAINAN and SUBAN to "1" and "0", respectively; in a case where the signal SIGA is put into the voltage state SL, the driver controller 27N sets the signals MAINAN and SUBAN to "0" and "1", respectively; and in a case where the signal SIGA is put into the voltage state SM, the driver controller 27N sets the signals MAINAN and SUBAN to both "1" or both "0". The same applies to the signals MAINBN and SUBBN and the signals MAINCN and SUBCN. Then, the driver controller 27N supplies the signals MAINAN and SUBAN to the emphasis controller 28A, the signals MAINBN and SUBBN to the emphasis controller 28B, and the signals MAINCN and SUBCN to the emphasis controller 28C.

The driver controller 27D generates signals MAINAD and SUBAD, signals MAINBD and SUBBD, and signals MAINCD and SUBCD on the basis of the symbol signals Dtx1, Dtx2, and Dtx3 related to the previous symbol DS and the clock signal TxCK. The driver controller 27D has the same circuit configuration as the driver controller 27N. Then, the driver controller 27D supplies the signals MAINAD and SUBAD to the emphasis controller 28A, the signals MAINBD and SUBBD to the emphasis controller 28B, and the signals MAINCD and SUBCD to the emphasis controller 28C.

The emphasis controller 28A generates six signals UPA0, UPA1, MDA0, MDA1, DNA0, and DNA1 on the basis of the signals MAINAN and SUBAN and the signals MAINAD and SUBAD. The driver 29A generates the signal SIGA on the basis of the six signals UPA0, UPA1, MDA0, MDA1, DNA0, and DNA1.

The emphasis controller 28B generates six signals UPB0, UPB1, MDB0, MDB1, DNB0, and DNB1 on the basis of the signals MAINBN and SUBBN and the signals MAINBD and SUBBD. The driver 29B generates the signal SIGB on the basis of the six signals UPB0, UPB1, MDB0, MDB1, DNB0, and DNB1.

The emphasis controller 28C generates six signals UPC0, UPC1, MDC0, MDC1, DNC0, and DNC1 on the basis of the signals MAINCN and SUBCN and the signals MAINCD and SUBCD. The driver 29C generates the signal SIGC on the basis of the six signals UPC0, UPC1, MDC0, MDC1, DNC0, and DNC1.

FIG. 8 illustrates a configuration example of the driver 29A. It is to be noted that the same applies to the drivers 29B and 29C. The driver 29A includes two sub-drivers 290 and 291. The sub-driver 290 includes M circuits U0 (circuits $U0_1$ to $U0_M$), M circuits D0 (circuits $D0_1$ to $D0_M$), and M circuits M0 (circuits $M0_1$ to $M0_M$). The sub-driver 291 includes N circuits U1 (circuits $U1_1$ to $U1_N$), N circuits D1 (circuits $D1_1$ to $D1_N$), and N circuits M1 (circuits $M1_1$ to $M1_N$). In this example, "M" is a number greater than "N". Furthermore, in this example, the number of the circuits U0, the number of the circuits M0, the number of the circuits D0, the number of the circuits U1, the number of the circuits M1, and the number of the circuits D1 are configured to be separately settable.

The circuits $U0_1$ to $U0_M$ and $U1_1$ to $U1_N$ each include a transistor 91 and a resistor 92. In this example, the transistor 91 is an N-channel MOS (Metal Oxide Semiconductor) type FET (Field Effect Transistor). In each of the circuits $U0_1$ to $U0_M$, a gate of the transistor 91 is supplied with the signal UPA0, and a drain is supplied with a voltage V1, and a source is coupled to one end of the resistor 92. In each of the circuits $U1_1$ to $U1_N$, the gate of the transistor 91 is supplied with the signal UPA1, and the drain is supplied with the voltage V1, and the source is coupled to the one end of the resistor 92. In each of the circuits $U0_1$ to $U0_M$ and $U1_1$ to $U1_N$, the one end of the resistor 92 is coupled to the source of the transistor 91, and the other end is coupled to the output terminal ToutA. The sum of an on-state resistance value of the transistor 91 and a resistance value of the resistor 92 is "50×(M+N)"[Ω] in this example.

The circuits $D0_1$ to $D0_M$ and $D1_1$ to $D1_N$ each include a resistor 93 and a transistor 94. In each of the circuits $D0_1$ to $D0_M$ and $D1_1$ to $D1_N$, one end of the resistor 93 is coupled to the output terminal ToutA, and the other end is coupled to a drain of the transistor 94. In this example, the transistor 94 is an N-channel MOS type FET. In each of the circuits $D0_1$ to $D0_M$, a gate of the transistor 94 is supplied with the signal DNA0, and the drain is coupled to the other end of the resistor 93, and a source is grounded. In each of the circuits $D1_1$ to $D1_N$, the gate of the transistor 94 is supplied with the signal DNA1, and the drain is coupled to the other end of the resistor 93, and the source is grounded. The sum of a resistance value of the resistor 93 and an on-state resistance value of the transistor 94 is "50×(M+N)"[Ω] in this example.

The circuits $M0_1$ to $M0_M$ and $M1_1$ to $M1_N$ each include a transistor 95 and a resistor 96. In this example, the transistor 95 is an N-channel MOS type FET. In each of the circuits $M0_1$ to $M0_M$, a gate of the transistor 95 is supplied with the signal MDA0, and a source is supplied with the voltage Vdc generated by the voltage generator 50, and a drain is coupled to one end of the resistor 96. In each of the circuits $M1_1$ to $M1_N$, the gate of the transistor 95 is supplied with the signal MDA1, and the source is supplied with the voltage Vdc generated by the voltage generator 50, and the drain is coupled to one end of the resistor 96. In each of the circuits $M0_1$ to $M0_M$ and $M1_1$ to $M1_N$, one end of the resistor 96 is coupled to the drain of the transistor 95, and the other end is coupled to the output terminal ToutA. The sum of an on-state resistance value of the transistor 95 and a resistance value of the resistor 96 is "50×(M+N)"[Ω] in this example.

FIG. 9 illustrates an operation example of the emphasis controller 28A. FIGS. 10A to 10C schematically illustrate an operation example of the driver 29A in a case where the signal SIGA is put into the voltage state SH. FIGS. 11A to 11C schematically illustrate an operation example of the driver 29A in a case where the signal SIGA is put into the voltage state SM. FIGS. 12A to 12C schematically illustrate an operation example of the driver 29A in a case where the signal SIGA is put into the voltage state SL. In FIGS. 10A to 10C, 11A to 11C, and 12A to 12C, of the circuits $U0_1$ to $U0_M$ and $U1_1$ to $U1_N$, a shaded circuit indicates a circuit in which the transistor 91 is in an on state, and an unshaded circuit indicates a circuit in which the transistor 91 is in an off state. Likewise, of the circuits $D0_1$ to $D0_M$ and $D1_1$ to $D1_N$, a shaded circuit indicates a circuit in which the transistor 94 is in the on state, and an unshaded circuit indicates a circuit in which the transistor 94 is in the off state. Furthermore, of the circuits $M0_1$ to $M0_M$ and $M1_1$ to $M1_N$, a shaded circuit indicates a circuit in which the transistor 95 is in the on state, and an unshaded circuit indicates a circuit in which the transistor 95 is in the off state. It is to be noted that here, the emphasis controller 28A and the driver 29A are described as an example; however, the same applies to the emphasis controller 28B and the driver 29B and to the emphasis controller 28C and the driver 29C.

In a case where the signals MAINAN and SUBAN related to the current symbol NS are "1" and "0", respectively, the emphasis controller 28A sets a voltage of the signal SIGA to any of the three high-level voltages VH0, VH1, and VH2 as illustrated in FIGS. 10A to 10C.

Specifically, for example, as illustrated in FIG. 9, in a case where the signals MAINAD and SUBAD related to the previous symbol DS are "0" and "1", respectively, and the signals MAINAN and SUBAN related to the current symbol NS are "1" and "0", respectively, the emphasis controller 28A sets signals UPA0, UPA1, MDA0, MDA1, DNA0, and DNA1 to "110000". Accordingly, in the driver 29A, as illustrated in FIG. 10A, the transistors 91 in the circuits $U0_1$ to $U0_M$ and $U1_1$ to $U1_N$ go into the on state. As a result, the voltage of the signal SIGA becomes the high-level voltage VH2, and an output terminating resistance (an output impedance) of the driver 29A becomes about 50[Ω].

Furthermore, for example, as illustrated in FIG. 9, in a case where the signals MAINAD and SUBAD related to the previous symbol DS are "0" and "0", respectively, and the signals MAINAN and SUBAN related to the current symbol NS are "1" and "0", respectively, the emphasis controller 28A sets the signals UPA0, UPA1, MDA0, MDA1, DNA0, and DNA1 to "100100". Accordingly, in the driver 29A, as illustrated in FIG. 10B, the transistors 91 in the circuits $U0_1$ to $U0_M$ go into the on state, and the transistors 95 in the circuits $M1_1$ to $M1_N$ go into the on state. As a result, the voltage of the signal SIGA becomes the high-level voltage VH1, and the output terminating resistance (the output impedance) of the driver 29A becomes about 50[Ω]. The same applies to a case where the signals MAINAD and SUBAD related to the previous symbol DS are "1" and "1", respectively, and the signals MAINAN and SUBAN related to the current symbol NS are "1" and "0", respectively.

Moreover, for example, as illustrated in FIG. 9, in a case where the signals MAINAD and SUBAD related to the previous symbol DS are "1" and "0", respectively, and the signals MAINAN and SUBAN related to the current symbol NS are "1" and "0", respectively, the emphasis controller 28A sets the signals UPA0, UPA1, MDA0, MDA1, DNA0, and DNA1 to "100001". Accordingly, in the driver 29A, as illustrated in FIG. 10C, the transistors 91 in the circuits $U0_1$ to $U0_M$ go into the on state, and the transistors 94 in the circuits $D1_1$ to $D1_N$ go into the on state. As a result, the voltage of the signal SIGA becomes the high-level voltage VH0, and the output terminating resistance (the output impedance) of the driver 29A becomes about 50[Ω].

Furthermore, in a case where the signals MAINAN and SUBAN related to the current symbol NS are both "0" or both "1", the emphasis controller 28A sets the voltage of the signal SIGA to any of the three medium-level voltages VM0, VM1plus, and VM1minus as illustrated in FIGS. 11A to 11C.

Specifically, for example, as illustrated in FIG. 9, in a case where the signals MAINAD and SUBAD related to the previous symbol DS are "0" and "1", respectively, and the signals MAINAN and SUBAN related to the current symbol NS are "0" and "0", respectively, the emphasis controller 28A sets the signals UPA0, UPA1, MDA0, MDA1, DNA0, and DNA1 to "011000". Accordingly, in the driver 29A, as illustrated in FIG. 11A, the transistors 95 in the circuits $M0_1$ to $M0_M$ go into the on state, and the transistors 91 in the circuits $U1_1$ to $U1_N$ go into the on state. As a result, the voltage of the signal SIGA becomes the medium-level voltage VM1plus, and the output terminating resistance (the output impedance) of the driver 29A becomes about 50[Ω]. The same applies to a case where the signals MAINAD and SUBAD related to the previous symbol DS are "0" and "1", respectively, and the signals MAINAN and SUBAN related to the current symbol NS are "1" and "1", respectively.

Furthermore, for example, as illustrated in FIG. 9, in a case where the signals MAINAD and SUBAD related to the previous symbol DS are "0" and "0", respectively, and the signals MAINAN and SUBAN related to the current symbol NS are "0" and "0", respectively, the emphasis controller 28A sets the signals UPA0, UPA1, MDA0, MDA1, DNA0, and DNA1 to "001100". Accordingly, in the driver 29A, as illustrated in FIG. 11B, the transistors 95 in the circuits $M0_1$ to $M0_M$ and $M1_1$ to $M1_N$ go into the on state. As a result, the voltage of the signal SIGA becomes the medium-level voltage VM0, and the output terminating resistance (the output impedance) of the driver 29A becomes about 50[Ω]. The same applies to a case where the signals MAINAD and SUBAD related to the previous symbol DS are "1" and "1", respectively, and the signals MAINAN and SUBAN related to the current symbol NS are "0" and "0", respectively. Furthermore, the same applies to a case where the signals MAINAD and SUBAD related to the previous symbol DS are "0" and "0", respectively, and the signals MAINAN and SUBAN related to the current symbol NS are "1" and "1", respectively. Moreover, the same applies to a case where the signals MAINAD and SUBAD related to the previous symbol DS are "1" and "1", respectively, and the signals MAINAN and SUBAN related to the current symbol NS are "1" and "1", respectively.

Moreover, for example, as illustrated in FIG. 9, in a case where the signals MAINAD and SUBAD related to the previous symbol DS are "1" and "0", respectively, and the signals MAINAN and SUBAN related to the current symbol NS are "0" and "0", respectively, the emphasis controller 28A sets the signals UPA0, UPA1, MDA0, MDA1, DNA0, and DNA1 to "001001". Accordingly, in the driver 29A, as illustrated in FIG. 11C, the transistors 95 in the circuits $M0_1$ to $M0_M$ go into the on state, and the transistors 94 in the circuits $D1_1$ to $D1_N$ go into the on state. As a result, the voltage of the signal SIGA becomes the medium-level voltage VM1minus, and the output terminating resistance (the output impedance) of the driver 29A becomes about 50[Ω]. The same applies to a case where the signals MAINAD and SUBAD related to the previous symbol DS are "1" and "0", respectively, and the signals MAINAN and SUBAN related to the current symbol NS are "1" and "1", respectively.

Furthermore, in a case where the signals MAINAN and SUBAN related to the current symbol NS are "0" and "1", respectively, the emphasis controller 28A sets the voltage of the signal SIGA to any of the low-level voltages VL0, VL1, and VL2 as illustrated in FIGS. 12A to 12C.

Specifically, for example, as illustrated in FIG. 9, in a case where the signals MAINAD and SUBAD related to the previous symbol DS are "0" and "1", respectively, and the signals MAINAN and SUBAN related to the current symbol NS are "0" and "1", respectively, the emphasis controller 28A sets the signals UPA0, UPA1, MDA0, MDA1, DNA0, and DNA1 to "010010". Accordingly, in the driver 29A, as illustrated in FIG. 12A, the transistors 94 in the circuits $D0_1$ to $D0_M$ go into the on state, and the transistors 91 in the circuits $U1_1$ to $U1_N$ go into the on state. As a result, the voltage of the signal SIGA becomes the low-level voltage VL0, and the output terminating resistance (the output impedance) of the driver 29A becomes about 50[Ω].

Furthermore, for example, as illustrated in FIG. 9, in a case where the signals MAINAD and SUBAD related to the previous symbol DS are "0" and "0", respectively, and the signals MAINAN and SUBAN related to the current symbol NS are "0" and "1", respectively, the emphasis controller 28A sets the signals UPA0, UPA1, MDA0, MDA1, DNA0, and DNA1 to "000110". Accordingly, in the driver 29A, as illustrated in FIG. 12B, the transistors 94 in the circuits $D0_1$ to $D0_M$ go into the on state, and the transistors 95 in the circuits $M1_1$ to $M1_N$ go into the on state. As a result, the voltage of the signal SIGA becomes the low-level voltage VL1, and the output terminating resistance (the output impedance) of the driver 29A becomes about 50[Ω]. The same applies to a case where the signals MAINAD and SUBAD related to the previous symbol DS are "1" and "1", respectively, and the signals MAINAN and SUBAN related to the current symbol NS are "0" and "1", respectively.

Moreover, for example, as illustrated in FIG. 9, in a case where the signals MAINAD and SUBAD related to the previous symbol DS are "1" and "0", respectively, and the signals MAINAN and SUBAN related to the current symbol NS are "0" and "1", respectively, the emphasis controller 28A sets the signals UPA0, UPA1, MDA0, MDA1, DNA0, and DNA1 to "000011". Accordingly, in the driver 29A, as illustrated in FIG. 12C, the transistors 94 in the circuits $D0_1$ to $D0_M$ and $D1_1$ to $D1_N$ go into the on state. As a result, the voltage of the signal SIGA becomes the low-level voltage VL2, and the output terminating resistance (the output impedance) of the driver 29A becomes about 50[Ω].

In this way, the output unit 26 sets respective voltages at the output terminals ToutA, ToutB, and ToutC on the basis of the current symbol NS and the previous symbol DS. At this time, the transmitting device 10 operates like a so-called two-tap FIR (Finite Impulse Response) filter and performs a de-emphasis operation. This makes it possible for the communication system 1 to enhance communication performance.

(Receiving Device 30)

As illustrated in FIG. 1, the receiving device 30 includes a receiver 40 and a processor 32.

The receiver 40 receives the signals SIGA, SIGB, and SIGC, and generates transition signals RxF, RxR, and RxP and a clock signal RxCK on the basis of these signals SIGA, SIGB, and SIGC.

FIG. 13 illustrates a configuration example of the receiver 40. The receiver 40 includes resistors 41A, 41B, and 41C, switches 42A, 42B, and 42C, amplifiers 43A, 43B, and 43C, a clock generator 44, flip-flops 45 and 46, and a signal generator 47.

The resistors 41A, 41B, and 41C serve as a terminating resistor of the communication system 1, and a resistance value thereof is about 50[Ω] in this example. One end of the resistor 41A is coupled to the input terminal TinA and also to a positive input terminal of the amplifier 43A and a negative input terminal of the amplifier 43C, and the other end is coupled to one end of the switch 42A. One end of the resistor 41B is coupled to the input terminal TinB and also to a positive input terminal of the amplifier 43B and a negative input terminal of the amplifier 43A, and the other end is coupled to one end of the switch 42B. One end of the resistor 41C is coupled to the input terminal TinC and also to a positive input terminal of the amplifier 43C and a negative input terminal of the amplifier 43B, and the other end is coupled to one end of the switch 42C.

The one end of the switch 42A is coupled to the other end of the resistor 41A, and the other end is coupled to the other ends of the switches 42B and 42C. The one end of the switch 42B is coupled to the other end of the resistor 41B, and the other end is coupled to the other ends of the switches 42A and 42C. The one end of the switch 42C is coupled to the other end of the resistor 41C, and the other end is coupled to the other ends of the switches 42A and 42B. In the receiving device 30, the switches 42A, 42B, and 42C are set into the on state, and the resistors 41A to 41C serve as a terminating resistor.

The positive input terminal of the amplifier 43A is coupled to the negative input terminal of the amplifier 43C and the one end of the resistor 41A and also to the input terminal TinA, and the negative input terminal is coupled to the positive input terminal of the amplifier 43B and the one end of the resistor 41B and also to the input terminal TinB. The positive input terminal of the amplifier 43B is coupled to the negative input terminal of the amplifier 43A and the one end of the resistor 41B and also to the input terminal TinB, and the negative input terminal is coupled to the positive input terminal of the amplifier 43C and the one end of the resistor 41C and also to the input terminal TinC. The positive input terminal of the amplifier 43C is coupled to the negative input terminal of the amplifier 43B and the one end of the resistor 41C and also to the input terminal TinC, and the negative input terminal is coupled to the positive input terminal of the amplifier 43A and the one end of the resistor 41A and also to the input terminal TinA.

This configuration makes the amplifier 43A output a signal corresponding to a difference AB (SIGA−SIGB) between the signal SIGA and the signal SIGB, and makes the amplifier 43B output a signal corresponding to a difference BC (SIGB−SIGC) between the signal SIGB and the signal SIGC, and makes the amplifier 43C output a signal corresponding to a difference CA (SIGC−SIGA) between the signal SIGC and the signal SIGA.

FIG. 14 illustrates an operation example of the amplifiers 43A, 43B, and 43C in a case where the receiver 40 receives the symbol "+x". It is to be noted that the switches 42A, 42B, and 42C are in the on state, and are not therefore illustrated. In this example, a voltage state of the signal SIGA is the voltage state SH; a voltage state of the signal SIGB is the voltage state SL; a voltage state of the signal SIGC is the voltage state SM. In this case, a current Iin flows to the input terminal TinA, the resistor 41A, the resistor 41B, and the input terminal TinB in this order. Then, the positive input terminal of the amplifier 43A is supplied with a voltage corresponding to the voltage state SH, and the negative input terminal is supplied with a voltage corresponding to the voltage state SL, and the difference AB becomes positive (AB>0); therefore, the amplifier 43A outputs "1". Furthermore, the positive input terminal of the amplifier 43B is supplied with a voltage corresponding to the voltage state SL, and the negative input terminal is supplied with a voltage corresponding to the voltage state SM, and the difference BC becomes negative (BC<0); therefore, the amplifier 43B outputs "0". Moreover, the positive input terminal of the amplifier 43C is supplied with a voltage corresponding to the voltage state SM, and the negative input terminal is supplied with a voltage corresponding to the voltage state SH, and the difference CA becomes negative (CA<0); therefore, the amplifier 43C outputs "0".

The clock generator 44 generates the clock signal RxCK on the basis of output signals of the amplifiers 43A, 43B, and 43C.

The flip-flop 45 outputs respective output signals of the amplifiers 43A, 43B, and 43C with a delay of one clock of the clock signal RxCK. The flip-flop 46 outputs three output signals of the flip-flop 45 with a delay of one clock of the clock signal RxCK.

The signal generator 47 generates the transition signals RxF, RxR, and RxP on the basis of the output signals of the flip-flops 45 and 46 and the clock signal RxCK. These transition signals RxF, RxR, and RxP correspond to the transition signals TxF9, TxR9, and TxP9 (FIG. 5) in the transmitting device 10, respectively, and indicate a symbol transition. The signal generator 47 identifies a symbol transition (FIG. 4) on the basis of a symbol indicated by output signals of the flip-flop 45 and a symbol indicated by the output signals of the flip-flop 46, and generates the transition signals RxF, RxR, and RxP.

The processor 32 (FIG. 1) performs a predetermined process on the basis of transition signals RxF, RxR, and RxP and the clock signal RxCK.

The drivers 29A, 29B, and 29C here correspond to specific examples of a "first driver", a "second driver", and a "third driver" in the present disclosure, respectively. The drivers 29A, 29B, and 29C correspond to a specific example of a "driver unit" in the present disclosure. The sub-driver 290 corresponds to a specific example of a "first sub-driver" in the present disclosure. The sub-driver 291 corresponds to a specific example of a "second sub-driver" in the present disclosure. The transistor 91 in the sub-driver 290 corresponds to a specific example of a "first switch" in the present disclosure; the transistor 94 in the sub-driver 290 corresponds to a specific example of a "second switch" in the present disclosure; and the transistor 95 in the sub-driver 290 corresponds to a specific example of a "third switch" in the present disclosure. The transistor 91 in the sub-driver 291 corresponds to a specific example of a "fourth switch" in the present disclosure; the transistor 94 in the sub-driver 291 corresponds to a specific example of a "fifth switch" in the present disclosure; and the transistor 95 in the sub-driver 291 corresponds to a specific example of a "sixth switch" in the present disclosure. The emphasis controllers 28A to 28C correspond to a specific example of a "controller" in the present disclosure. The transmitting symbol generator 22 corresponds to a specific example of a "signal generator" in the present disclosure. The voltage V1 supplied to the drain of the transistor 91 corresponds to a specific example of one of a "first power source" and a "second power source" in the present disclosure. The ground voltage supplied to the source of the transistor 94 corresponds to a specific example of the other one of the "first power source" and the "second power source" in the present disclosure.

[Operation and Working]

Subsequently, operation and working of the communication system 1 of the present embodiment are described.

(Outline of Overall Operation)

First, an outline of an overall operation of the communication system 1 is described with reference to FIGS. 1, 5, and 7. The clock generator 11 of the transmitting device 10 generates the clock signal TxCK. The processor 12 performs a predetermined process, thereby generating the transition signals TxF0 to TxF6, TxR0 to TxR6, and TxP0 to TxP6. In the transmitter 20 (FIG. 5), the serializer 21F generates the transition signal TxF9 on the basis of the transition signals TxF0 to TxF6 and the clock signal TxCK; the serializer 21R generates the transition signal TxR9 on the basis of the transition signals TxR0 to TxR6 and the clock signal TxCK; and the serializer 21P generates the transition signal TxP9 on the basis of the transition signals TxP0 to TxP6 and the clock signal TxCK. The transmitting symbol generator 22 generates the symbol signals Tx1, Tx2, and Tx3 related to the current symbol NS and the symbol signals Dtx1, Dtx2, and Dtx3 related to the previous symbol DS on the basis of the transition signals TxF9, TxR9, and TxP9 and the clock signal TxCK.

In the output unit 26 (FIG. 7), the voltage generator 50 generates the voltage Vdc having a voltage corresponding to the medium-level voltage VM0. The driver controller 27N generates the signals MAINAN, SUBAN, MAINBN, SUBBN, MAINCN, and SUBCN on the basis of the symbol signals Tx1, Tx2, and Tx3 related to the current symbol NS and the clock signal TxCK. The driver controller 27D generates the signals MAINAD, SUBAD, MAINBD, SUBBD, MAINCD, and SUBCD on the basis of the symbol signals Dtx1, Dtx2, and Dtx3 related to the previous symbol DS and the clock signal TxCK. The emphasis controller 28A generates the signals UPA0, UPA1, MDA0, MDA1, DNA0, and DNA1 on the basis of the signals MAINAN, SUBAN, MAINAD, and SUBAD. The emphasis controller 28B generates the signals UPB0, UPB1, MDB0, MDB1, DNB0, and DNB1 on the basis of the signals MAINBN, SUBBN, MAINBD and SUBBD. The emphasis controller 28B generates the signals UPC0, UPC1, MDC0, MDC1, DNC0, and DNC1 on the basis of the signals MAINCN, SUBCN, MAINCD, and SUBCD. The driver 29A generates the signal SIGA on the basis of the signals UPA0, UPA1, MDA0, MDA1, DNA0, and DNA1. The driver 29B generates the signal SIGB on the basis of the signals UPB0, UPB1, MDB0, MDB1, DNB0, and DNB1. The driver 29C generates the signal SIGC on the basis of the signals UPC0, UPC1, MDC0, MDC1, DNC0, and DNC1.

In the receiving device 30 (FIG. 1), the receiver 40 receives the signals SIGA, SIGB, and SIGC, and generates the transition signals RxF, RxR, and RxP and the clock signal RxCK on the basis of the signals SIGA, SIGB, and SIGC. The processor 32 performs a predetermined process on the basis of the transition signals RxF, RxR, and RxP and the clock signal RxCK.

(Detailed Operation)

Subsequently, an operation of the transmitting device 10 is described in detail. The output unit 26 of the transmitting device 10 sets respective voltages at the output terminals ToutA, ToutB, and ToutC on the basis of the current symbol NS and the previous symbol DS.

FIGS. 15 and 16 illustrate the operation in a case where the voltage state of the signal SIGA makes a transition from the voltage state SH to another voltage state. FIG. 15 illustrates a change in voltage of the signal SIGA. FIG. 16 illustrates a transition of an operating state of the driver 29A. It is to be noted that the same applies to the signals SIGB and SIGC. In FIG. 15, 1 UI (Unit Interval) denotes a period to transmit one symbol. Furthermore, ΔV denotes a difference between the high-level voltage VH0 and the medium-level voltage VM0 and also a difference between the medium-level voltage VM0 and the low-level voltage VL0. The high-level voltage VH0, the medium-level voltage VM0, and the low-level voltage VL0 are reference voltages in a de-emphasis operation.

In a case where the voltage state of the signal SIGA makes a transition from the voltage state SH to the voltage state SM, the voltage of the signal SIGA changes from any of the three high-level voltages VH (VH0, VH1, and VH2) to the medium-level voltage VM1minus as illustrated in FIG. 15. Specifically, in this case, the voltage state of the previous symbol DS is the voltage state SH, thus the signals MAINAD and SUBAD are "1" and "0", respectively, and the voltage state of the current symbol NS is the voltage state SM, thus the signals MAINAN and SUBAN are, for example, "0" and "0", respectively. Therefore, as illustrated in FIG. 9, the emphasis controller 28A sets the signals UPA0, UPA1, MDA0, MDA1, DNA0, and DNA1 to "001001". Accordingly, in the driver 29A, as illustrated in FIG. 16, the transistors 95 in the circuits $M0_1$ to $M0_M$ go into on state, and the transistors 94 in the circuits $D1_1$ to $D1_N$ go into the on state. As a result, the voltage of the signal SIGA becomes the medium-level voltage VM1minus.

In this way, in a case where the voltage state of the signal SIGA makes a transition from the voltage state SH to the voltage state SM, the voltage of the signal SIGA is set to the medium-level voltage VM1minus. That is, in this case, a transition amount of the signal SIGA is about (−ΔV) as illustrated in FIG. 15, and therefore, the emphasis controller 28A sets a post-transition voltage of the signal SIGA to the medium-level voltage VM1minus that is one step lower than the medium-level voltage VM0 serving as a reference.

Furthermore, in a case where the voltage state of the signal SIGA makes a transition from the voltage state SH to the voltage state SL, the voltage of the signal SIGA changes from any of the three high-level voltages VH (VH0, VH1, and VH2) to the low-level voltage VL2 as illustrated in FIG. 15. Specifically, in this case, the voltage state of the previous symbol DS is the voltage state SH, thus the signals MAINAD and SUBAD are "1" and "0", respectively, and the voltage state of the current symbol NS is the voltage state SL, thus the signals MAINAN and SUBAN are "0" and "1", respectively. Therefore, as illustrated in FIG. 9, the emphasis controller 28A sets the signals UPA0, UPA1, MDA0, MDA1, DNA0, and DNA1 to "000011". Accordingly, in the driver 29A, as illustrated in FIG. 16, the transistors 94 in the circuits $D0_1$ to $D0_M$ and $D1_1$ to $D1_N$ go into the on state. As a result, the voltage of the signal SIGA becomes the low-level voltage VL2.

In this way, in a case where the voltage state of the signal SIGA makes a transition from the voltage state SH to the voltage state SL, the voltage of the signal SIGA is set to the low-level voltage VL2. That is, in this case, the transition amount of the signal SIGA is about $(-2\Delta V)$ as illustrated in FIG. 15, and therefore, the emphasis controller 28A sets the post-transition voltage of the signal SIGA to the low-level voltage VL2 that is two step lower than the low-level voltage VL0 serving as a reference.

It is to be noted that in a case where the voltage state of the signal SIGA is maintained in the voltage state SH, the voltage of the signal SIGA changes from any of the three high-level voltages VH (VH0, VH1, and VH2) to the high-level voltage VH0 as illustrated in FIG. 15. Specifically, in this case, the voltage state of the previous symbol DS is the voltage state SH, thus the signals MAINAD and SUBAD are "1" and "0", respectively, and the voltage state of the current symbol NS is the voltage state SH, thus the signals MAINAN and SUBAN are "1" and "0", respectively. Therefore, as illustrated in FIG. 9, the emphasis controller 28A sets the signals UPA0, UPA1, MDA0, MDA1, DNA0, and DNA1 to "100001". Accordingly, in the driver 29A, as illustrated in FIG. 16, the transistors 91 in the circuits $U0_1$ to $U0_M$ go into on state, and the transistors 94 in the circuits $D1_1$ to $D1_N$ go into the on state. As a result, the voltage of the signal SIGA becomes the high-level voltage VH0. In this way, in the transmitting device 10, in a case where the voltage state of the signal SIGA is maintained in the voltage state SH over multiple unit intervals, the voltage of the signal SIGA is set to the high-level voltage VH0 in the second and subsequent unit intervals. That is, this high-level voltage VH0 is a de-emphasized voltage.

FIGS. 17 and 18 illustrate an operation in a case where the voltage state of the signal SIGA makes a transition from the voltage state SM to another voltage state. FIG. 17 illustrates a change in voltage of the signal SIGA. FIG. 18 illustrates a transition of the operating state of the driver 29A.

In a case where the voltage state of the signal SIGA makes a transition from the voltage state SM to the voltage state SH, the voltage of the signal SIGA changes from any of the three medium-level voltages VM (VM0, VM1plus, and VM1minus) to the high-level voltage VH1 as illustrated in FIG. 17. Specifically, in this case, the voltage state of the previous symbol DS is the voltage state SM, thus the signals MAINAD and SUBAD are, for example, "0" and "0", respectively, and the voltage state of the current symbol NS is the voltage state SH, thus the signals MAINAN and SUBAN are "1" and "0", respectively. Therefore, as illustrated in FIG. 9, the emphasis controller 28A sets the signals UPA0, UPA1, MDA0, MDA1, DNA0, and DNA1 to "100100". Accordingly, in the driver 29A, as illustrated in FIG. 18, the transistors 91 in the circuits $U0_1$ to $U0_M$ go into the on state, and the transistors 95 in the circuits $M1_1$ to $M1_N$ go into the on state. As a result, the voltage of the signal SIGA becomes the high-level voltage VH1.

In this way, in a case where the voltage state of the signal SIGA makes a transition from the voltage state SM to the voltage state SH, the voltage of the signal SIGA is set to the high-level voltage VH1. That is, in this case, the transition amount of the signal SIGA is about $(+\Delta V)$ as illustrated in FIG. 17, and therefore, the emphasis controller 28A sets the post-transition voltage of the signal SIGA to the high-level voltage VH1 that is one step higher than the high-level voltage VH0 serving as a reference.

Furthermore, in a case where the voltage state of the signal SIGA makes a transition from the voltage state SM to the voltage state SL, the voltage of the signal SIGA changes from any of the three medium-level voltages VM (VM0, VM1plus, and VM1minus) to the low-level voltage VL1 as illustrated in FIG. 17. Specifically, in this case, the voltage state of the previous symbol DS is the voltage state SM, thus the signals MAINAD and SUBAD are, for example, "0" and "0", respectively, and the voltage state of the current symbol NS is the voltage state SL, thus the signals MAINAN and SUBAN are "0" and "1", respectively. Therefore, as illustrated in FIG. 9, the emphasis controller 28A sets the signals UPA0, UPA1, MDA0, MDA1, DNA0, and DNA1 to "000110". Accordingly, in the driver 29A, as illustrated in FIG. 18, the transistors 94 in the circuits $D0_1$ to $D0_M$ go into the on state, and the transistors 95 in the circuits $M1_1$ to $M1_N$ go into the on state. As a result, the voltage of the signal SIGA becomes the low-level voltage VL1.

In this way, in a case where the voltage state of the signal SIGA makes a transition from the voltage state SM to the voltage state SL, the voltage of the signal SIGA is set to the low-level voltage VL1. That is, in this case, the transition amount of the signal SIGA is about $(-\Delta V)$ as illustrated in FIG. 17, and therefore, the emphasis controller 28A sets the post-transition voltage of the signal SIGA to the low-level voltage VL1 that is one step lower than the low-level voltage VL0 serving as a reference.

It is to be noted that in a case where the voltage state of the signal SIGA is maintained in the voltage state SM, the voltage of the signal SIGA changes from any of the three medium-level voltages VM (VM0, VM1plus, and VM1minus) to the medium-level voltage VM0 as illustrated in FIG. 17. Specifically, in this case, the voltage state of the previous symbol DS is the voltage state SM, thus the signals MAINAD and SUBAD are, for example, "0" and "0", respectively, and the voltage state of the current symbol NS is the voltage state SM, thus the signals MAINAN and SUBAN are, for example, "0" and "0", respectively. Therefore, as illustrated in FIG. 9, the emphasis controller 28A sets the signals UPA0, UPA1, MDA0, MDA1, DNA0, and DNA1 to "001100". Accordingly, in the driver 29A, as illustrated in FIG. 18, the transistors 95 in the circuits $M0_1$ to $M0_M$ and $M1_1$ to $M1_N$ go into the on state. As a result, the voltage of the signal SIGA becomes the medium-level voltage VM0. In this way, in the transmitting device 10, in a case where the voltage state of the signal SIGA is maintained in the voltage state SM over multiple unit intervals, the voltage of the signal SIGA is set to the medium-level voltage VM0 in the second and subsequent unit intervals. That is, this medium-level voltage VM0 is a de-emphasized voltage.

FIGS. 19 and 20 illustrate an operation in a case where the voltage state of the signal SIGA makes a transition from the voltage state SL to another voltage state. FIG. 19 illustrates a change in voltage of the signal SIGA. FIG. 20 illustrates a transition of the operating state of the driver 29A.

In a case where the voltage state of the signal SIGA makes a transition from the voltage state SL to the voltage state SM, the voltage of the signal SIGA changes from any of the three low-level voltages VL (VL0, VL1, and VL2) to the medium-level voltage VM1plus as illustrated in FIG. 19. Specifically, in this case, the voltage state of the previous symbol DS is the voltage state SL, thus the signals MAINAD and SUBAD are "0" and "1", respectively, and the voltage state of the current symbol NS is the voltage state SM, thus the signals MAINAN and SUBAN are, for example, "0" and "0", respectively. Therefore, as illustrated in FIG. 9, the emphasis controller 28A sets the signals UPA0, UPA1, MDA0, MDA1, DNA0, and DNA1 to "011000". Accordingly, in the driver 29A, as illustrated in FIG. 20, the transistors 95 in the circuits $M0_1$ to $M0_M$ go into the on state, and the transistors 91 in the circuits $U1_1$ to $U1_N$ go into the on state. As a result, the voltage of the signal SIGA becomes the medium-level voltage VM1plus.

In this way, in a case where the voltage state of the signal SIGA makes a transition from the voltage state SL to the voltage state SM, the voltage of the signal SIGA is set to the medium-level voltage VM1plus. That is, in this case, the transition amount of the signal SIGA is about (+ΔV) as illustrated in FIG. 19, and therefore, the emphasis controller 28A sets the post-transition voltage of the signal SIGA to the medium-level voltage VM1plus that is one step higher than the reference medium-level voltage VM0.

Furthermore, in a case where the voltage state of the signal SIGA makes a transition from the voltage state SL to the voltage state SH, the voltage of the signal SIGA changes from any of the three low-level voltages VL (VL0, VL1, and VL2) to the high-level voltage VH2 as illustrated in FIG. 19. Specifically, in this case, the voltage state of the previous symbol DS is the voltage state SL, thus the signals MAINAD and SUBAD are "0" and "1", respectively, and the voltage state of the current symbol NS is the voltage state SH, thus the signals MAINAN and SUBAN are "1" and "0", respectively. Therefore, as illustrated in FIG. 9, the emphasis controller 28A sets the signals UPA0, UPA1, MDA0, MDA1, DNA0, and DNA1 to "110000". Accordingly, in the driver 29A, as illustrated in FIG. 20, the transistors 91 in the circuits $U0_1$ to $U0_M$ and $U1_1$ to $U1_N$ go into the on state. As a result, the voltage of the signal SIGA becomes the high-level voltage VH2.

In this way, in a case where the voltage state of the signal SIGA makes a transition from the voltage state SL to the voltage state SH, the voltage of the signal SIGA is set to the high-level voltage VH2. That is, in this case, the transition amount of the signal SIGA is about (+2ΔV) as illustrated in FIG. 19, and therefore, the emphasis controller 28A sets the post-transition voltage of the signal SIGA to the high-level voltage VH2 that is two steps higher than the high-level voltage VH0 serving as a reference.

It is to be noted that in a case where the voltage state of the signal SIGA is maintained in the voltage state SL, the voltage of the signal SIGA changes from any of the three low-level voltages VL (VL0, VL1, and VL2) to the low-level voltage VL0 as illustrated in FIG. 19. Specifically, in this case, the voltage state of the previous symbol DS is the voltage state SL, thus the signals MAINAD and SUBAD are "0" and "1", respectively, and the voltage state of the current symbol NS is the voltage state SL, thus the signals MAINAN and SUBAN are "0" and "1", respectively. Therefore, as illustrated in FIG. 9, the emphasis controller 28A sets the signals UPA0, UPA1, MDA0, MDA1, DNA0, and DNA1 to "010010". Accordingly, in the driver 29A, as illustrated in FIG. 20, the transistors 94 in the circuits $D0_1$ to $D0_M$ go into the on state, and the transistors 91 in the circuits $U1_1$ to $U1_N$ go into the on state. As a result, the voltage of the signal SIGA becomes the low-level voltage VL0. In this way, in the transmitting device 10, in a case where the voltage state of the signal SIGA is maintained in the voltage state SL over multiple unit intervals, the voltage of the signal SIGA is set to the low-level voltage VL0 in the second and subsequent unit intervals. That is, this low-level voltage VL0 is a de-emphasized voltage.

In this way, with respect to each of the signals SIGA, SIGB, and SIGC, the transmitting device 10 sets the post-transition voltage in accordance with a voltage transition amount associated with a transition of the voltage state. Specifically, in a case where the voltage state makes a transition to a state one step higher, the transmitting device 10 sets the post-transition voltage to a voltage one step higher than a reference voltage (for example, the medium-level voltage VM0 or the high-level voltage VH0). That is, in this case, the transmitting device 10 sets an emphasis voltage that is one step more positive. Furthermore, in a case where the voltage state makes a transition to a state two steps higher, the transmitting device 10 sets the post-transition voltage to a voltage two steps higher than the reference voltage (for example, the high-level voltage VH0). That is, in this case, the transmitting device 10 sets an emphasis voltage that is two steps more positive. Moreover, in a case where the voltage state makes a transition to a state one step lower, the transmitting device 10 sets the post-transition voltage to a voltage one step lower than the reference voltage (for example, the medium-level voltage VM0 or the low-level voltage VL0). That is, in this case, the transmitting device 10 sets an emphasis voltage that is one step more negative. Furthermore, in a case where the voltage state makes a transition to a state two steps lower, the transmitting device 10 sets the post-transition voltage to a voltage two steps lower than the reference voltage (for example, the low-level voltage VL0). That is, in this case, the transmitting device 10 sets an emphasis voltage that is two steps more negative. In this way, with respect to each of signals SIGA, SIGB, and SIGC, the transmitting device 10 sets an emphasis voltage in accordance with the voltage transition amount so as to be proportional to the transition amount.

FIGS. 21A to 21E illustrate an operation example of the communication system 1 in a case where the symbol "+x" makes a transition to a symbol other than "+x". FIG. 21A illustrates a case of a symbol transition from "+x" to "−x"; FIG. 21B illustrates a case of a symbol transition from "+x" to "+y"; FIG. 21C illustrates a case of a symbol transition from "+x" to "−y"; FIG. 21D illustrates a case of a symbol transition from "+x" to "+z"; FIG. 21E illustrates a case of a symbol transition from "+x" to "−z". In each of FIGS. 21A to 21E, (A) illustrates respective waveforms of signals SIGA, SIGB, and SIGC at the output terminals ToutA, ToutB, and ToutC of the transmitting device 10, and (B) illustrates respective waveforms of differences AB, BC, and CA in the receiving device 30. Furthermore, a solid line indicates a waveform in a case where a de-emphasis operation has been performed, and a broken line indicates a waveform in a case where a de-emphasis operation is not performed. Moreover, the voltage of the signal SIGA before the transition is any of the three high-level voltages VH (VH0, VH1, and VH2); however, for convenience of illustration, the voltage of the signal SIGA is the high-level voltage VH0 in these figures. Likewise, a voltage of the signal SIGB before the transition is the low-level voltage VL0, and a voltage of the signal SIGC before the transition is the medium-level voltage VM0.

In a case of a symbol transition from "+x" to "−x", as illustrated in (A) of FIG. 21A, the signal SIGA changes from the high-level voltage VH0 to the low-level voltage VL2; the signal SIGB changes from the low-level voltage VL0 to the high-level voltage VH2; and the signal SIGC is maintained in the medium-level voltage VM0. That is, a transition amount of the signal SIGA is about (−2ΔV); therefore, the transmitting device 10 sets the voltage of the signal SIGA to the low-level voltage VL2 that is two steps lower than the low-level voltage VL0 serving as a reference. Furthermore, a transition amount of the signal SIGB is about (+2ΔV); therefore, the transmitting device 10 sets the voltage of the signal SIGB to the high-level voltage VH2 that is two steps higher than the high-level voltage VH0 serving as a reference. At this time, as illustrated in (B) of FIG. 21A, a transition amount of the difference AB (SIGA−SIGB) is about (−4ΔV); therefore, the difference AB after the transition becomes four steps lower than that in a case where a de-emphasis operation is not performed. Furthermore, a transition amount of the difference BC (SIGB−SIGC) is about (+2ΔV); therefore, the difference BC after the transition becomes two steps higher than that in a case where a de-emphasis operation is not performed. Moreover, a transition amount of the difference CA (SIGC−SIGA) is about (+2ΔV); therefore, the difference CA after the transition becomes two steps higher than that in a case where a de-emphasis operation is not performed.

In a case of a symbol transition from "+x" to "+y", as illustrated in (A) of FIG. 21B, the signal SIGA changes from the high-level voltage VH0 to the medium-level voltage VM1minus; the signal SIGB changes from the low-level voltage VL0 to the high-level voltage VH2; and the signal SIGC changes from the medium-level voltage VM0 to the low-level voltage VL1. That is, the transition amount of the signal SIGA is about (−ΔV); therefore, the transmitting device 10 sets the voltage of the signal SIGA to the medium-level voltage VM1minus that is one step lower than the medium-level voltage VM0 serving as a reference. Furthermore, the transition amount of the signal SIGB is about (+2ΔV); therefore, the transmitting device 10 sets the voltage of the signal SIGB to the high-level voltage VH2 that is two steps higher than the high-level voltage VH0 serving as a reference. Moreover, the transition amount of the signal SIGC is about (−ΔV); therefore, the transmitting device 10 sets the voltage of the signal SIGC to the low-level voltage VL1 that is one step lower than the low-level voltage VL0 serving as a reference. At this time, as illustrated in (B) of FIG. 21B, the transition amount of the difference AB (SIGA−SIGB) is about (−3ΔV); therefore, the difference AB after the transition becomes three steps lower than that in a case where a de-emphasis operation is not performed. Furthermore, the transition amount of the difference BC (SIGB−SIGC) is about (+3ΔV); therefore, the difference BC after the transition becomes three steps higher than that in a case where a de-emphasis operation is not performed.

In a case of a symbol transition from "+x" to "−y", as illustrated in (A) of FIG. 21C, the signal SIGA changes from the high-level voltage VH0 to the medium-level voltage VM1minus; the signal SIGB is maintained in the low-level voltage VL0; the signal SIGC changes from the medium-level voltage VM0 to the high-level voltage VH1. That is, the transition amount of the signal SIGA is about (−ΔV); therefore, the transmitting device 10 sets the voltage of the signal SIGA to the medium-level voltage VM1minus that is one step lower than the medium-level voltage VM0 serving as a reference. Furthermore, the transition amount of the signal SIGC is about (+ΔV); therefore, the transmitting device 10 sets the voltage of the signal SIGC to the high-level voltage VH1 that is one step higher than the high-level voltage VH0 serving as a reference. At this time, as illustrated in (B) of FIG. 21C, the transition amount of the difference AB (SIGA−SIGB) is about (−ΔV); therefore, the difference AB after the transition becomes one step lower than that in a case where a de-emphasis operation is not performed. Furthermore, the transition amount of the difference BC (SIGB−SIGC) is about (−ΔV); therefore, the difference BC after the transition becomes one step lower than that in a case where a de-emphasis operation is not performed. Moreover, the transition amount of the difference CA (SIGC−SIGA) is about (+2ΔV); therefore, the difference CA after the transition becomes two steps higher than that in a case where a de-emphasis operation is not performed.

In a case of a symbol transition from "+x" to "+z", as illustrated in (A) of FIG. 21D, the signal SIGA changes from the high-level voltage VH0 to the low-level voltage VL2; the signal SIGB changes from the low-level voltage VL0 to the medium-level voltage VM1plus; and the signal SIGC changes from the medium-level voltage VM0 to the high-level voltage VH1. That is, the transition amount of the signal SIGA is about (−2ΔV); therefore, the transmitting device 10 sets the voltage of the signal SIGA to the low-level voltage VL2 that is two steps lower than the low-level voltage VL0 serving as a reference. Furthermore, the transition amount of the signal SIGB is about (+ΔV); therefore, the transmitting device 10 sets the voltage of the signal SIGB to the medium-level voltage VM1plus that is one step higher than the medium-level voltage VM0 serving as a reference. Moreover, the transition amount of the signal SIGC is about (+ΔV); therefore, the transmitting device 10 sets the voltage of the signal SIGC to the high-level voltage VH1 that is one step higher than the high-level voltage VH0 serving as a reference. At this time, as illustrated in (B) of FIG. 21D, the transition amount of the difference AB (SIGA−SIGB) is about (−3ΔV); therefore, the difference AB after the transition becomes three steps lower than that in a case where a de-emphasis operation is not performed. Furthermore, a transition amount of the difference CA (SIGC−SIGA) is about (+3ΔV); therefore, the difference CA after the transition becomes three steps higher than that in a case where a de-emphasis operation is not performed.

In a case of a symbol transition from "+x" to "−z", as illustrated in (A) of FIG. 21E, the signal SIGA is maintained in the high-level voltage VH0; the signal SIGB changes from the low-level voltage VL0 to the medium-level voltage VM1plus; and the signal SIGC changes from the medium-level voltage VM0 to the low-level voltage VL1. That is, the transition amount of the signal SIGB is about (+ΔV); therefore, the transmitting device 10 sets the voltage of the signal SIGB to the medium-level voltage VM1plus that is one step higher than the medium-level voltage VM0 serving as a reference. Furthermore, the transition amount of the signal SIGC is about (−ΔV); therefore, the transmitting device 10 sets the voltage of the signal SIGC to the low-level voltage VL1 that is one step lower than the low-level voltage VL0 serving as a reference. At this time, as illustrated in (B)

of FIG. 21E, the transition amount of the difference AB (SIGA−SIGB) is about (−ΔV); therefore, the difference AB after the transition becomes one step lower than that in a case where a de-emphasis operation is not performed. Furthermore, the transition amount of the difference BC (SIGB−SIGC) is about (+2ΔV); therefore, the difference BC after the transition becomes two steps higher than that in a case where a de-emphasis operation is not performed. Moreover, the transition amount of the difference CA (SIGC−SIGA) is about (−ΔV); therefore, the difference CA after the transition becomes one step lower than that in a case where a de-emphasis operation is not performed.

In this way, in the communication system 1, with respect to each of signals SIGA, SIGB, and SIGC, an emphasis voltage is set in accordance with the voltage transition amount. That is, the transmitting device 10 performs a de-emphasis operation on each of the signals SIGA, SIGB, and SIGC (single-ended signals). As a result, the communication system 1 makes it possible to enhance waveform quality of each of the signals SIGA, SIGB, and SIGC; therefore, it is possible to enhance communication performance.

Furthermore, in the communication system 1, the emphasis voltage is set with respect to each of the signals SIGA, SIGB, and SIGC in this way; therefore, also with respect to each of differences AB, BC, and CA that are differential signals, an emphasis voltage is set in accordance with the voltage transition amount. As a result, the communication system 1 makes it possible to enhance waveform quality of each of the differences AB, BC, and CA as well; therefore, it is possible to enhance communication performance.

FIG. 22 illustrates an eye diagram of the difference AB between the signals SIGA and SIGB, the difference BC between the signals SIGB and SIGC, and the difference CA between the signals SIGC and SIGA in a case where a de-emphasis operation has been performed. FIG. 23 illustrates an eye diagram of the differences AB, BC, and CA in a case where the de-emphasis operation is not performed. In the communication system 1, even in a case where the transmission line 100 is long, as illustrated in FIGS. 22 and 23, an eye opening is able to be extended through performing a de-emphasis operation, and as a result, it is possible to enhance communication performance.

Furthermore, in the communication system 1, for example, the driver 29A is provided with the circuits M0$_1$ to M0$_M$ and M1$_1$ to M1$_M$, and, for example, in a case where the voltage state of the output terminal ToutA is set to the voltage state SM, the transistors 95 in the circuits M0$_1$ to M0$_M$ are put into the on state (FIGS. 11A to 11C). Then, in a case where the voltage at the output terminal ToutA is set to the medium-level voltage VM1plus (FIG. 11A), the transistors 91 in the circuits U1$_1$ to U1$_N$ are put into the on state; in a case where the voltage at the output terminal ToutA is set to the medium-level voltage VM0 (FIG. 11B), the transistors 95 in the circuits M1$_1$ to M1$_M$ are put into the on state; and in a case where the voltage at the output terminal ToutA is set to the medium-level voltage VM1minus (FIG. 11C), the transistors 94 in the circuits D1$_1$ to D1$_M$ are put into the on state. Accordingly, it is possible to reduce power consumption as compared with a comparative example described below.

Comparative Example

Subsequently, workings of the present embodiment is described in comparison with a comparative example. A communication system 1R according to the comparative example includes a transmitting device 10R. The transmitting device 10R includes a transmitter 20R. This transmitter 20R includes an output unit 26R, as with the transmitter 20 (FIG. 5) according to the present embodiment.

FIG. 24 illustrates a configuration example of the output unit 26R. The output unit 26R includes emphasis controllers 28RA, 28RB, and 28RC and drivers 29RA, 29RB, and 29RC. The emphasis controller 28RA generates eight signals UPAA0, UPAB0, UPAA1, UPAB1, DNAA0, DNAB0, DNAA1, and DNAB1 on the basis of signals MAINAN and SUBAN and signals MAINAD and SUBAD. The driver 29RA generates a signal SIGA on the basis of the eight signals UPAA0, UPAB0, UPAA1, UPAB1, DNAA0, DNAB0, DNAA1, and DNAB1. The same applies to the emphasis controller 28RB and the driver 29RB and to the emphasis controller 28RC and the driver 29RC.

FIG. 25 illustrates a configuration example of the driver 29RA. The same applies to the drivers 29RB and 29RC. The driver 29RA includes K circuits UA0 (circuits UA0$_1$ to UA0$_K$), L circuits UB0 (circuits UB0$_1$ to UB0$_L$), K circuits UA1 (circuits UA1$_1$ to UA1$_K$), L circuits UB1 (circuits UB1$_1$ to UB1$_L$), K circuits DA0 (circuits DA0$_1$ to DA0$_K$), L circuits DB0 (circuits DB0$_1$ to DB0$_L$), K circuits DA1 (circuits DA1$_1$ to DA1$_K$), and L circuits DB1 (circuits DB1$_1$ to DB1$_L$). In this example, "K" is a number greater than "L".

The circuits UA0$_1$ to UA0$_K$, UB0$_1$ to UB0$_L$, UA1$_1$ to UA1$_K$, and UB1$_1$ to UB1$_L$ each include the transistor 91 and the resistor 92, as with the circuits U0$_1$ to U0$_M$ and U1$_1$ to U1$_N$ according to the present embodiment. The gates of the transistors 91 in the circuits UA0$_1$ to UA0$_K$ are supplied with the signal UPAA0; the gates of the transistors 91 in the circuits UB0$_1$ to UB0$_L$ are supplied with the signal UPAB0; the gates of the transistors 91 in the circuits UA1$_1$ to UA1$_K$ are supplied with the signal UPAA1; and the gates of the transistors 91 in the circuits UB1$_1$ to UB1$_L$ are supplied with the signal UPAB1. The sum of an on-state resistance value of the transistor 91 and a resistance value of the resistor 92 is "50×(2×K+2×L)"[Ω] in this example.

The circuits DA0$_1$ to DA0$_K$, DB0$_1$ to DB0$_L$, DA1$_1$ to DA1$_K$, and DB1$_1$ to DB1$_L$ each include the resistor 93 and the transistor 94, as with the circuits D0$_1$ to D0$_M$ and D1$_1$ to D1$_N$ according to the present embodiment. The gates of the transistors 94 in the circuits DA0$_1$ to DA0$_K$ are supplied with the signal DNAA0; the gates of the transistors 94 in the circuits DB0$_1$ to DB0$_L$ are supplied with the signal DNAB0; the gates of the transistors 94 in the circuits DA1$_1$ to DA1$_K$ are supplied with the signal DNAA1; and the gates of the transistors 94 in the circuits DB1$_1$ to DB1$_L$ are supplied with a signal DNAB1. The sum of a resistance value of the resistor 93 and an on-state resistance value of the transistor 94 is "50×(2×K+2×L)"[Ω] in this example.

FIGS. 26A to 26C illustrate an operation example of the driver 29RA in a case where the signal SIGA is set to the voltage state SH. FIGS. 27A to 27C illustrate an operation example of the driver 29RA in a case where the signal SIGA is set to the voltage state SM. FIGS. 28A to 28C illustrate an operation example of the driver 29RA in a case where a signal SIGA is set to the voltage state SL.

In this example, in a case where the signal SIGA is set to the high-level voltage VH2, as illustrated in FIG. 26A, the transistors 91 in the circuits UA0$_1$ to UA0$_K$, UB0$_1$ to UB0$_L$, UA1$_1$ to UA1$_K$, and UB1$_1$ to UB1$_L$ are put into the on state. Furthermore, in a case where the signal SIGA is set to the high-level voltage VH1, as illustrated in FIG. 26B, the transistors 91 in the circuits UA0$_1$ to UA0$_K$, UA1$_1$ to UA1$_K$, and UB1$_1$ to UB1$_L$ are put into the on state, and the transistors 94 in the circuits DB1$_1$ to DB1$_L$ are put into the on state. Moreover, in a case where the signal SIGA is set to the high-level voltage VH0, as illustrated in FIG. 26C, the transistors 91 in the circuits $UA0_1$ to $UA0_K$ and $UA1_1$ to $UA1_K$ are put into the on state, and the transistors 94 in the circuits $DB0_1$ to $DB0_L$ and $DB1_1$ to $DB1_L$ are put into the on state.

In a case where the signal SIGA is set to the medium-level voltage VM1plus, as illustrated in FIG. 27A, the transistors 91 in the circuits $UA0_1$ to $UA0_K$, $UB0_1$ to $UB0_L$, and $UB1_1$ to $UB1_L$ are put into the on state, and the transistors 94 in the circuits $DA0_1$ to $DA0_K$ are put into the on state. Furthermore, in a case where the signal SIGA is set to the medium-level voltage VM0, as illustrated in FIG. 27B, the transistors 91 in the circuits $UA0_1$ to $UA0_K$ and $UB0_1$ to $UB0_L$ are put into the on state, and the transistors 94 in the circuits $DA0_1$ to $DA0_K$ and $DB0_1$ to $DB0_L$ are put into the on state. Moreover, in a case where the signal SIGA is set to the medium-level voltage VM1minus, as illustrated in FIG. 27C, the transistors 91 in the circuits $UA0_1$ to $UA0_K$ are put into the on state, and the transistors 94 in the circuits $DA0_1$ to $DA0_K$, $DB0_1$ to $DB0_L$, and $DB1_1$ to $DB1_L$ are put into the on state.

In a case where the signal SIGA is set to the low-level voltage VL0, as illustrated in FIG. 28A, the transistors 91 in the circuits $UB0_1$ to $UB0_L$ and $UB1_1$ to $UB1_L$ are put into the on state, and the transistors 94 in the circuits $DA0_1$ to $DA0_K$ and $DA1_1$ to $DA1_K$ are put into the on state. Furthermore, in a case where the signal SIGA is set to the low-level voltage VL1, as illustrated in FIG. 28B, the transistors 91 in the circuits $UB0_1$ to $UB0_L$ are put into the on state, and the transistors 94 in the circuits $DA0_1$ to $DA0_K$, $DB0_1$ to $DB0_L$, and $DA1_1$ to $DA1_K$ are put into the on state. Moreover, in a case where the signal SIGA is set to the low-level voltage VL2, as illustrated in FIG. 28C, the transistors 94 in the circuits $DA0_1$ to $DA0_K$, $DB0_1$ to $DB0_L$, $DA1_1$ to $DA1_K$, and $DB1_1$ to $DB1_L$ are put into the on state.

In this way, in the communication system 1R according to the comparative example, for example, in a case where the voltage at the output terminal ToutA is set to the medium-level voltage VM0 (FIG. 27B), the transistors 91 in the circuits $UA0_1$ to $UA0_K$ and $UB0_1$ to $UB0_L$ are put into the on state, and the transistors 94 in the circuits $DA0_1$ to $DA0_K$ and $DB0_1$ to $DB0_L$ are put into the on state. In this way, the driver 29A sets the voltage at the output terminal ToutA with Thevenin termination. This Thevenin termination allows a large amount of current caused by a potential difference between the voltage V1 and the ground voltage to flow. A series resistance value of the Thevenin termination is about 100[Ω]. The same applies to a case where the voltage at the output terminal ToutA is set to the medium-level voltages VM1plus and VM1minus (FIGS. 27A and 27C). Therefore, in the communication system 1R, a large amount of current flows by the Thevenin termination, and as a result, power consumption is increased.

In contrast, in the communication system 1 according to the embodiment, for example, in a case where the voltage at the output terminal ToutA is set to the medium-level voltage VM0 (FIG. 11B), the transistors 95 in the circuits $M0_1$ to $M0_M$ and $M1_1$ to $M1_M$ are put into the on state. That is, the voltage at the output terminal ToutA is set with use of the voltage Vdc generated by the voltage generator 50, instead of setting the voltage at the output terminal ToutA with Thevenin termination. Furthermore, for example, in a case where the voltage at the output terminal ToutA is set to the medium-level voltage VM1plus (FIG. 11A), the transistors 95 in the circuits $M0_1$ to $M0_M$ are put into the on state, and the transistors 91 in the circuits $U1_1$ to $U1_M$ are put into the on state. In this case, current flows from the circuits $U1_1$ to $U1_M$ to the circuits $M0_1$ to $M0_M$. However, this current is smaller than the current in the case of the comparative example (FIG. 27A). That is, firstly, this current flows by a potential difference between the voltage V1 and the voltage Vdc, unlike in the case of the comparative example. That is, this potential difference is about a half of that in the case of the comparative example. Then, secondly, the impedance of the circuits $U1_1$ to $U1_m$ is sufficiently greater than that of the circuits $M0_1$ to $M0_M$, and a series resistance value is therefore sufficiently greater than 100[Ω]. As a result, this current becomes smaller than that in the case of the comparative example (FIG. 27A). The same applies to a case where the voltage at the output terminal ToutA is set to the medium-level voltage VM1minus (FIG. 11C). Consequently, the communication system 1 makes it possible to reduce power consumption.

[Effects]

As described above, in the present embodiment, the sub-driver 290 is provided with the circuits $M0_1$ to $M0_M$, and, for example, in a case where the voltage state of the output terminal ToutA is set to the voltage state SM, the transistors 95 in the circuits $M0_1$ to $M0_M$ are put into the on state. This makes it possible to reduce power consumption.

In the present embodiment, the sub-driver 291 adjusts the voltage in each voltage state to set an emphasis voltage, which makes it possible to enhance communication performance.

In the present embodiment, with respect to each of the signals SIGA, SIGB, and SIGC, an emphasis voltage is set in accordance with the voltage transition amount, which makes it possible to enhance waveform quality of each of the signals SIGA, SIGB, and SIGC and therefore to enhance communication performance.

Modification Example 1

In the above-described embodiment, the drivers 29A, 29B, and 29C are configured as illustrated in FIG. 8; however, the drivers 29A, 29B, and 29C are not limited thereto. This modification example are described below with reference to some examples.

FIG. 29 illustrates a configuration example of a driver 39A according to the present modification example. This driver 39A corresponds to the driver 29A according to the above-described embodiment. The driver 39 includes two sub-drivers 390 and 391. The sub-drivers 390 and 391 are a modification of the sub-drivers 290 and 291 (FIG. 8) according to the above-described embodiment, and adopt a modified form of coupling of the transistor 91 and the resistor 92. In each of the circuits $U0_1$ to $U0_M$ and $U1_1$ to $U1_N$, one end of the resistor 92 is supplied with the voltage V1, and the other end is coupled to the drain of the transistor 91. In each of the circuits $U0_1$ to $U0_M$, the gate of the transistor 91 is supplied with the signal UPA0, and the drain is coupled to the other end of the resistor 92, and the source is coupled to the output terminal ToutA. In each of the circuits $U1_1$ to $U1_N$, the gate of the transistor 91 is supplied with the signal UPA1, and the drain is coupled to the other end of the resistor 92, and the source is coupled to the output terminal ToutA.

FIG. 30 illustrates a configuration example of another driver 49A according to the present modification example. This driver 49A corresponds to the driver 29A according to the above-described embodiment. The driver 49A includes two sub-drivers 490 and 491. The sub-driver 490 includes M circuits C0 (circuits $C0_1$ to $C0_M$). The sub-driver 491 includes N circuits C1 (circuits $C1_1$ to $C1_N$). The circuits $C0_1$ to $C0_M$ and $C1_1$ to $C1_N$ each include resistors 92 and 97 and the transistors 91, 94, and 95.

First, the circuits $C0_1$ to $C0_M$ are described. In each of the circuits $C0_1$ to $C0_M$, one end of the resistor 92 is supplied with the voltage V1, and the other end is coupled to the drain of the transistor 91. The gate of the transistor 91 is supplied with the signal UPA0, and the drain is coupled to the other end of the resistor 92, and the source is coupled to one end of the resistor 97 and the output terminal ToutA. The one end of the resistor 97 is coupled to the source of the transistor 91 and the output terminal ToutA, and the other end is coupled to the drains of the transistors 94 and 95. The gate of the transistor 94 is supplied with the signal DNA0, and the drain is coupled to the other end of the resistor 97 and the drain of the transistor 95, and the source is grounded. The gate of the transistor 95 is supplied with the signal MDA0, and the source is supplied with the voltage Vdc generated by the voltage generator 50, and the drain is coupled to the other end of the resistor 97 and the drain of the transistor 94.

Next, the circuits $C1_1$ to $C1_N$ are described. In each of the circuits $C1_1$ to $C1_N$, the gate of the transistor 91 is supplied with the signal UPA1. The gate of the transistor 94 is supplied with the signal DNA1. The gate of the transistor 95 is supplied with the signal MDA1. Except for these, the circuits $C1_1$ to $C1_N$ are similar to the circuits $C0_1$ to $C0_M$.

In this driver 49A, the resistor 97 corresponds to the resistors 93 and 96 in the driver 29A (FIG. 8) according to the above-described embodiment. That is, for example, in the sub-driver 490, in a case where the transistor 94 goes into the on state, a resistance value of the resistor 97 and an on-resistance of the transistor 94 constitute an output impedance of the sub-driver 490, and in a case where the transistor 95 goes into the on state, the resistance value of the resistor 97 and an on-resistance of the transistor 95 constitute an output impedance of the sub-driver 490. The same applies to the sub-driver 491. Configuring the driver 49A in this way makes it possible to reduce the number of elements, and as a result, it is possible to reduce a circuit area.

FIG. 31 illustrates a configuration example of another driver 59A according to the present modification example. This driver 59A corresponds to the driver 29A according to the above-described embodiment. The driver 59A includes two sub-drivers 590 and 591. The sub-driver 590 includes M circuits CC0 (circuits $CC0_1$ to $CC0_M$). The sub-driver 491 includes N circuits CC1 (circuits $CC1_1$ to $CC1_N$). The circuits $CC0_1$ to $CC0_M$ and $CC1_1$ to $CC1_N$ each include the transistors 91, 94, and 95 and a resistor 98.

First, the circuits $CC0_1$ to $CC0_M$ are described. In each of the circuits $CC0_1$ to $CC0_M$, the gate of the transistor 91 is supplied with the signal UPA0, and the drain is supplied with the voltage V1, and the source is coupled to the drains of the transistors 94 and 95 and one end of the resistor 98. The gate of the transistor 94 is supplied with the signal DNA0, and the drain is coupled to the source of the transistor 91, the drain of the transistor 95, and the one end of the resistor 98, and the source is grounded. The gate of the transistor 95 is supplied with the signal MDA0, and the source is supplied with the voltage Vdc generated by the voltage generator 50, and the drain is coupled to the source of the transistor 91, the drain of the transistor 94, and the one end of the resistor 98. The one end of the resistor 98 is coupled to the source of the transistor 91 and the drains of the transistors 94 and 95, and the other end is coupled to the output terminal ToutA.

Next, the circuits $CC1_1$ to $CC1_N$ are described. In each of the circuits $CC1_1$ to $CC1_N$, the gate of the transistor 91 is supplied with the signal UPA1. The gate of the transistor 94 is supplied with the signal DNA1. The gate of the transistor 95 is supplied with the signal MDA1. Except for these, the circuits $CC1_1$ to $CC1_N$ are similar to the circuits $CC0_1$ to $CC0_M$.

In this driver 59A, the resistor 98 corresponds to the resistors 92, 93, and 96 in the driver 29A (FIG. 8) according to the above-described embodiment. That is, for example, in the sub-driver 590, in a case where the transistor 91 goes into the on state, a resistance value of the resistor 98 and an on-resistance of the transistor 91 constitute an output impedance of the sub-driver 590; in a case where the transistor 94 goes into the on state, the resistance value of the resistor 98 and an on-resistance of the transistor 94 constitute an output impedance of the sub-driver 590; and in a case where the transistor 95 goes into the on state, the resistance value of the resistor 98 and an on-resistance of the transistor 95 constitute an output impedance of the sub-driver 590. The same applies to the sub-driver 591. Configuring the driver 59A in this way makes it possible to reduce the number of elements, and as a result, it is possible to reduce an circuit area.

Modification Example 2

In the above-described embodiment, the output unit 26 generates the signals SIGA, SIGB, and SIGC on the basis of the symbol signals Tx1, Tx2, and Tx3, the symbol signals Dtx1, Dtx2, and Dtx3, and the clock signal TxCK; however, the output unit 26 is not limited thereto. A transmitting device 10A according to the present modification example is described in detail below.

FIG. 32 illustrates a configuration example of a transmitter 20A of the transmitting device 10A. The transmitter 20A includes a transmitting symbol generator 22A and an output unit 26A. The transmitting symbol generator 22A generates the symbol signals Tx1, Tx2, and Tx3 on the basis of the transition signals TxF9, TxR9, and TxP9 and the clock signal TxCK. The output unit 26A generates the signals SIGA, SIGB, and SIGC on the basis of the symbol signals Tx1, Tx2, and Tx3 and the clock signal TxCK.

FIG. 33 illustrates a configuration example of the output unit 26A. The output unit 26A includes the driver controller 27N and flip-flops 17A, 17B and 17C. The driver controller 27N generates the signals MAINAN, SUBAN, MAINBN, SUBBN, MAINCN, and SUBCN on the basis of the symbol signals Tx1, Tx2, and Tx3 related to the current symbol NS and the clock signal TxCK. The flip-flop 17A delays the signals MAINAN and SUBAN by one clock of the clock signal TxCK, and outputs the delayed signals as signals MAINAD and SUBAD. The flip-flop 17B delays the signals MAINBN and SUBBN by one clock of the clock signal TxCK, and outputs the delayed signals as signal MAINBD and SUBBD. The flip-flop 17C delays the signals MAINCN and SUBCN by one clock of the clock signal TxCK, and outputs the delayed signals as signal MAINCD and SUBCD.

This configuration also makes it possible to achieve similar effects to the case of the above-described embodiment.

Modification Example 3

In the above-described embodiment, the transmitting device 10 performs a de-emphasis operation; however, the transmitting device 10 is not limited thereto, and may perform a pre-emphasis operation. FIG. 34 illustrates three voltage states SH, SM, and SL. The voltage state SH is a state corresponding to three high-level voltages VH (VH0, VH1, and VH2); the voltage state SM is a state corresponding to three medium-level voltages VM (VM0, VM1plus, and VM1minus); and the voltage state SL is a state corresponding to three low-level voltages VL (VL0, VL1, and VL2). The high-level voltage VH0 is a high-level voltage in a case where pre-emphasis is not applied; the medium-level voltage VM0 is a medium-level voltage in a case where pre-emphasis is not applied; and the low-level voltage VL0 is a low-level voltage in a case where pre-emphasis is not applied. This configuration also makes it possible to achieve similar effects to the case of the above-described embodiment.

Other Modification Example

Furthermore, two or more of these modification examples may be combined.

2. Application Example

Subsequently, an application example and practical application examples of the communication system described in the above-described embodiment and modification examples are described.

Application Example

FIG. 35 illustrates an appearance of a smartphone 300 (a multi-function mobile phone) to which the communication system according to any of the above-described embodiment, etc. is applied. This smartphone 300 is equipped with various devices. The communication system according to any of the foregoing embodiments, etc. is applied to a communication system that exchanges data between these devices.

FIG. 36 illustrates a configuration example of an application processor 310 used in the smartphone 300. The application processor 310 includes a CPU (Central Processing Unit) 311, a memory controller 312, a power source controller 313, an external interface 314, a GPU (Graphics Processing Unit) 315, a media processor 316, a display controller 317, and a MIPI (Mobile Industry Processor Interface) interface 318. In this example, the CPU 311, the memory controller 312, the power source controller 313, the external interface 314, the GPU 315, the media processor 316, and the display controller 317 are coupled to a system bus 319 to allow for mutual data exchange through the system bus 319.

The CPU 311 processes various information handled by the smartphone 300 in accordance with a program. The memory controller 312 controls a memory 501 that the CPU 311 uses in a case where the CPU 311 performs information processing. The power source controller 313 controls a power source of the smartphone 300.

The external interface 314 is an interface for communication with an external device, and, in this example, is coupled to a wireless communication section 502 and an image sensor 410. The wireless communication section 502 performs wireless communication with mobile phone base stations, and includes, for example, a baseband unit, RF (Radio Frequency) front-end unit, etc. The image sensor 410 acquires an image, and includes, for example, a CMOS sensor.

The GPU 315 performs image processing. The media processor 316 processes information such as voice, text, graphics, etc. The display controller 317 controls a display 504 through the MIPI interface 318. The MIPI interface 318 transmits an image signal to the display 504. For example, a YUV or RGB signal or the like may be used as the image signal. The MIPI interface 318 operates on the basis of a reference clock supplied from an oscillation circuit 330 including, for example, a crystal resonator. For example, the communication system according to any of the above-described embodiment, etc. is applied to a communication system between the MIPI interface 318 and the display 504.

FIG. 37 illustrates a configuration example of the image sensor 410. The image sensor 410 includes a sensor section 411, an ISP (Image Signal Processor) 412, a JPEG (Joint Photographic Experts Group) encoder 413, a CPU 414, a RAM (Random Access Memory) 415, a ROM (Read-Only Memory) 416, a power source controller 417, an I$^2$C (Inter-Integrated Circuit) interface 418, and a MIPI interface 419. In this example, these blocks are coupled to a system bus 420 to allow for mutual data exchange through the system bus 420.

The sensor section 411 acquires an image, and includes, for example, a CMOS sensor. The ISP 412 performs a predetermined process on the image acquired by the sensor section 411. The JPEG encoder 413 generates a JPEG image through encoding the image processed by the ISP 412. The CPU 414 controls the respective blocks of the image sensor 410 in accordance with a program. The RAM 415 is a memory that the CPU 414 uses in a case where the CPU 414 performs information processing. The ROM 416 stores the program executed by the CPU 414, a setting value obtained through calibration, etc. The power source controller 417 controls a power source of the image sensor 410. The I$^2$C interface 418 receives a control signal from the application processor 310. Furthermore, although not illustrated, the image sensor 410 receives a clock signal as well as the control signal from the application processor 310. Specifically, the image sensor 410 is configured to be able to operate on the basis of clock signals of various frequencies. The MIPI interface 419 transmits an image signal to the application processor 310. For example, a YUV or RGB signal or the like may be used as the image signal. The MIPI interface 419 operates on the basis of a reference clock supplied from an oscillation circuit 430 including, for example, a crystal resonator. For example, the communication system according to any of the above-described embodiment, etc. is applied to a communication system between the MIPI interface 419 and the application processor 310.

The technology according to the present disclosure is applicable to various products. For example, the technology according to the present disclosure may be achieved in the form of an apparatus to be mounted to a mobile body of any kind. Examples of the mobile body include an automobile, an electric vehicle, a hybrid electric vehicle, a motorcycle, a bicycle, a personal mobility, an airplane, an unmanned aerial vehicle, a vessel, a robot, a construction machine, an agricultural machine (a tractor), etc.

Practical Application Example 1

FIG. 38 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 38, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay, or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 38 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

FIG. 39 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 39 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 38, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM), worldwide interoperability for microwave access (WiMAX), long term evolution (LTE)), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 38, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 38 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the vehicle control system 7000 described above, the communication system 1 according to the present embodiment is applicable to a communication system between respective blocks in the practical application example illustrated in FIG. 38. Specifically, the present technology is applicable to, for example, a communication system between the imaging section 7410 (the imaging sections 7910, 7912, 7914, 7916, and 7918 and the outside-vehicle information detecting unit 7400. Accordingly, in the vehicle control system 7000, for example, it is possible to enhance a transmission rate, which makes it possible to supply an image having high image quality to the outside-vehicle information detecting unit 7400. As a result, it is possible for the outside-vehicle information detecting unit 7400 to more accurately comprehend outside-vehicle information.

Practical Application Example 2

The technology according to the present disclosure is applicable to various products. For example, the technology according to the present disclosure is applicable to an endoscopic surgery system.

FIG. 40 is a view depicting an example of a schematic configuration of an endoscopic surgery system 5000 to which the technology according to an embodiment of the present disclosure can be applied. In FIG. 40, a state is illustrated in which a surgeon (medical doctor) 5067 is using the endoscopic surgery system 5000 to perform surgery for a patient 5071 on a patient bed 5069. As depicted, the endoscopic surgery system 5000 includes an endoscope 5001, other surgical tools 5017, a supporting arm apparatus 5027 which supports the endoscope 5001 thereon, and a cart 5037 on which various apparatus for endoscopic surgery are mounted.

In endoscopic surgery, in place of incision of the abdominal wall to perform laparotomy, a plurality of tubular aperture devices called trocars 5025a to 5025d are used to puncture the abdominal wall. Then, a lens barrel 5003 of the endoscope 5001 and the other surgical tools 5017 are inserted into body cavity of the patient 5071 through the trocars 5025a to 5025d. In the example depicted, as the other surgical tools 5017, a pneumoperitoneum tube 5019, an energy device 5021 and forceps 5023 are inserted into body cavity of the patient 5071. Further, the energy device 5021 is a treatment tool for performing incision and peeling of a tissue, sealing of a blood vessel or the like by high frequency current or ultrasonic vibration. However, the surgical tools 5017 depicted are mere examples at all, and as the surgical tools 5017, various surgical tools which are generally used in endoscopic surgery such as, for example, tweezers or a retractor may be used.

An image of a surgical region in a body cavity of the patient 5071 imaged by the endoscope 5001 is displayed on a display apparatus 5041. The surgeon 5067 would use the energy device 5021 or the forceps 5023 while watching the image of the surgical region displayed on the display apparatus 5041 on the real time basis to perform such treatment as, for example, resection of an affected area. It is to be noted that, though not depicted, the pneumoperitoneum tube 5019, the energy device 5021 and the forceps 5023 are supported by the surgeon 5067, an assistant or the like during surgery.

(Supporting Arm Apparatus)

The supporting arm apparatus 5027 includes an arm unit 5031 extending from a base unit 5029. In the example depicted, the arm unit 5031 includes joint portions 5033a, 5033b and 5033c and links 5035a and 5035b and is driven under the control of an arm controlling apparatus 5045. The endoscope 5001 is supported by the arm unit 5031 such that the position and the posture of the endoscope 5001 are controlled. Consequently, stable fixation in position of the endoscope 5001 can be implemented.

(Endoscope)

The endoscope 5001 includes the lens barrel 5003 which has a region of a predetermined length from a distal end thereof to be inserted into a body cavity of the patient 5071, and a camera head 5005 connected to a proximal end of the lens barrel 5003. In the example depicted, the endoscope 5001 is depicted as a rigid endoscope having the lens barrel 5003 of the hard type. However, the endoscope 5001 may otherwise be configured as a flexible endoscope having the lens barrel 5003 of the flexible type.

The lens barrel 5003 has, at a distal end thereof, an opening in which an objective lens is fitted. A light source apparatus 5043 is connected to the endoscope 5001 such that light generated by the light source apparatus 5043 is introduced to a distal end of the lens barrel by a light guide extending in the inside of the lens barrel 5003 and is irradiated toward an observation target in a body cavity of the patient 5071 through the objective lens. It is to be noted that the endoscope 5001 may be a forward-viewing endoscope or may be an oblique-viewing endoscope or a side-viewing endoscope.

An optical system and an image pickup element are provided in the inside of the camera head 5005 such that reflected light (observation light) from an observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 5039. It is to be noted that the camera head 5005 has a function incorporated therein for suitably driving the optical system of the camera head 5005 to adjust the magnification and the focal distance.

It is to be noted that, in order to establish compatibility with, for example, a stereoscopic vision (three dimensional (3D) display), a plurality of image pickup elements may be provided on the camera head 5005. In this case, a plurality of relay optical systems are provided in the inside of the lens barrel 5003 in order to guide observation light to each of the plurality of image pickup elements.

(Various Apparatus Incorporated in Cart)

The CCU 5039 includes a central processing unit (CPU), a graphics processing unit (GPU) or the like and integrally controls operation of the endoscope 5001 and the display apparatus 5041. In particular, the CCU 5039 performs, for an image signal received from the camera head 5005, various image processes for displaying an image based on the image signal such as, for example, a development process (demosaic process). The CCU 5039 provides the image signal for which the image processes have been performed to the display apparatus 5041. Further, the CCU 5039 transmits a control signal to the camera head 5005 to control driving of the camera head 5005. The control signal may include information relating to an image pickup condition such as a magnification or a focal distance.

The display apparatus 5041 displays an image based on an image signal for which the image processes have been performed by the CCU 5039 under the control of the CCU 5039. If the endoscope 5001 is ready for imaging of a high resolution such as 4K (horizontal pixel number 3840× vertical pixel number 2160), 8K (horizontal pixel number 7680×vertical pixel number 4320) or the like and/or ready for 3D display, then a display apparatus by which corresponding display of the high resolution and/or 3D display are possible may be used as the display apparatus 5041. Where the apparatus is ready for imaging of a high resolution such as 4K or 8K, if the display apparatus used as the display apparatus 5041 has a size of equal to or not less than 55 inches, then a more immersive experience can be obtained. Further, a plurality of display apparatus 5041 having different resolutions and/or different sizes may be provided in accordance with purposes.

The light source apparatus 5043 includes a light source such as, for example, a light emitting diode (LED) and supplies irradiation light for imaging of a surgical region to the endoscope 5001.

The arm controlling apparatus 5045 includes a processor such as, for example, a CPU and operates in accordance with a predetermined program to control driving of the arm unit 5031 of the supporting arm apparatus 5027 in accordance with a predetermined controlling method.

An inputting apparatus 5047 is an input interface for the endoscopic surgery system 5000. A user can perform inputting of various kinds of information or instruction inputting to the endoscopic surgery system 5000 through the inputting apparatus 5047. For example, the user would input various kinds of information relating to surgery such as physical information of a patient, information regarding a surgical procedure of the surgery and so forth through the inputting apparatus 5047. Further, the user would input, for example, an instruction to drive the arm unit 5031, an instruction to change an image pickup condition (type of irradiation light, magnification, focal distance or the like) by the endoscope 5001, an instruction to drive the energy device 5021 or the like through the inputting apparatus 5047.

The type of the inputting apparatus 5047 is not limited and may be that of any one of various known inputting apparatus. As the inputting apparatus 5047, for example, a mouse, a keyboard, a touch panel, a switch, a foot switch 5057 and/or a lever or the like may be applied. Where a touch panel is used as the inputting apparatus 5047, it may be provided on the display face of the display apparatus 5041.

Otherwise, the inputting apparatus 5047 is a device to be mounted on a user such as, for example, a glasses type wearable device or a head mounted display (HMD), and various kinds of inputting are performed in response to a gesture or a line of sight of the user detected by any of the devices mentioned. Further, the inputting apparatus 5047 includes a camera which can detect a motion of a user, and various kinds of inputting are performed in response to a gesture or a line of sight of a user detected from a video imaged by the camera. Further, the inputting apparatus 5047 includes a microphone which can collect the voice of a user, and various kinds of inputting are performed by voice collected by the microphone. By configuring the inputting apparatus 5047 such that various kinds of information can be inputted in a contactless fashion in this manner, especially a user who belongs to a clean area (for example, the surgeon 5067) can operate an apparatus belonging to an unclean area in a contactless fashion. Further, since the user can operate an apparatus without releasing a possessed surgical tool from its hand, the convenience to the user is improved.

A treatment tool controlling apparatus 5049 controls driving of the energy device 5021 for cautery or incision of a tissue, sealing of a blood vessel or the like. A pneumoperitoneum apparatus 5051 feeds gas into a body cavity of the patient 5071 through the pneumoperitoneum tube 5019 to inflate the body cavity in order to secure the field of view of the endoscope 5001 and secure the working space for the surgeon. A recorder 5053 is an apparatus capable of recording various kinds of information relating to surgery. A printer 5055 is an apparatus capable of printing various kinds of information relating to surgery in various forms such as a text, an image or a graph.

In the following, especially a characteristic configuration of the endoscopic surgery system 5000 is described in more detail.

(Supporting Arm Apparatus)

The supporting arm apparatus 5027 includes the base unit 5029 serving as a base, and the arm unit 5031 extending from the base unit 5029. In the example depicted, the arm unit 5031 includes the plurality of joint portions 5033a, 5033b and 5033c and the plurality of links 5035a and 5035b connected to each other by the joint portion 5033b. In FIG. 40, for simplified illustration, the configuration of the arm unit 5031 is depicted in a simplified form. Actually, the shape, number and arrangement of the joint portions 5033a to 5033c and the links 5035a and 5035b and the direction and so forth of axes of rotation of the joint portions 5033a to 5033c can be set suitably such that the arm unit 5031 has a desired degree of freedom. For example, the arm unit 5031 may preferably be configured such that it has a degree of freedom equal to or not less than 6 degrees of freedom. This makes it possible to move the endoscope 5001 freely within the movable range of the arm unit 5031. Consequently, it becomes possible to insert the lens barrel 5003 of the endoscope 5001 from a desired direction into a body cavity of the patient 5071.

An actuator is provided in each of the joint portions 5033a to 5033c, and the joint portions 5033a to 5033c are configured such that they are rotatable around predetermined axes of rotation thereof by driving of the respective actuators. The driving of the actuators is controlled by the arm controlling apparatus 5045 to control the rotational angle of each of the joint portions 5033a to 5033c thereby to control driving of the arm unit 5031. Consequently, control of the position and the posture of the endoscope 5001 can be implemented. Thereupon, the arm controlling apparatus 5045 can control driving of the arm unit 5031 by various known controlling methods such as force control or position control.

For example, if the surgeon 5067 suitably performs operation inputting through the inputting apparatus 5047 (including the foot switch 5057), then driving of the arm unit 5031 may be controlled suitably by the arm controlling apparatus 5045 in response to the operation input to control the position and the posture of the endoscope 5001. After the endoscope 5001 at the distal end of the arm unit 5031 is moved from an arbitrary position to a different arbitrary position by the control just described, the endoscope 5001 can be supported fixedly at the position after the movement. It is to be noted that the arm unit 5031 may be operated in a master-slave fashion. In this case, the arm unit 5031 may be remotely controlled by the user through the inputting apparatus 5047 which is placed at a place remote from the operating room.

Further, where force control is applied, the arm controlling apparatus 5045 may perform power-assisted control to drive the actuators of the joint portions 5033a to 5033c such that the arm unit 5031 may receive external force by the user and move smoothly following the external force. This makes it possible to move, when the user directly touches with and moves the arm unit 5031, the arm unit 5031 with comparatively weak force. Accordingly, it becomes possible for the user to move the endoscope 5001 more intuitively by a simpler and easier operation, and the convenience to the user can be improved.

Here, generally in endoscopic surgery, the endoscope 5001 is supported by a medical doctor called scopist. In contrast, where the supporting arm apparatus 5027 is used, the position of the endoscope 5001 can be fixed more certainly without hands, and therefore, an image of a surgical region can be obtained stably and surgery can be performed smoothly.

It is to be noted that the arm controlling apparatus 5045 may not necessarily be provided on the cart 5037. Further, the arm controlling apparatus 5045 may not necessarily be a single apparatus. For example, the arm controlling apparatus 5045 may be provided in each of the joint portions 5033a to 5033c of the arm unit 5031 of the supporting arm apparatus 5027 such that the plurality of arm controlling apparatus 5045 cooperate with each other to implement driving control of the arm unit 5031.

(Light Source Apparatus)

The light source apparatus 5043 supplies irradiation light upon imaging of a surgical region to the endoscope 5001. The light source apparatus 5043 includes a white light source which includes, for example, an LED, a laser light source or a combination of them. In this case, where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 5043. Further, in this case, if laser beams from the respective RGB laser light sources are irradiated time-divisionally on an observation target and driving of the image pickup elements of the camera head 5005 is controlled in synchronism with the irradiation timings, then images individually corresponding to the R, G and B colors can be picked up time-divisionally. According to the method just described, a color image can be obtained even if a color filter is not provided for the image pickup element.

Further, driving of the light source apparatus 5043 may be controlled such that the intensity of light to be outputted is changed for each predetermined time. By controlling driving of the image pickup element of the camera head 5005 in synchronism with the timing of the change of the intensity of light to acquire images time-divisionally and synthesizing the images, an image of a high dynamic range free from underexposed blocked up shadows and overexposed highlights can be created.

Further, the light source apparatus 5043 may be configured to supply light of a predetermined wavelength band ready for special light observation. In special light observation, for example, by utilizing the wavelength dependency of absorption of light in a body tissue to irradiate light of a narrower wavelength band in comparison with irradiation light upon ordinary observation (namely, white light), narrow band light observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 5043 can be configured to supply such narrow-band light and/or excitation light suitable for special light observation as described above.

(Camera Head and CCU)

Functions of the camera head 5005 of the endoscope 5001 and the CCU 5039 are described in more detail with reference to FIG. 41. FIG. 41 is a block diagram depicting an example of a functional configuration of the camera head 5005 and the CCU 5039 depicted in FIG. 40.

Referring to FIG. 41, the camera head 5005 has, as functions thereof, a lens unit 5007, an image pickup unit 5009, a driving unit 5011, a communication unit 5013 and a camera head controlling unit 5015. Further, the CCU 5039 has, as functions thereof, a communication unit 5059, an image processing unit 5061 and a control unit 5063. The camera head 5005 and the CCU 5039 are connected to be bidirectionally communicable to each other by a transmission cable 5065.

First, a functional configuration of the camera head 5005 is described. The lens unit 5007 is an optical system provided at a connecting location of the camera head 5005 to the lens barrel 5003. Observation light taken in from a distal end of the lens barrel 5003 is introduced into the camera head 5005 and enters the lens unit 5007. The lens unit 5007 includes a combination of a plurality of lenses including a zoom lens and a focusing lens. The lens unit 5007 has optical properties adjusted such that the observation light is condensed on a light receiving face of the image pickup element of the image pickup unit 5009. Further, the zoom lens and the focusing lens are configured such that the positions thereof on their optical axis are movable for adjustment of the magnification and the focal point of a picked up image.

The image pickup unit 5009 includes an image pickup element and disposed at a succeeding stage to the lens unit 5007. Observation light having passed through the lens unit 5007 is condensed on the light receiving face of the image pickup element, and an image signal corresponding to the observation image is generated by photoelectric conversion of the image pickup element. The image signal generated by the image pickup unit 5009 is provided to the communication unit 5013.

As the image pickup element which is included by the image pickup unit 5009, an image sensor, for example, of the complementary metal oxide semiconductor (CMOS) type is used which has a Bayer array and is capable of picking up an image in color. It is to be noted that, as the image pickup element, an image pickup element may be used which is ready, for example, for imaging of an image of a high resolution equal to or not less than 4K. If an image of a surgical region is obtained in a high resolution, then the surgeon 5067 can comprehend a state of the surgical region in enhanced details and can proceed with the surgery more smoothly.

Further, the image pickup element which is included by the image pickup unit 5009 includes such that it has a pair of image pickup elements for acquiring image signals for the right eye and the left eye compatible with 3D display. Where 3D display is applied, the surgeon 5067 can comprehend the depth of a living body tissue in the surgical region more accurately. It is to be noted that, if the image pickup unit 5009 is configured as that of the multi-plate type, then a plurality of systems of lens units 5007 are provided corresponding to the individual image pickup elements of the image pickup unit 5009.

The image pickup unit 5009 may not necessarily be provided on the camera head 5005. For example, the image pickup unit 5009 may be provided just behind the objective lens in the inside of the lens barrel 5003.

The driving unit 5011 includes an actuator and moves the zoom lens and the focusing lens of the lens unit 5007 by a predetermined distance along the optical axis under the control of the camera head controlling unit 5015. Consequently, the magnification and the focal point of a picked up image by the image pickup unit 5009 can be adjusted suitably.

The communication unit 5013 includes a communication apparatus for transmitting and receiving various kinds of information to and from the CCU 5039. The communication unit 5013 transmits an image signal acquired from the image pickup unit 5009 as RAW data to the CCU 5039 through the transmission cable 5065. Thereupon, in order to display a picked up image of a surgical region in low latency, preferably the image signal is transmitted by optical communication. This is because, upon surgery, the surgeon 5067 performs surgery while observing the state of an affected area through a picked up image, it is demanded for a moving image of the surgical region to be displayed on the real time basis as far as possible in order to achieve surgery with a higher degree of safety and certainty. Where optical communication is applied, a photoelectric conversion module for converting an electric signal into an optical signal is provided in the communication unit 5013. After the image signal is converted into an optical signal by the photoelectric conversion module, it is transmitted to the CCU 5039 through the transmission cable 5065.

Further, the communication unit 5013 receives a control signal for controlling driving of the camera head 5005 from the CCU 5039. The control signal includes information relating to image pickup conditions such as, for example, information that a frame rate of a picked up image is designated, information that an exposure value upon image picking up is designated and/or information that a magnification and a focal point of a picked up image are designated. The communication unit 5013 provides the received control signal to the camera head controlling unit 5015. It is to be noted that also the control signal from the CCU 5039 may be transmitted by optical communication. In this case, a photoelectric conversion module for converting an optical signal into an electric signal is provided in the communication unit 5013. After the control signal is converted into an electric signal by the photoelectric conversion module, it is provided to the camera head controlling unit 5015.

It is to be noted that the image pickup conditions such as the frame rate, exposure value, magnification or focal point are set automatically by the control unit 5063 of the CCU 5039 on the basis of an acquired image signal. In other words, an auto exposure (AE) function, an auto focus (AF) function and an auto white balance (AWB) function are incorporated in the endoscope 5001.

The camera head controlling unit 5015 controls driving of the camera head 5005 on the basis of a control signal from the CCU 5039 received through the communication unit 5013. For example, the camera head controlling unit 5015 controls driving of the image pickup element of the image pickup unit 5009 on the basis of information that a frame rate of a picked up image is designated and/or information that an exposure value upon image picking up is designated.

Further, for example, the camera head controlling unit 5015 controls the driving unit 5011 to suitably move the zoom lens and the focus lens of the lens unit 5007 on the basis of information that a magnification and a focal point of a picked up image are designated. The camera head controlling unit 5015 may further include a function for storing information for identifying the lens barrel 5003 and/or the camera head 5005.

It is to be noted that, by disposing the components such as the lens unit 5007 and the image pickup unit 5009 in a sealed structure having high airtightness and waterproof, the camera head 5005 can be provided with resistance to an autoclave sterilization process.

Now, a functional configuration of the CCU 5039 is described. The communication unit 5059 includes a communication apparatus for transmitting and receiving various kinds of information to and from the camera head 5005. The communication unit 5059 receives an image signal transmitted thereto from the camera head 5005 through the transmission cable 5065. Thereupon, the image signal may be transmitted preferably by optical communication as described above. In this case, for the compatibility with optical communication, the communication unit 5059 includes a photoelectric conversion module for converting an optical signal into an electric signal. The communication unit 5059 provides the image signal after conversion into an electric signal to the image processing unit 5061.

Further, the communication unit 5059 transmits, to the camera head 5005, a control signal for controlling driving of the camera head 5005. The control signal may also be transmitted by optical communication.

The image processing unit 5061 performs various image processes for an image signal in the form of RAW data transmitted thereto from the camera head 5005. The image processes include various known signal processes such as, for example, a development process, an image quality improving process (a bandwidth enhancement process, a super-resolution process, a noise reduction (NR) process and/or an image stabilization process) and/or an enlargement process (electronic zooming process). Further, the image processing unit 5061 performs a detection process for an image signal in order to perform AE, AF and AWB.

The image processing unit 5061 includes a processor such as a CPU or a GPU, and when the processor operates in accordance with a predetermined program, the image processes and the detection process described above can be performed. It is to be noted that, where the image processing unit 5061 includes a plurality of GPUs, the image processing unit 5061 suitably divides information relating to an image signal such that image processes are performed in parallel by the plurality of GPUs.

The control unit 5063 performs various kinds of control relating to image picking up of a surgical region by the endoscope 5001 and display of the picked up image. For example, the control unit 5063 generates a control signal for controlling driving of the camera head 5005. Thereupon, if image pickup conditions are inputted by the user, then the control unit 5063 generates a control signal on the basis of the input by the user. Alternatively, where the endoscope 5001 has an AE function, an AF function and an AWB function incorporated therein, the control unit 5063 suitably calculates an optimum exposure value, focal distance and white balance in response to a result of a detection process by the image processing unit 5061 and generates a control signal.

Further, the control unit 5063 controls the display apparatus 5041 to display an image of a surgical region on the basis of an image signal for which image processes have been performed by the image processing unit 5061. Thereupon, the control unit 5063 recognizes various objects in the surgical region image using various image recognition technologies. For example, the control unit 5063 can recognize a surgical tool such as forceps, a particular living body region, bleeding, mist when the energy device 5021 is used and so forth by detecting the shape, color and so forth of edges of the objects included in the surgical region image. The control unit 5063 causes, when it controls the display unit 5041 to display a surgical region image, various kinds of surgery supporting information to be displayed in an overlapping manner with an image of the surgical region using a result of the recognition. Where surgery supporting information is displayed in an overlapping manner and presented to the surgeon 5067, the surgeon 5067 can proceed with the surgery more safety and certainty.

The transmission cable 5065 which connects the camera head 5005 and the CCU 5039 to each other is an electric signal cable ready for communication of an electric signal, an optical fiber ready for optical communication or a composite cable ready for both of electrical and optical communication.

Here, while, in the example depicted, communication is performed by wired communication using the transmission cable 5065, the communication between the camera head 5005 and the CCU 5039 may be performed otherwise by wireless communication. Where the communication between the camera head 5005 and the CCU 5039 is performed by wireless communication, there is no necessity to lay the transmission cable 5065 in the operating room. Therefore, such a situation that movement of medical staff in the operating room is disturbed by the transmission cable 5065 can be eliminated.

An example of the endoscopic surgery system 5000 to which the technology according to an embodiment of the present disclosure can be applied has been described above. It is to be noted here that, although the endoscopic surgery system 5000 has been described as an example, the system to which the technology according to an embodiment of the present disclosure can be applied is not limited to the example. For example, the technology according to an embodiment of the present disclosure may be applied to a flexible endoscopic system for inspection or a microscopic surgery system.

The technology according to the present disclosure may be suitably applied to a communication system between the camera head 5005 and the CCU 5039 of the configurations described above. Specifically, for example, the transmitting device 10 according to the present technology is applicable to the communication unit 5013 of the camera head 5005, and the receiving device 30 is applicable to the communication unit 5059 of the CCU 5039. Accordingly, in the endoscopic surgery system 5000, for example, it is possible to increase a transmission rate, which makes it possible to supply an image having high image quality to the CCU 5039. Consequently, the endoscopic surgery system 5000 makes it possible for the surgeon 5067 to more accurately comprehend the state of the affected area.

Although the present technology has been described above with reference to some embodiments, modification examples, and application examples to electronic apparatuses, the present technology is not limited thereto, and may be modified in a variety of ways.

For example, in the above-described embodiment, etc., the voltage level in each voltage state is set on the basis of the current symbol NS and the previous symbol DS; however, the voltage level is not limited thereto. Instead of this, the voltage level in each voltage state may be set, for example, on the basis of the current symbol NS, the previous symbol DS, and a symbol before the previous symbol DS. In this case, the transmitting device operates like a so-called three-tap FIR filter and performs a de-emphasis operation. It is to be noted that the voltage level is not limited thereto, and the voltage level in each voltage state may be set on the basis of four or more symbols including the current symbol NS.

Furthermore, for example, in the above-described embodiment, etc., the three voltage states SH, SM, and SL are used; however, the number of voltage states is not limited thereto, and four or more voltage states may be used. For example, in a case where five voltage states are used, for example, the sub-drivers 290 and 291 may be each provided with five transistors.

It is to be noted that the effects described in this specification are mere examples and non-limiting, and there may be other effects.

It is to be noted that the present technology may have the following configurations.

(1)

A transmitting device including:

a voltage generator that generates a predetermined voltage;

a first driver including a first sub-driver and a second sub-driver, the first dub-driver that includes a first switch provided on a path from a first power source to a first output terminal, a second switch provided on a path from a second power source to the first output terminal, and a third switch provided on a path from the voltage generator to the first output terminal, and is allowed to set a voltage state of the first output terminal to any of a predetermined number of voltage states which are three or more voltage states, and the second sub-driver that is allowed to adjust a voltage in each of the voltage states of the first output terminal; and a controller that controls an operation of the first driver to perform emphasis.

(2)

The transmitting device according to (1), in which the second sub-driver includes a fourth switch provided on a path from the first power source to the first output terminal, a fifth switch provided on a path from the second power source to the first output terminal, and a sixth switch provided on a path from the voltage generator to the first output terminal.

(3)

The transmitting device according to (2), in which the predetermined number of voltage states include a first voltage state corresponding to a voltage at the first power source, a second voltage state corresponding to a voltage at the second power source, and a third voltage state that corresponds to the predetermined voltage and is interposed between the first voltage state and the second voltage state.

(4)

The transmitting device according to (3), in which in a case where a transition of the voltage state of the first output terminal is made from the first voltage state to a voltage state other than the first voltage state, the controller performs control to put the fifth switch of the fourth, fifth, and sixth switches into an on state.

(5)

The transmitting device according to (3) or (4), in which in a case where a transition of the voltage state of the first output terminal is made from the third voltage state to a voltage state other than the third voltage state, the controller performs control to put the sixth switch of the fourth, fifth, and sixth switches into an on state.

(6)

The transmitting device according to any one of (3) to (5), in which in a case where the voltage state of the first output terminal of the driver unit is maintained in the first voltage state, the controller performs control to put the fifth switch of the fourth, fifth, and sixth switches into an on state.

(7)

The transmitting device according to any one of (3) to (6), in which in a case where the voltage state of the first output terminal is maintained in the third voltage state, the controller performs control to put the sixth switch of the fourth, fifth, and sixth switches into an on state.

(8)

The transmitting device according to any one of (3) to (7), in which in a case where the voltage state of the first output terminal is set to the first voltage state, the controller performs control to put the first switch of the first switch, the second switch, and the third switch into an on state in a case where the voltage state of the first output terminal is set to the second voltage state, the controller performs control to put the second switch of the first switch, the second switch, and the third switch into the on state and in a case where the voltage state of the first output terminal is set to the third voltage state, the controller performs control to put the third switch of the first switch, the second switch, and the third switch into the on state.

(9)

The transmitting device according to any one of (1) to (8), in which the first sub-driver includes:

a first resistor having one end coupled to the first power source, and another end coupled to one end of the first switch, and a second resistor having one end coupled to the first output terminal, and another end coupled to one end of the second switch and one end of the third switch, another end of the first switch is coupled to the first output terminal, another end of the second switch is coupled to the second power source, and another end of the third switch is coupled to the voltage generator.

(10)

The transmitting device according to any one of (1) to (9), further including:

a second driver including a third sub-driver and a fourth sub-driver, the third sub-driver that is allowed to set a voltage state of a second output terminal to any of the predetermined number of voltage states, and the fourth sub-driver that is allowed to adjust a voltage in each of the voltage states of the second output terminal; and a third driver including a fifth sub-driver and a sixth sub-driver, the fifth sub-driver that is allowed to set a voltage state of a third output terminal to any of the predetermined number of voltage states, and the sixth sub-driver that is allowed to adjust a voltage in each of the voltage states of the third output terminal, in which the controller also controls operations of the second driver and the third driver to perform the emphasis.

(11)

The transmitting device according to (10), in which the voltage states of the first output terminal, the second output terminal, and the third output terminal are different from one another.

(12)

The transmitting device according to (10) or (11), further including a signal generator, in which the first driver, the second driver, and the third driver transmit a sequence of symbols, the signal generator generates a first symbol signal indicating a symbol and a second symbol signal indicating a symbol before the symbol indicated by the first symbol signal on the basis of a transition signal indicating a symbol transition, and the controller controls the operations of the first driver, the second driver, and the third driver on the basis of the first symbol signal and the second symbol signal.

(13)

The transmitting device according to (10) or (11), further including a signal generator, in which the first driver, the second driver, and the third driver transmit a sequence of symbols, the signal generator generates a symbol signal indicating a symbol on the basis of a transition signal indicating a symbol transition, and the controller controls the operations of the first driver, the second driver, and the third driver on the basis of a sequence of symbols indicated by the symbol signal.

(14)

The transmitting device according to any one of (1) to (13), in which an output impedance of the first sub-driver is lower than an output impedance of the second sub-driver.

(15)

The transmitting device according to any one of (1) to (14), in which an output impedance of the first sub-driver and an output impedance of the second sub-driver are each settable.

(16)

The transmitting device according to any one of (1) to (15), in which the emphasis is de-emphasis.

(17)

The transmitting device according to any one of (1) to (15), in which the emphasis is pre-emphasis.

(18)

A transmitting device including:

a driver unit that transmits a data signal with use of a predetermined number of voltage states which are three or more voltage states, and is allowed to set a voltage in each of the voltage states;

a controller that sets an emphasis voltage in accordance with a transition between the predetermined number of voltage states, thereby causing the driver unit to perform emphasis; and a voltage generator, in which the driver unit includes a first switch provided on a path from a first power source to an output terminal, a second switch provided on a path from a second power source to the output terminal, and a third switch provided on a path from the voltage generator to the output terminal.

(19)

A transmitting method including:

controlling an operation of a first sub-driver including a first switch provided on a path from a first power source to a first output terminal, a second switch provided on a path from a second power source to the first output terminal, and a third switch provided on a path from a voltage generator to the first output terminal, thereby setting a voltage state of the first output terminal to any of a predetermined number of voltage states which are three or more voltage states; and controlling an operation of a second sub-driver, thereby adjusting a voltage in each of the voltage states of the first output terminal to perform emphasis.

(20) A communication system provided with a transmitting device and a receiving device, the transmitting device including:

a voltage generator that generates a predetermined voltage;

a first driver including a first sub-driver and a second sub-driver, the first dub-driver that includes a first switch provided on a path from a first power source to a first output terminal, a second switch provided on a path from a second power source to the first output terminal, and a third switch provided on a path from the voltage generator to the first output terminal, and is allowed to set a voltage state of the first output terminal to any of a predetermined number of voltage states which are three or more voltage states, and the second sub-driver that is allowed to adjust a voltage in each of the voltage states of the first output terminal; and a controller that controls an operation of the first driver to perform emphasis.

This application claims the benefit of Japanese Priority Patent Application JP2016-145899 filed with the Japan Patent Office on Jul. 26, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A transmitting device comprising:
a voltage generator that generates a predetermined voltage;
a first driver including a first sub-driver and a second sub-driver, the first sub-driver including a first switch provided on a path from a first power source to a first output terminal, a second switch provided on a path from a second power source to the first output terminal, and a third switch provided on a path from the voltage generator to the first output terminal, and being configured to set a voltage state of the first output terminal to any of a predetermined number of voltage states which are three or more voltage states, and the second sub-driver being configured to adjust a voltage in each of the voltage states of the first output terminal; and
a controller that controls an operation of the first driver to perform emphasis,
wherein the second sub-driver includes a fourth switch provided on a path from the first power source to the first output terminal, a fifth switch provided on a path from the second power source to the first output terminal, and a sixth switch provided on a path from the voltage generator to the first output terminal.

2. The transmitting device according to claim 1, wherein the predetermined number of voltage states include a first voltage state corresponding to a voltage at the first power source, a second voltage state corresponding to a voltage at the second power source, and a third voltage state that corresponds to the predetermined voltage and is interposed between the first voltage state and the second voltage state.

3. The transmitting device according to claim 2, wherein in a case where a transition of the voltage state of the first output terminal is made from the first voltage state to a voltage state other than the first voltage state, the controller performs control to put the fifth switch of the fourth, fifth, and sixth switches into an on state.

4. The transmitting device according to claim 2, wherein in a case where a transition of the voltage state of the first output terminal is made from the third voltage state to a voltage state other than the third voltage state, the controller performs control to put the sixth switch of the fourth, fifth, and sixth switches into an on state.

5. The transmitting device according to claim 2, wherein in a case where the voltage state of the first output terminal of the first driver is maintained in the first voltage state, the controller performs control to put the fifth switch of the fourth, fifth, and sixth switches into an on state.

6. The transmitting device according to claim 2, wherein in a case where the voltage state of the first output terminal is maintained in the third voltage state, the controller performs control to put the sixth switch of the fourth, fifth, and sixth switches into an on state.

7. The transmitting device according to claim 2, wherein
in a case where the voltage state of the first output terminal is set to the first voltage state, the controller performs control to put the first switch of the first switch, the second switch, and the third switch into an on state
in a case where the voltage state of the first output terminal is set to the second voltage state, the controller performs control to put the second switch of the first switch, the second switch, and the third switch into the on state and
in a case where the voltage state of the first output terminal is set to the third voltage state, the controller performs control to put the third switch of the first switch, the second switch, and the third switch into the on state.

8. The transmitting device according to claim 1, wherein the first sub-driver includes:
a first resistor having one end coupled to the first power source, and another end coupled to one end of the first switch, and
a second resistor having one end coupled to the first output terminal, and another end coupled to one end of the second switch and one end of the third switch,
another end of the first switch is coupled to the first output terminal,
another end of the second switch is coupled to the second power source, and
another end of the third switch is coupled to the voltage generator.

9. The transmitting device according to claim 1, further comprising:
a second driver including a third sub-driver and a fourth sub-driver, the third sub-driver that is allowed to set a voltage state of a second output terminal to any of the predetermined number of voltage states, and the fourth sub-driver that is allowed to adjust a voltage in each of the voltage states of the second output terminal; and
a third driver including a fifth sub-driver and a sixth sub-driver, the fifth sub-driver that is allowed to set a voltage state of a third output terminal to any of the predetermined number of voltage states, and the sixth sub-driver that is allowed to adjust a voltage in each of the voltage states of the third output terminal, wherein
the controller also controls operations of the second driver and the third driver to perform the emphasis.

10. The transmitting device according to claim 9, wherein the voltage states of the first output terminal, the second output terminal, and the third output terminal are different from one another.

11. The transmitting device according to claim 9, further comprising a signal generator, wherein
the first driver, the second driver, and the third driver transmit a sequence of symbols,
the signal generator generates a first symbol signal indicating a symbol and a second symbol signal indicating a symbol before the symbol indicated by the first symbol signal on a basis of a transition signal indicating a symbol transition, and
the controller controls the operations of the first driver, the second driver, and the third driver on a basis of the first symbol signal and the second symbol signal.

12. The transmitting device according to claim 9, further comprising a signal generator, wherein
the first driver, the second driver, and the third driver transmit a sequence of symbols,
the signal generator generates a symbol signal indicating a symbol on a basis of a transition signal indicating a symbol transition, and
the controller controls the operations of the first driver, the second driver, and the third driver on a basis of a sequence of symbols indicated by the symbol signal.

13. The transmitting device according to claim 1, wherein an output impedance of the first sub-driver is lower than an output impedance of the second sub-driver.

14. The transmitting device according to claim 1, wherein an output impedance of the first sub-driver and an output impedance of the second sub-driver are each settable.

15. The transmitting device according to claim 1, wherein the emphasis is de-emphasis.

16. The transmitting device according to claim 1, wherein the emphasis is pre-emphasis.

17. A communication system provided with a transmitting device and a receiving device, the transmitting device comprising:
a voltage generator that generates a predetermined voltage;
a first driver including a first sub-driver and a second sub-driver, the first sub-driver including a first switch provided on a path from a first power source to a first output terminal, a second switch provided on a path from a second power source to the first output terminal, and a third switch provided on a path from the voltage generator to the first output terminal, and being configured to set a voltage state of the first output terminal to any of a predetermined number of voltage states which are three or more voltage states, and the second sub-driver being configured to adjust a voltage in each of the voltage states of the first output terminal; and
a controller that controls an operation of the first driver to perform emphasis,
wherein the second sub-driver includes a fourth switch provided on a path from the first power source to the first output terminal, a fifth switch provided on a path from the second power source to the first output terminal, and a sixth switch provided on a path from the voltage generator to the first output terminal.

18. The communication system according to claim 17, wherein the predetermined number of voltage states include a first voltage state corresponding to a voltage at the first power source, a second voltage state corresponding to a voltage at the second power source, and a third voltage state that corresponds to the predetermined voltage and is interposed between the first voltage state and the second voltage state.

19. The communication system according to claim 18, wherein in a case where a transition of the voltage state of the first output terminal is made from the first voltage state to a voltage state other than the first voltage state, the controller performs control to put the fifth switch of the fourth, fifth, and sixth switches into an on state.

20. The communication system according to claim 18, wherein in a case where a transition of the voltage state of the first output terminal is made from the third voltage state to a voltage state other than the third voltage state, the controller performs control to put the sixth switch of the fourth, fifth, and sixth switches into an on state.

* * * * *